(12) United States Patent
En et al.

(10) Patent No.: US 7,691,189 B2
(45) Date of Patent: Apr. 6, 2010

(54) PRINTED WIRING BOARD AND ITS MANUFACTURING METHOD

(75) Inventors: Honchin En, Gifu (JP); Tohru Nakai, Gifu (JP); Takeo Oki, Tsushima (JP); Naohiro Hirose, Gifu (JP); Kouta Noda, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 11/736,495

(22) Filed: Apr. 17, 2007

(65) Prior Publication Data

US 2007/0266886 A1 Nov. 22, 2007

Related U.S. Application Data

(62) Division of application No. 09/787,139, filed as application No. PCT/JP99/05003 on Sep. 14, 1999, now Pat. No. 7,230,188.

(30) Foreign Application Priority Data

| Sep. 14, 1998 | (JP) | ................... 10-259854 |
| Sep. 17, 1998 | (JP) | ................... 10-283435 |
| Sep. 24, 1998 | (JP) | ................... 10-288925 |
| Nov. 20, 1998 | (JP) | ................... 10-331200 |
| Nov. 25, 1998 | (JP) | ................... 10-334499 |
| Dec. 21, 1998 | (JP) | ................... 10-362962 |
| Apr. 2, 1999 | (JP) | ................... 11-95916 |

(51) Int. Cl.
*C23C 18/40* (2006.01)
*B05D 1/18* (2006.01)

(52) U.S. Cl. ................... 106/1.23; 106/1.26; 427/443.1

(58) Field of Classification Search ................ 106/1.23, 106/1.26; 427/443.1
See application file for complete search history.

(56) References Cited

U.S. PATENT DOCUMENTS

| 3,276,977 | A |   | 10/1966 | Willmund et al. |         |
| 3,322,881 | A |   | 5/1967  | Schneble et al. |         |
| 3,350,498 | A |   | 10/1967 | Leeds |         |
| 3,716,462 | A | * | 2/1973  | Jensen | ................... 106/1.23 |
| 3,929,593 | A |   | 12/1975 | Sugiyama et al. |         |
| 3,977,884 | A | * | 8/1976  | Gulla et al. | ................. 106/1.26 |
| 4,248,633 | A | * | 2/1981  | Heijnen et al. | ............. 106/1.23 |
| 4,265,943 | A | * | 5/1981  | Goldstein et al. | ............ 106/1.23 |

(Continued)

FOREIGN PATENT DOCUMENTS

DE 42 25 961 A1 2/1994

(Continued)

OTHER PUBLICATIONS

"Structuring of Laminated Cu-Polyimide Films Via Laser Ablation" IBM Technical Disclosure Bulletin, IBM Corp., Aug. 1994, p. 481, vol. 37, No. 8., New York, U.S.

(Continued)

*Primary Examiner*—Helene Klemanski
(74) *Attorney, Agent, or Firm*—Sughrue Mion, PLLC

(57) ABSTRACT

The present invention is directed to a process for manufacturing multilayer printed circuit boards which is capable of simultaneous via hole filling and formation of conductor circuit and via holes of good crystallinity, and by which uniform deposition can be constructed on a substrate and high-density wiring and highly reliable conductor connections can be realized without annealing.

18 Claims, 47 Drawing Sheets

U.S. PATENT DOCUMENTS

| | | | | |
|---|---|---|---|---|
| 4,324,589 A | * | 4/1982 | Gulla et al. | 106/1.26 |
| 4,482,596 A | | 11/1984 | Gulla et al. | |
| 4,528,259 A | | 7/1985 | Sullivan | |
| 4,642,163 A | | 2/1987 | Greschner et al. | |
| 4,643,793 A | * | 2/1987 | Nakaso et al. | 106/1.23 |
| 4,650,691 A | * | 3/1987 | Kinoshita et al. | 427/443.1 |
| 4,777,078 A | | 10/1988 | Miyabayashi | |
| 4,908,242 A | * | 3/1990 | Hughes et al. | 427/443.1 |
| 5,021,296 A | | 6/1991 | Suzuki et al. | |
| 5,055,321 A | | 10/1991 | Enomoto et al. | |
| 5,200,271 A | | 4/1993 | Kosaka | |
| 5,243,142 A | | 9/1993 | Ishikawa et al. | |
| 5,258,094 A | | 11/1993 | Furui et al. | |
| 5,306,336 A | | 4/1994 | Martyak et al. | |
| 5,419,926 A | | 5/1995 | Soltys | |
| 5,519,177 A | | 5/1996 | Wang et al. | |
| 5,699,613 A | | 12/1997 | Chong et al. | |
| 5,741,575 A | | 4/1998 | Asai et al. | |
| 5,780,143 A | | 7/1998 | Shimamoto et al. | |
| 6,019,878 A | | 2/2000 | Nidola et al. | |
| 6,132,853 A | | 10/2000 | Noddin | |
| 6,214,445 B1 | | 4/2001 | Kanbe et al. | |
| 6,217,987 B1 | | 4/2001 | Ono et al. | |
| 6,224,737 B1 | | 5/2001 | Tsai et al. | |
| 6,225,396 B1 | | 5/2001 | Watada et al. | |
| 6,251,502 B1 | | 6/2001 | Yasue et al. | |
| 6,261,671 B1 | * | 7/2001 | Asai et al. | 428/206 |
| 6,762,921 B1 | * | 7/2004 | Asai et al. | 361/111 |
| 6,793,796 B2 | | 9/2004 | Reid et al. | |
| 7,405,146 B2 | | 7/2008 | Ma | |
| 2004/0134682 A1 | * | 7/2004 | En et al. | 174/258 |
| 2009/0145652 A1 | * | 6/2009 | En et al. | 106/1.18 |

FOREIGN PATENT DOCUMENTS

| | | |
|---|---|---|
| EP | 0727926 A2 | 8/1996 |
| GB | 1288992 A | 9/1972 |
| GB | 2 214 520 A | 9/1989 |
| JP | 51-90475 | 8/1976 |
| JP | 57-116799 A | 7/1982 |
| JP | 4-055555 B2 | 5/1988 |
| JP | 63-158156 A | 7/1988 |
| JP | 02030769 | 7/1988 |
| JP | 1-263278 | 10/1989 |
| JP | 2-22887 A | 1/1990 |
| JP | 2-182390 A | 7/1990 |
| JP | 2-188992 A | 7/1990 |
| JP | 2-238691 | 9/1990 |
| JP | 3-3296 | 1/1991 |
| JP | 4-48099 | 2/1992 |
| JP | 4-174596 | 6/1992 |
| JP | 5-044099 A | 2/1993 |
| JP | 06164149 | 5/1993 |
| JP | 5-148662 A | 6/1993 |
| JP | 5-287583 | 11/1993 |
| JP | 06-21648 | 1/1994 |
| JP | 6-112649 | 4/1994 |
| JP | 06-132629 | 5/1994 |
| JP | 6-232555 | 8/1994 |
| JP | 06-275959 | 9/1994 |
| JP | 06302963 | 10/1994 |
| JP | 6-314883 | 11/1994 |
| JP | 08153971 | 11/1994 |
| JP | 7-58201 | 3/1995 |
| JP | 07106769 | 4/1995 |
| JP | 07-283538 | 10/1995 |
| JP | 07-283539 | 10/1995 |
| JP | 7-321456 | 12/1995 |
| JP | 7-336017 | 12/1995 |
| JP | 09172261 | 12/1995 |
| JP | 8-264372 A | 10/1996 |
| JP | 8-319597 | 12/1996 |
| JP | 9-083140 A | 3/1997 |
| JP | 9-135077 | 5/1997 |
| JP | 9-199854 | 7/1997 |
| JP | 9-199855 | 7/1997 |
| JP | 9-246730 | 9/1997 |
| JP | 9-275273 A | 10/1997 |
| JP | 9-289375 | 11/1997 |
| JP | 9-321434 A | 12/1997 |
| JP | 9-331155 | 12/1997 |
| JP | 10-4254 | 1/1998 |
| JP | 10-65340 | 3/1998 |
| JP | 10-107436 A | 4/1998 |
| JP | 10-209604 A | 8/1998 |
| JP | 10-242639 A | 9/1998 |
| JP | 11-004069 A | 1/1999 |

OTHER PUBLICATIONS

Extended European Search Report—EP 08152453.0 dated Apr. 29, 2009.

Extended European Search Report—EP 08152454.8 dated Apr. 29, 2009.

* cited by examiner

Fig. 2
Figure 2 (a)
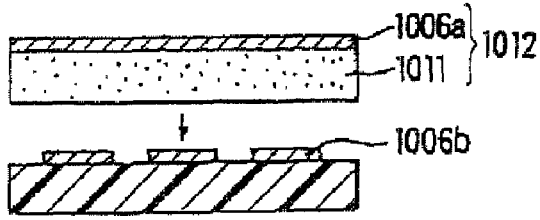
Figure 2 (b)
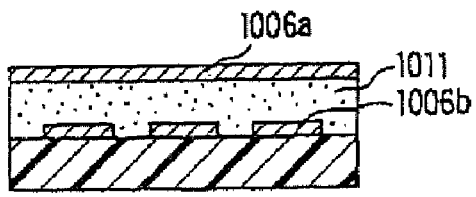
formation of openings
for via holes
Figure 2 (c)
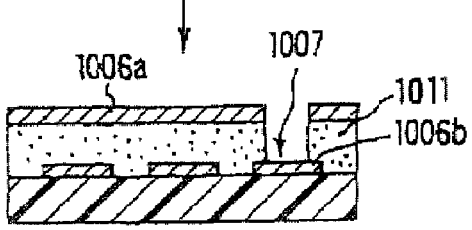
formation of
electroless Cu plating
Figure 2 (d)
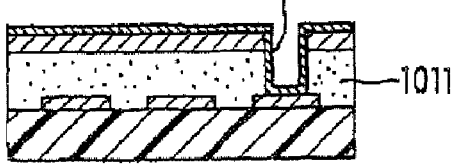
formation of
Cu electroplating
Figure 2 (e)
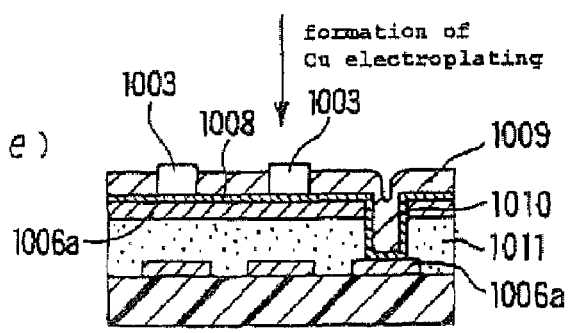

Fig. 3
Figure 3 (a)
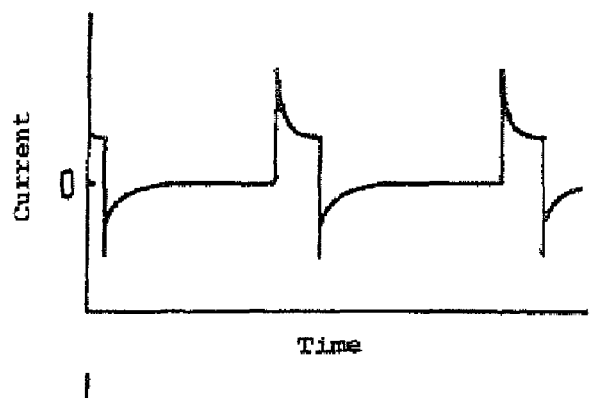
Figure 3 (b)
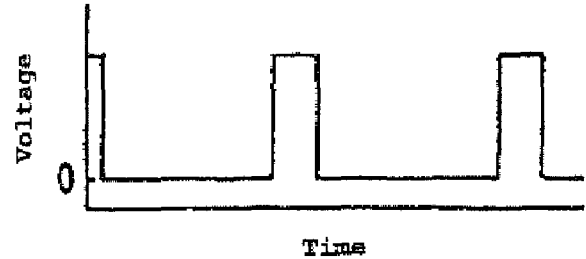
Fig. 4
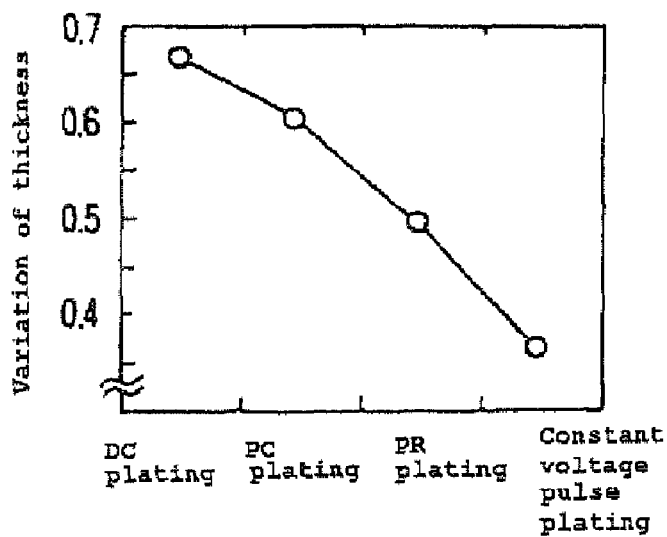

Fig. 6
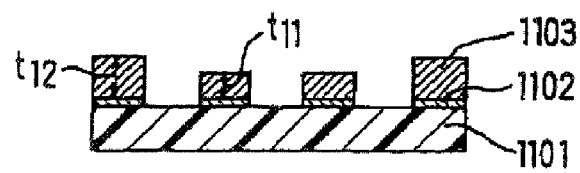
Fig. 7
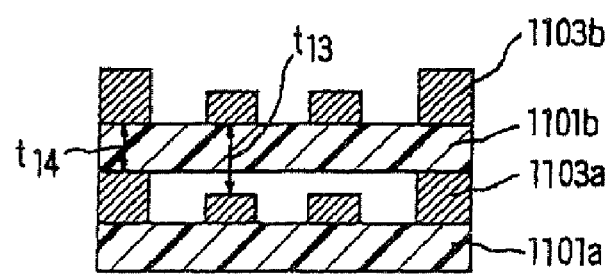
Fig. 8
Figure 8 (a)
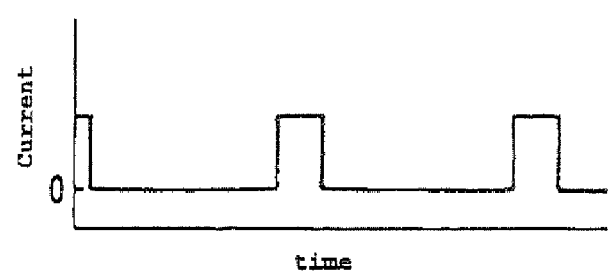
Figure 8 (b)
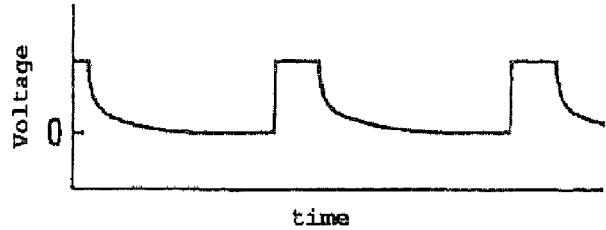

Fig. 9
Figure 9 (a)
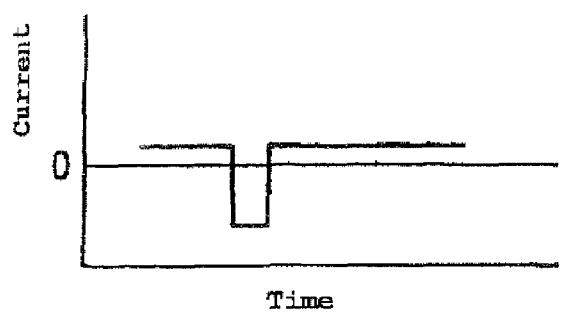
Figure 9 (b)
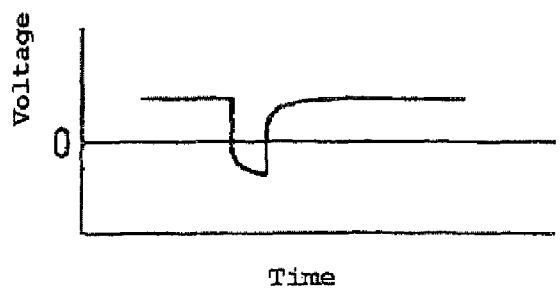

Fig. 10
Figure 10 (a)
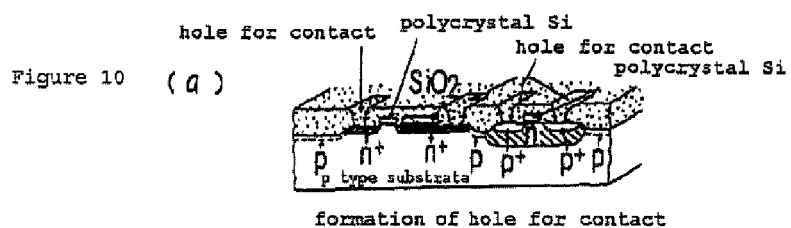
formation of hole for contact
Figure 10 (b)
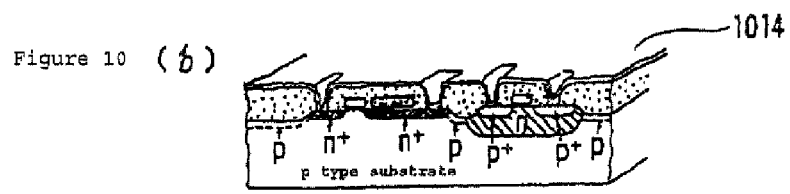
Figure 10 (c)
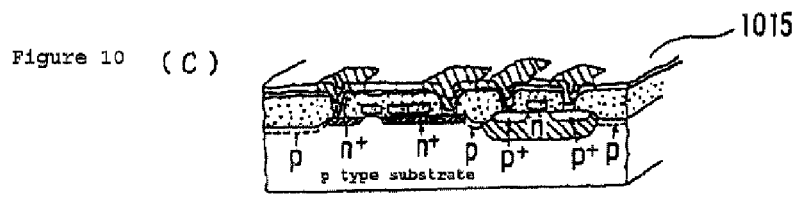
Figure 10 (d)
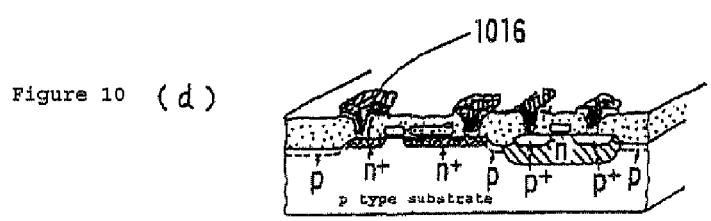

Fig. 11
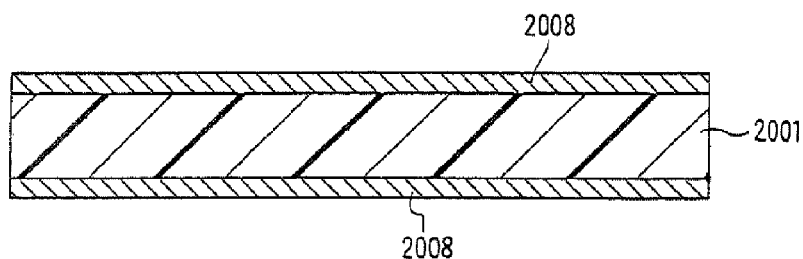
Figure 11 (a)
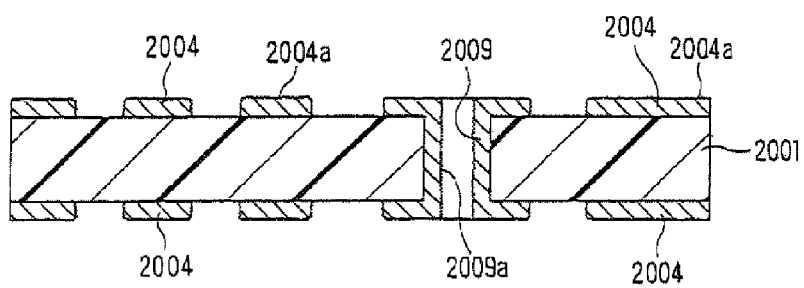
Figure 11 (b)
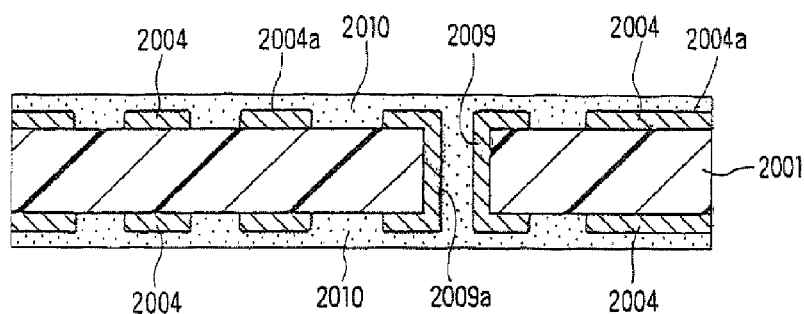
Figure 11 (c)
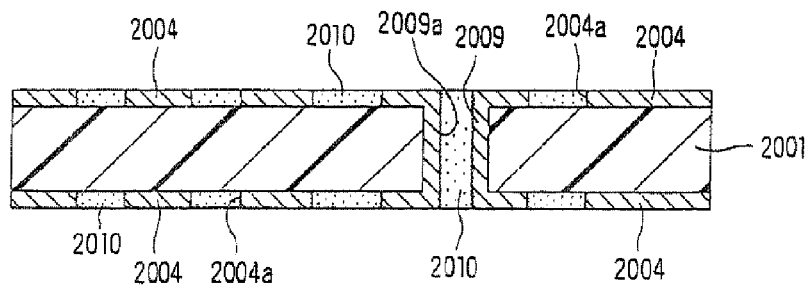
Figure 11 (d)

Fig. 22
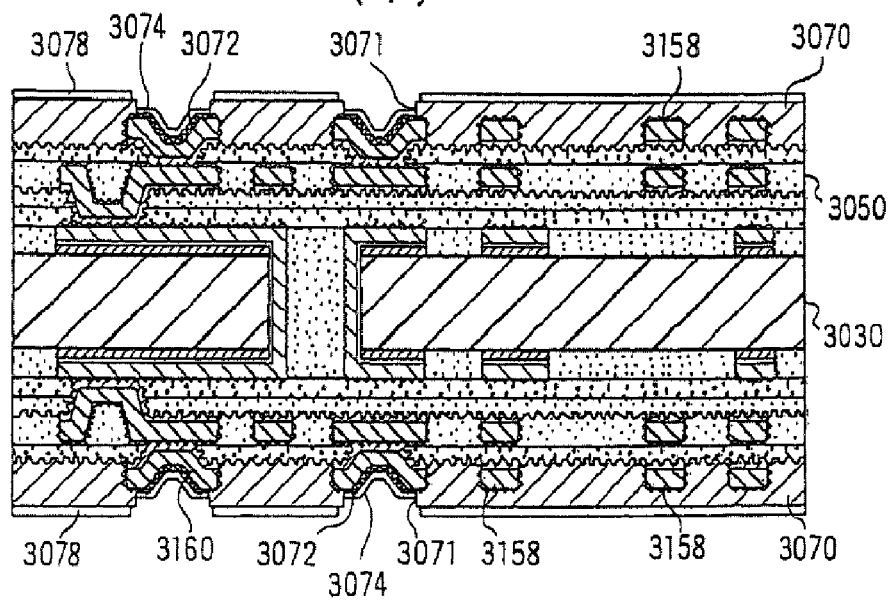
Figure 22 (T)
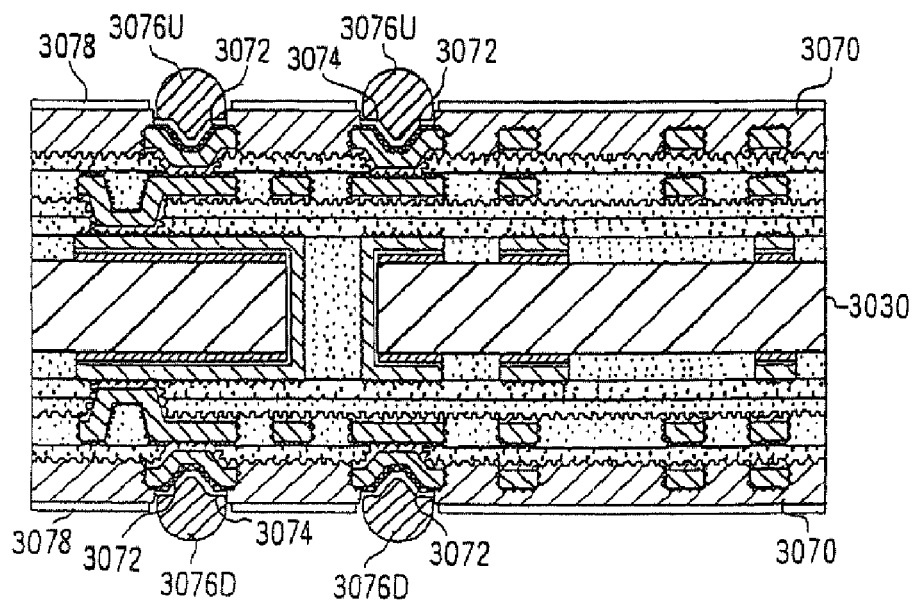
Figure 22 (U)

Fig. 28
Figure 28 (a)
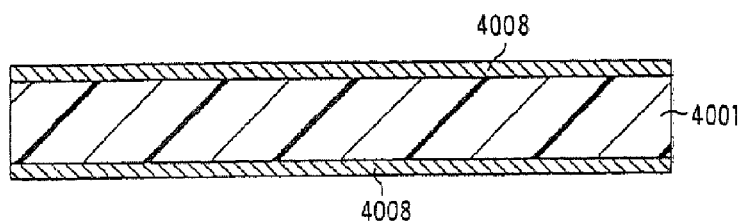
Figure 28 (b)
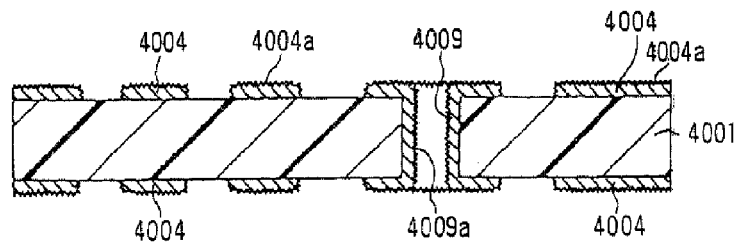
Figure 28 (c)
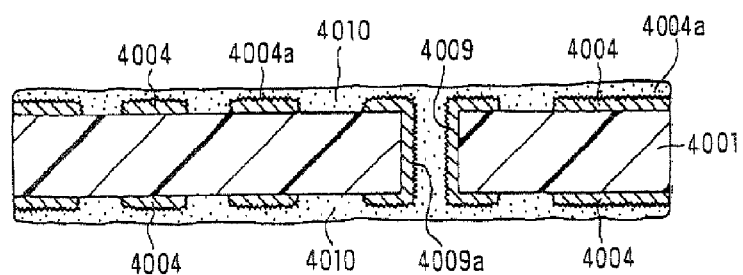
Figure 28 (d)
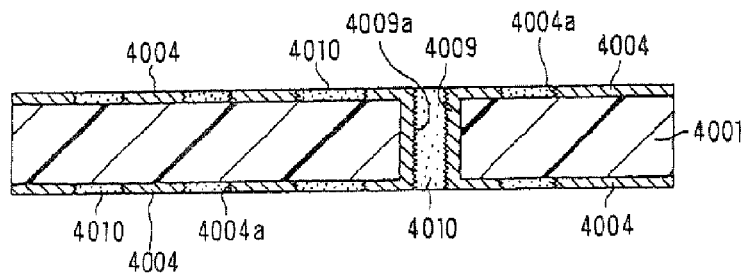

Fig. 39

Fig. 47
Figure 47
(A)
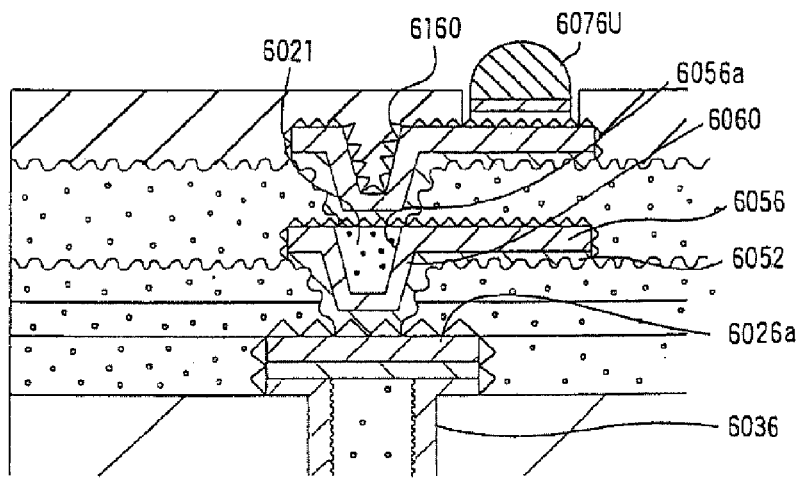
Figure 47
(B)
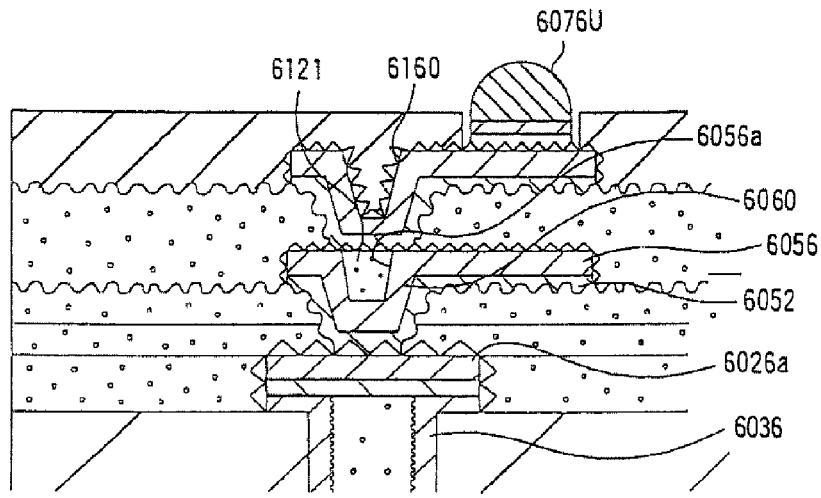

PRINTED WIRING BOARD AND ITS MANUFACTURING METHOD

This is a divisional of application Ser. No. 09/787,139 filed Jun. 13, 2001, now U.S Pat. No. 7,230,188 which is a National Stage Entry of PCT Application No. PCT/JP99/05003 filed Sep. 14, 1999. The entire disclosure of the prior application is hereby incorporated by reference.

TECHNICAL FIELD

The present invention relates to a printed circuit board and to a method for production thereof. The invention further relates to plating methods and plating solutions which can be applied to the above production of printed circuit boards.

BACKGROUND ART

With the mounting need for higher functionality and further miniaturization of electronic equipment, advances in integration technology of LSI and in size reduction of components, and changes in the mounting mode, the demand for high-density wiring is getting greater in the field of printed circuit boards and, as a consequence, development of the so-called multilayer circuit boards comprising 3 or more conductor layers has been broadly undertaken.

In view of the demand for higher wiring density in multilayer circuit boards, the so-called buildup multilayer circuit board is attracting attention. The buildup multilayer circuit board is manufactured by the technology disclosed in Japanese Kokai Publication Hei-4-55555, for instance. Thus, a core substrate board formed with a lower-layer conductor circuit is coated with an electroless plating adhesive comprising a photosensitive resin and, after the coat is dried, exposure to light and development are carried out to provide an interlayer resin insulating layer having openings for via holes. Then, the surface of this interlayer resin insulating layer is roughened with an oxidizing agent or the like and a thin electroless plated copper layer is formed on said interlayer resin insulating layer. Then, a plating resist is disposed thereon and a thick electroplated copper layer is constructed. The plating resist is then stripped off and the thin electroless plated copper layer is etched off to provide a conductor circuit pattern including via holes. This procedure is repeated a plurality of times to provide a multilayer printed circuit board.

When, in the above process for fabricating a printed circuit board, the direct-current plating (DC plating) method, which is one of the conventional electroplating techniques, is used to provide said electroplated copper layer on a substrate surface, the current generally tends to be concentrated in the marginal area of the substrate surface as compared with the central area so that, as illustrated in FIG. 6, the thickness $t_{12}$ of the copper layer in the marginal area of the substrate surface tends to become greater than the thickness $t_{11}$ in the central area, thus causing a regional variation in thickness of the electroplated copper layer.

Since, in actual production runs, said substrate surface is the surface of a substrate board (work size substrate) having a large area corresponding to a large number of printed circuit boards integrated (specifically, the average one has an area of 255 to 510 mm square and there is even one having an area of about 1020 mm square at a maximum), the above tendency is particularly pronounced.

In the manufacture of printed circuit boards, when the electroplated copper layer constituting a conductor circuit is not uniform in thickness, the insulation interval $t_{14}$ between conductor layers in the marginal region of the substrate board is relatively smaller than the insulation interval $t_{13}$ between conductor layers in the central region of the substrate board as shown in FIG. 7, so that the thickness of the insulating layer 1101b between conductor layers must be increased in order to insure a sufficient insulation in all regions of the printed circuit board but this is a hindrance to the implementation of high-density wiring.

In addition, when the copper layer is formed by direct current plating, the crystallinity of the plated copper is low because of the use of an organic additive for improved throwing power. Moreover, the residual stress in the plated copper layer is fairly large so that the layer tends to develop cracks and other flaws and show low elongation and high tensile strength characteristics Therefore, an annealing step for reducing the residual stress has been essential to the manufacture of printed circuit boards.

As a technology for insuring the uniformity of thickness of the plated copper layer, it has been proposed to form a thick plated copper layer by electroless plating alone without electroplating. However, the thick plated copper layer formed by electroless plating is poor in ductility because of the unavoidable contamination of the layer with many impurities inclusive of the additives used. Therefore, when a thick plated copper layer is formed by electroless plating, the reliability for the wiring and connection is insufficient and in order to attain a sufficient degree of reliability, an annealing step is indispensable in this case, too.

To overcome the above problem, a technology for constructing a thick plated copper layer by a constant-current pulse electrolytic technique has been proposed.

The constant-current pulse electroplating process is characterized in that the plating current is controlled at a constant level and the representative waveform involved is a square wave.

This technology may be further divided into the process (PC plating process; FIG. 8) in which the current is controlled by means of the square pulse wave available by repetition of the alternating supply (ON) and interruption (OFF) of the cathode current and the pulse-reverse electroplating method (PR plating method; FIG. 9) in which the current is controlled with a periodically reversed wave available by repetition of the alternating supply of cathode current and supply of anode current. As compared with the direct current electroplating process, the non-steady diffusion layer can be reduced in thickness in either process, with the result that a smooth plated metal layer can be constructed and further that since plating can be effected at a high pulse current density (high overvoltage), the evolution of crystal seeds is promoted to yield finer crystal grains, thus enabling formation of a plated metal layer of high crystallinity. As an example of the PR electroplating method, the process disclosed by Fujinami et al. (Surface Technology, "Formation of Via Filling by PR Electrolysis", 48[6], 1997, p. 86-87).

However, when the plated copper layer is formed by PC process, the uniformity of layer thickness is superior to that obtainable by direct current plating process but is not as good as the objective level (FIG. 4.).

On the other hand, the plated copper layer formed by PR process is improved in the uniformity of thickness as compared with the layer obtainable by PC process but is not as high as desired yet and, moreover, plating by PR process requires an expensive current source.

The current mainstream of electroless plating in the manufacture of printed circuit boards uses EDTA as a complexing agent, and examples of formation of copper circuits with such electroless plating solutions can be found in the Best Mode sections of Japanese Kokai Publication Sho-63-158156 and Japanese Kokai Publication Hei-2-188992 (corresponding to U.S. Pat. No. 5,055,321 and U.S. Pat. No. 5,519,177).

However, with a plating solution containing EDTA as a complexing agent, a compressive stress (an expanding force) is generated in the plating metal layer to cause peeling of the plated copper film from the resin insulating layer.

Furthermore, there is also found the problem not to deposit within fine via holes not over 80 μm in diameter.

Moreover, in the conventional processes for manufacture of printed circuit boards., it was impossible to construct fine-definition line conductor circuits on core boards. Thus, the prior art method for forming a conductor circuit on the core substrate board for a printed circuit board is now described with reference to FIG. 27. As the core substrate board, a copper-clad laminate 3330A comprising a resin substrate 3330 and, as clad to both sides thereof, a copper foil 3331 (FIG. 27(A)) is used. First, through holes 3332 are drilled in this core board (FIG. 27(B)). Then, a plating metal is uniformly deposited (3333) to form plated-through holes 3336 in said holes 3332 (FIG. 27(C)). Then, the copper foil 3331 formed with the plated metal layer 3333 is subjected to pattern-etching to provide a conductor circuit 3334 (FIG. 27(D)). After an interlayer resin insulating layer 3350 is formed over said conductor circuit 3134, plating is performed to provide a conductor circuit 3358 (FIG. 27(E)).

In the above process according to the conventional technology, the thickness of copper foil 3331 is at least 18 μm and the thickness of the plated metal layer formed thereon is 15 μm. Since the combined thickness is as large as 33 μm, etching produces undercuts on the lateral sides of the conductor 3334 as shown in FIG. 27(D) and since the circuit layer then is liable to peel off, it has been impossible to construct a fine-line conductor circuit.

Furthermore, the conductor circuit 3358 on the interlayer resin insulating layer 3350, shown in FIG. 27(E), has been formed in a thickness of about 15 μm. In contrast, the conductor circuit 3334 on the core board 3330 has a thickness of 33 μm. This means that a large impedance difference is inevitable between the conductor circuit 3358 on the interlayer resin insulating layer 3350 and the conductor circuit 3334 on the core board and because of difficulties in impedance alignment, the high-frequency characteristic of the circuit board cannot be improved.

Moreover, in the above process for fabricating a printed circuit board, when the substrate surface is copper-plated by direct-current (DC) electroplating which is general electroplating technique, the plating metal is deposited in the same thickness over the via hole openings and the conductor circuit-forming area This results in formation of depressions in the areas of the interlayer resin insulating layer which correspond to the via holes. Another problem is that the structure called "stacked via", namely formation of a via hole over a via hole, cannot be constructed.

In addition, for the following reasons, the conventional printed circuit board has the drawback that its size and thickness are increased beyond what are required. Thus, as shown in FIG. 38(A), the printed circuit board 5210 for use as a package board for mounting the IC chip 5290 is fabricated by building up interlayer resin insulating layers 5250, 5350 and conductor layers 5258, 5358 in an alternating manner on a core board 5230 formed with plated-through holes 5236 and disposing bumps 5276U for connection to the IC chip 5290 on the top surface and bumps 5276D for connection to a mother board on the bottom side. The electrical connection between the top and bottom conductor layers is afforded by via holes 5260, 5360. While the via holes 5260 are adjacent to the IC chip 5290 of the core board 5230, the via holes 5360 adjacent to the mother board. These via holes are connected to each other through the corresponding plated-through holes 5236. Thus, on the face side of the core board 5230 of this printed circuit board 5210, as shown in FIG. 38(B) which is a sectional view taken along the line B-B of FIG. 38(A), the land 5236a of the plated-through hole 5236 is provided with an inner layer pad 5236b for via-hole connection to the upper layer, while the via hole 5260 is connected to this inner layer pad 5236b.

However, with the prior art land configuration illustrated in FIG. 38(B), the interval between plated-through holes must be large enough to insure a mutual insulation of inner layer pads 5236b, thus restricting the number of plated-through holes that can be constructed in the core board.

On the other hand, the package board is formed with a larger number of bumps on the face side than on the reverse side. This is because the wirings from the plurality of bumps on the surface are consolidated and connected to the bumps on the reverse side. For example, the power lines required to be of low resistance compared with signal lines, which number 20, for instance, on the face side (IC chip side) are consolidated into a single line on the reverse side (on mother board side).

Here, it is preferable that the buildup circuit layer formed on the face side of a core board and the buildup circuit layer on the reverse side may be consolidated at the same pace for the purpose of equalizing the number of upper buildup circuit layers to the number of lower buildup circuit layers, that is to say for minimizing the number of layers. However, as mentioned above, there is a physical restriction to the number of plated-through holes which can be formed in a multilayer core board. Therefore, in the prior art package board, the wirings are consolidated to some extent in the buildup circuit layer on the face side and then connected to the buildup circuit layer on the reverse side through the plated-through holes in the multilayer core board. Since the wiring density has thus been decreased in the buildup circuit layer on the reverse side, it is intrinsically unnecessary to provide the same number of layers on the reverse side as in the buildup circuit layers on the face side. However, the same number of layers has heretofore been used because if there is a difference in the number of layers between the face and reverse sides, warping due to asymmetry would be inevitable. Thus, because of said restriction to the number of plated-through holes which can be provided in the multilayer core board, it is not only necessary to increase the number of layers for the buildup wiring layer on the face side but also necessary to form the buildup circuit layer on the reverse side using the same increased number of layers on the face side.

Thus, in the prior art multilayered buildup circuit board (package board), the number of built-up layers is increased so that the reliability of connection between the upper and lower layers is low. Moreover, the cost of the package board is increased and the size, thickness and weight of the package board are unnecessarily increased.

Furthermore, even when the buildup multilayer circuit board is provided only on one side of a core board, provision must be made for a freedom in wiring design for the side opposite to the side formed with the buildup layer.

Moreover, since the connection between plated-through hole 5236 and via hole 5260 is afforded through an inner layer pad 5236b as described above, the wiring length within the printed circuit board is increased to sacrifice the signal transmission speed, thus making it difficult to meet the demand for speed-up of IC chips.

SUMMARY OF THE INVENTION

Developed in the above state of the art, the present invention has for its object to provide an electroplating process which, by utilizing a constant-voltage pulse process is capable of providing with low equipment cost, an electroplated metal of good crystallinity and uniform deposition on substrate.

It is another object of the present invention to provide an electroless plating solution contributory to reduced plating stresses and consequent protection of the plated metal film against peeling from the inner insulating layer and capable of forming a plated metal film even in fine via holes and an electroless plating process using said plating solution.

It is still another object of the present invention to provide a process for manufacturing a multilayer printed circuit board having an improved high-frequency characteristic.

The present invention has for its additional object to provide a process for manufacturing multilayer printed circuit boards which is capable of simultaneous via hole filling and formation of conductor circuit by electroplating without using an expensive equipment.

It is a further object of the present invention to provide a multilayer printed circuit board contributory to reduction in the number of layers of the buildup structure and a multilayer printed circuit board contributory to reduction in the internal wiring length.

It is a still further object of the present invention to provide a multilayer buildup circuit board contributory to reduction in the internal wiring length.

The first invention among inventions belonging to the first group is concerned with an electroplating process comprising electroplating an electrically conductive substrate wherein the electroplating is performed intermittently using said substrate surface as cathode and a plating metal film as anode at constant voltage between said anode and said cathode.

The second invention among said inventions belonging to the first group is concerned with a process for producing a circuit board comprising a substrate and, as formed thereon, a conductor circuit by electroplating wherein the electroplating is performed intermittently using the electrically conductive conductor circuit-forming surface as cathode and a plating metal as anode at a constant voltage between said anode and said cathode.

The third invention among said inventions belonging to the first group is concerned with a process for manufacturing a printed circuit board which comprises disposing a resist on electrically conductive layer formed on a substrate, performing electroplating, stripping the resist off and etching said electrically conductive layer to provide a conductor circuit, wherein the electroplating is performed intermittently using said electrically conductive layer as cathode and a plating metal as cathode at a constant voltage between said anode and said cathode.

The fourth invention among said inventions belonging to the first group is concerned with a process for manufacturing a printed circuit board which comprises disposing an interlayer resin insulating layer on a substrate formed with a conductor circuit, creating openings for formation of via holes in said interlayer resin insulating layer, forming an electroless plated metal layer on said interlayer resin insulating layer, disposing a resist thereon, performing electroplating, stripping the resist off and etching the electroless plated metal layer to provide a conductor circuit and via holes, wherein the electroplating is performed intermittently using said electroless plated metal layer as cathode and a plating metal as anode at a constant voltage between said anode and said cathode.

The fifth invention among said inventions belonging to the first group is concerned with a circuit board comprising a substrate and, as built thereon, a circuit comprised of a copper film which has properties that (a) its crystallinity is such that the X-ray diffraction half-width of the (331) plane of copper is less than 0.3 deg and (b) the variation in thickness ((maximum thickness-minimum thickness)/average thickness)) of the electroplated copper layer (electroplated metal layer) as measured over the whole surface of said substrate is not greater than 0.4.

The sixth invention among said inventions belonging to the first group is concerned with a printed circuit board comprising a substrate and, as built thereon, a circuit comprised of a plated copper film wherein said plated copper film has properties that (a) its crystallinity is such that the X-ray diffraction half-width of (331) plane of copper is less than 0.3 deg and (b) the variation in thickness ((maximum thickness-minimum thickness)/average thickness) of said plated copper layer as measured over the whole surface of said substrate is not greater than 0.4.

The seventh invention among said inventions belonging to the first group is concerned with a printed circuit board comprising a substrate formed with a conductor circuit, an interlayer resin insulating layer built thereon and a conductor circuit comprised of a copper film as built on said interlayer resin insulating layer, said interlayer resin insulating layer having vial holes by which said conductor circuits are interconnected, wherein said copper film has properties that (a) its crystallinity is such that the X-ray diffraction half-width of (331) plane of copper is less than 0.3 deg and (b) the variation in thickness ((maximum thickness-minimum thickness)/average thickness) of said plated copper layer as measured over the whole surface of said substrate is not greater than 0.4.

As a prior art technology for constructing a conductor circuit by a pulse electroplating method, there is known the PR electrolytic process mentioned hereinbefore but this prior art technology is a plating method using a constant current and not a constant-voltage pulse electroplating process wherein the voltage is controlled.

The first invention among inventions belonging to a second group is concerned with an electroless plating solution comprising an aqueous solution containing 0.025 to 0.25 mol/L of a basic compound, 0.03 to 0.15 mol/L of a reducing agent, 0.02 to 0.06 mol/L of copper ion and 0.05 to 0.30 mol/L of tartaric acid or a salt thereof.

The second invention among said inventions belonging to the second group is concerned with an electroless plating solution comprising an aqueous solution containing a basic compound, a reducing agent, copper ion, tartaric acid or a salt thereof and at least one ion species selected from the group consisting of nickel ion, cobalt ion and iron ion.

The third invention among said inventions belonging to the second group is concerned with an electroless plating process which comprises immersing a substrate in the electroless plating solution according to either said first invention or said second invention and performing electroless copper plating at a deposition rate set to 1 to 2 µm/hour.

The fourth invention among said inventions belonging to the second group is concerned with a process for manufacturing a printed circuit board which comprises immersing a resin insulating substrate board in the electroless plating solution according to either said first invention or said second invention and performing electroless copper plating at a deposition rate set to 1 to 2 μm/hour to provide a conductor circuit.

The fifth invention among said inventions belonging to the second group is concerned with a printed circuit board comprising a resin insulating substrate board formed with a roughened surface and, as built thereon, a conductor circuit comprising at least an electroless plated film wherein that said electroless plated film has a stress of 0 to +10 kg/mm².

The sixth invention among said inventions belonging to the second group is concerned with a printed circuit board comprising a resin insulating substrate board formed with a roughened surface and, as built thereon, a conductor circuit comprising at least an electroless plated film wherein said electroless plated film is complementary to said roughened surface and convex areas of the roughened surface is relatively greater in thickness than said film in concave areas of said roughened surface.

The seventh invention among said inventions belonging to the second group is concerned with a printed circuit board comprising a substrate board formed with a lower-layer conductor circuit and, as built thereon, an upper-layer conductor circuit through the intermediary of an interlayer resin insulating layer, with said upper-layer conductor circuit and said lower-layer conductor circuit being interconnected by via holes, wherein said upper-layer conductor circuit comprises at least an electroless plated film, said interlayer resin insulating layer is provided with a roughened surface, said electroless plated film is complementary to said roughened surface, and bottoms of said via holes are also provided with an electroless plated film having a thickness equal to 50 to 100% of the thickness of the electroless plated film on said interlayer resin insulating layer.

The eighth invention among said inventions belonging to the second group is concerned with a printed circuit board comprising a resin insulating substrate board and, as built thereon, a conductor circuit comprising at least an electroless plated film, wherein said electroless plated film comprises copper and at least one metal species selected from the group consisting of nickel, iron and cobalt.

The first invention among inventions belonging to a third group is concerned with a process for manufacturing a multilayer printed circuit board comprising at least the following steps (1) to (5).

(1) a step for thinning the copper foil of a copper-clad laminate by etching
(2) a step for piercing through holes in said copper-clad laminate
(3) a step for depositing a plated metal film on said copper-clad laminate to construct plated-through holes within said through holes
(4) a step for pattern-etching the copper foil and plated metal film on said copper-clad laminate to construct a conductor circuit
(5) a step for serially building up an interlayer resin insulating layer and a conductor layer alternately over said conductor circuit.

The second invention among said inventions belonging to the third group is concerned with a process for manufacturing a multilayer printed circuit board comprising at least the following steps (1) to (7):
(1) a step for thinning the copper foil of a copper-clad laminate by etching
(2) a step for piercing through holes in said copper-clad laminate (3) a step for forming a conductor film on said copper-clad laminate
(4) a step of disposing a resist on areas free from conductor circuits and plated-through holes
(5) a step for providing a plated metal film in the resist-free area to construct a conductor circuit and plated-through holes
(6) a step for stripping off said resist and etching the conductor film and copper foil under the resist
(7) a step for serially building up an interlayer resin insulating layer and a conductor layer alternately over said conductor circuit.

The third invention among inventions belonging to the third group is concerned with a multilayer printed circuit board which comprises a core board having a conductor circuit and, as built over said conductor circuit, a buildup wiring layers comprising obtainable by building up an interlayer resin insulating layer and a conductor layer alternately with the conductor layers being interconnected by via holes, wherein the thickness of the conductor circuit on said core board is not greater by more than 10 μm than the thickness of the conductor layer on said interlayer resin insulating layer.

The fourth invention among said inventions belonging to the third group is concerned with a process for manufacturing a multilayer printed circuit board which comprises thinning the copper foil of a copper-clad laminate by etching, pattern-etching the copper foil of said copper-clad laminate to construct a conductor circuit and building up serially an interlayer resin insulating layer and a conductor layer alternately over said conductor circuit wherein the thickness of the conductor circuit on said core board is controlled so as to be not greater by more than 10 μm than the thickness of the conductor layer on said interlayer resin insulating layer.

The invention belonging to a fourth group is concerned with a process for manufacturing a multilayer printed circuit board which comprises constructing an interlayer insulating layer on a substrate formed with a lower-layer conductor circuit, piercing openings in said interlayer insulating layer, imparting electrical conductivity to the surface of said interlayer insulating layer and the inner walls of said openings, performing electroplating to fill up said openings and thereby provide via holes and, at the same time, construct an upper-layer conductor circuit, wherein said electroplating is performed using an aqueous solution containing a metal ion and 0.1 to 1.5 mmol/L of at least one additive selected from the group consisting of thioureas, cyanides and polyalkylene oxides as a plating solution.

The first invention belonging to a fifth group is concerned with a multilayer printed circuit board comprising a core board having plated-through holes and, as constructed on both sides thereof, a buildup wiring layers obtainable by building up an interlayer resin insulating layer and a conductor layer alternately with said conductor layers being interconnected by via holes, wherein said via holes are formed in the manner of plugging the holes in plated-through holes in said core board.

The second invention belonging to the fifth group is concerned with a process for manufacturing a multilayer printed circuit board comprising at least the following steps (1) to (4:
(1) a step for piercing through holes not larger than 200 μm in diameter in a core board by laser
(2) a step for plating said through holes to construct plated-through holes therein
(3) a step for constructing an interlayer resin insulating layer provided with openings communicating with said plated-through holes on the core board (4) a step for plating the openings in said interlayer resin insulating layer to construct via holes in the manner of plugging the holes in said plated-through holes.

The first invention among inventions belonging to a sixth group is concerned with a multilayer printed circuit board comprising a core board and, as constructed on both sides thereof, a buildup wiring layers obtainable by building up an interlayer resin insulating layer and a conductor layer alternately with via holes interconnecting conductor layers, wherein the via holes in a lower layer are disposed immediately over the plated-through holes formed in said core board and via holes in an upper layer are disposed immediately over said via holes in the lower layer.

The second invention among said inventions belonging to the sixth group is concerned with a multilayer printed circuit board comprising a core board having plated-through holes and, as constructed on both sides thereof, a buildup wiring layers obtainable by building up an interlayer resin insulating layer and a conductor layer alternately with via holes interconnecting conductor layers, wherein said plated-through holes of core board are filled with a filler, with the surfaces of said filler which are exposed from said plated-through holes being covered with a conductor layer provided with lower-layer via holes, with upper-layer via holes being disposed immediately over said lower-layer via holes.

The third invention among said inventions belonging to the sixth group is concerned with a multilayer printed circuit board comprising a core board and, as constructed on both sides thereof, a buildup wiring layers obtainable by building up an interlayer resin insulating layer and a conductor layer alternately with via holes interconnecting conductor layers wherein the via holes in a lower layer are disposed to plug the holes in plated-through holes of said core board, with via holes in an upper layer being disposed immediately over said via holes in the lower layer.

BRIEF DESCRIPTION OF THE DRAWINGS

FIGS. 2(a) to (e) are diagrams illustrating the printed circuit board-fabricating step in the processes for manufacture of printed circuit boards which belong to the first group of the present invention.

FIGS. 3(a) to (b) are diagrams showing exemplary current and voltage waveforms for the constant-voltage pulse plating process.

FIG. 4 is a diagram showing the results of evaluation of the deposition uniformity of the electroplated copper layers constructed by four kinds of electroplating techniques, namely the direct-current plating techniques PC plating technique, PR plating technique and constant-voltage pulse plating technique.

FIG. 6 is a schematic diagram illustrating the electroplated copper layer formed on an insulating board by the conventional direct-Current electrolytic technique.

FIG. 7 is a schematic diagram illustrating the disadvantage encountered in laminating the printed circuit board prepared by the technique according to FIG. 6.

FIGS. 8(a) to (b) are diagrams showing exemplary current and voltage waveforms for the PC plating technique.

FIGS. 9(a) to (b) are diagrams showing exemplary current and voltage waveforms for the PR plating technique.

FIGS. 10(a) to (d) are views illustrating the production flow for the manufacture of a CMOS IC.

FIGS. 11(a) to (d) are sectional views showing a part of the process for manufacture of printed circuit boards according to a second group of the present invention.

FIGS. 22(T) to (U) are sectional views showing a part of the process for manufacture of multilayer printed circuit boards according to the third group of the present invention.

FIGS. 28(a) to (d) are sectional views showing a part of the process for manufacture of multilayer printed circuit boards according to the fourth group of the present invention.

FIG. 47(A) illustrates a structure of the multi-layer printed circuit board according to the sixth group of the present invention and FIG. 47(B) illustrates a structure of the multi-layer printed circuit board according to the sixth group of the present invention.

DETAILED DESCRIPTION OF THE INVENTION

Figure 1:
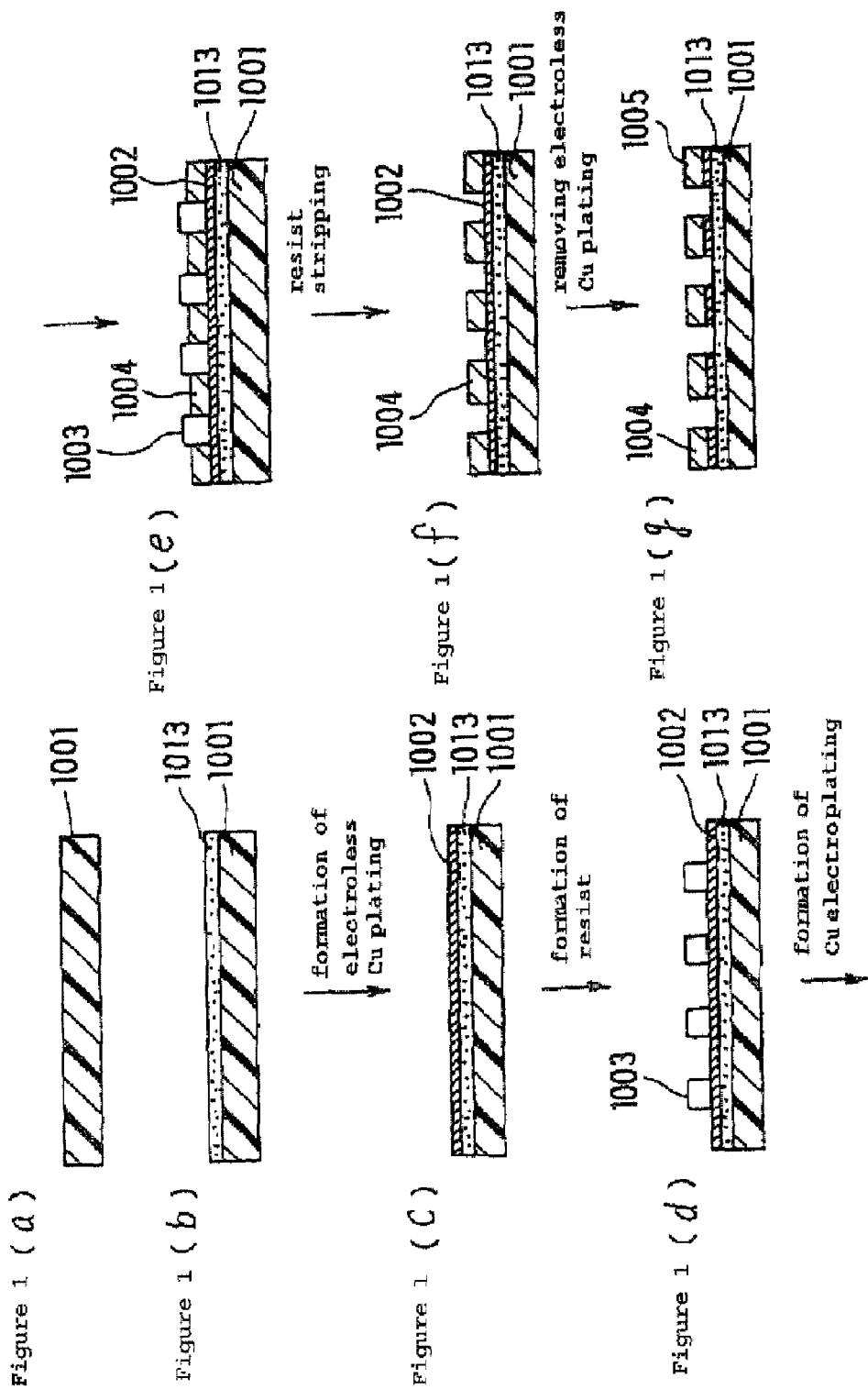
FIGS. 1(a) to (g) are diagrams illustrating the conductor circuit-fabricating step in the processes for manufacture of printed circuit boards which belong to a first group of the present invention.

The present invention is now described in detail. Unless otherwise indicated, the thickness of any copper foil, conductor layer or conductor circuit as mentioned in this specification is the mean of thicknesses measured on a light or electron microphotograph of its cross-section.

The first invention among the inventions belonging to the first group is concerned with an electroplating process for electroplating a conductive substrate surface wherein said electroplating is performed intermittently using said substrate surface as cathode and a plating metal as anode at a constant voltage between said anode and said cathode.

The intermittent electroplating in the above electroplating process is carried out by repeating application of a voltage between the cathode and anode and interruption thereof in an alternating pattern, and preferably the voltage time/interruption time ratio is 0.01 to 100, the voltage time is not longer than 10 seconds and the interruption time is not shorter than $1 \times 10^{-2}$ seconds.

The second invention among the inventions belonging to the first group is concerned with a process for producing a circuit board which comprises forming a conductor circuit on a substrate board by electroplating, wherein said electroplating is performed intermittently using the conductive surface on which a conductor circuit is to be formed as cathode and a plating metal as anode at a constant voltage between said anode and said cathode.

In the above process for producing a circuit board, said intermittent electroplating is carried out by repeating application of a voltage between the cathode and anode and interruption thereof in an alternating pattern, and preferably the voltage time/interruption time ratio is 0.01 to 100, the voltage time is not longer than 10 seconds and the interruption time is not shorter than $1 \times 10^{-2}$ seconds It should be understood that the above circuit comprises electrodes and mounting pads in addition to a conductor circuit pattern.

The third invention among the inventions belonging to the first group is concerned with a process for producing a printed circuit board which comprises disposing a resist on a conductive layer on a substrate board, performing electroplating, stripping the resist off, and etching said conductive layer to provide a conductor circuit, wherein said electroplating is performed intermittently using said conductive layer as cathode and a plating metal as anode at a constant voltage between said anode and said cathode.

The fourth invention among the inventions belonging to the first group is concerned with a process for producing a printed circuit board which comprises constructing an interlayer resin insulating layer on a conductor circuit-forming substrate board, forming openings for via holes in said interlayer resin insulating layer, forming an electroless plated metal layer over said interlayer resin insulating layer, disposing a resist thereon, performing electroplating, stripping the resist off and etching the electroless plated metal layer to form a conductor circuit pattern and via holes, wherein said electroplating is performed intermittently using said electroless plated metal layer as cathode and a plating metal as anode at a constant voltage between said anode and said cathode.

In the above process for producing a printed circuit board, a metal layer may have been formed on the surface of the interlayer resin insulating layer.

The intermittent electroplating in the above third and fourth inventions comprises application of a voltage between the cathode and anode and interruption thereof in an alternating pattern, and preferably the voltage time/interruption time ratio is 0.01 to 100, the voltage time is not longer than 10 seconds and the interruption time is not shorter than $1 \times 10^{-2}$ seconds.

The fifth invention among the inventions belonging to the first group is concerned with a circuit board having a copper film circuit on a substrate board, wherein said copper film has properties (a) its crystallinity is such that the half-width of X-ray diffraction of the (331) plane of copper is less than 0.3 deg. and (b) the variation in thickness of said copper film (electroplated copper layer) measured over the whole surface of said substrate, i.e. ((maximum thickness-minimum thickness)/average thickness), is not greater than 0.4.

In the circuit board mentioned above, the percent elongation of said copper film as a characteristic parameter is preferably not less than 7%.

The sixth invention among the inventions belonging to the first group is concerned with a printed circuit board comprising a copper film circuit on a substrate board, wherein said copper film has properties that (a) its crystallinity is such that the half-width of X-ray diffraction of the (331) plane of copper is less than 0.3 deg. and (b) the variation in thickness of plated metal layer measured over the whole surface of said substrate, i.e. ((maximum thickness-minimum thickness)/average thickness), is not greater than 0.4.

The seventh invention among the inventions belonging to the first group is concerned with a printed circuit board comprising an interlayer resin insulating layer on a substrate board for the formation of a conductor circuit and, as disposed on top of said interlayer resin insulating layer, a copper-film conductor circuit, with via holes provided in said interlayer resin insulating layer interconnecting said conductor circuits, wherein said copper film has properties that (a) its crystallinity is such that the half-width of X-ray diffraction of the (331) plane of copper is less than 0.3 deg. and (b) the variation in thickness of said copper film (electroplated copper layer) measured over the whole surface of said substrate, i.e. ((maximum thickness-minimum thickness)/average thickness), is not greater than 0.4.

The copper film in the above sixth and seventh inventions is preferably further has its percent elongation of not less than 7%.

The inventions of the first group relate broadly to a technology for fabricating conductor circuits for semiconductor devices and printed circuit boards and an electroplating technology such that intermittent electroplating is performed in a plating metal ion-containing plating solution using the substrate surface as cathode and the plating metal as anode with the voltage between said anode and cathode being kept constant.

The intermittent electroplating described above insures a uniform plating thickness. The reason seems to be that while the plating metal deposit is preferentially dissolved by the spike current flowing momentarily toward the anode in the marginal area of the substrate board surface and around the openings for via holes where the amount of deposition of the plating metal tends to be larger, the plating metal is precipitated by the spike current flowing momentarily toward the cathode in the central area of the substrate surface and the interior parts of the via holes where the amount of plating metal deposition tends to be smaller as in the remainder of the region, with the result that a highly uniform thickness of electrodeposition is insured.

Furthermore, intermittent electroplating results in an increased crystallinity of the plated metal film. The reason is suspected to be that as the application of a voltage is interrupted, the metal ions in the neighborhood of the interface of the substrate diffuse to maintain a constant concentration at all times so that no defect occurs in the crystal lattice of the precipitated metal layer, thus contributing to a higher degree of crystallinity.

By the constant-voltage pulse plating technique in the inventions of the first group, which insures a uniform plate thickness, the thickness of the conductor circuits for circuit boards such as semiconductor devices and printed circuit boards can be rendered uniform. Therefore, not only is impedance alignment facilitated but, because the thickness of the interlayer resin insulating layer is uniform, an improved interlayer insulation is materialized. Furthermore, because of high crystallinity and high elongation characteristics, the residual stress in the plated metal layer is low so that even fine line-definition patterns can be protected against peeling. Therefore, the connection reliability of circuits is improved.

The above intermittent electroplating process comprises application of a voltage between the cathode and anode and interruption thereof in an alternating pattern, and preferably the voltage time/interruption time ratio is 0.01 to 100, the voltage time is not longer than 10 seconds and the interruption time is not shorter than $1 \times 10^{-12}$ seconds. If the voltage time exceeds 10 seconds, the film thickness will become uneven as it is the case with the conventional direct-current electroplating, and when the interruption time is less than $1 \times 10^{-12}$ seconds, the diffusion of metal ions will be insufficient to detract from crystallinity. The optimum voltage time/interruption time ratio is 0.1 to 1.0.

The electroplating mentioned above is preferably copper plating, nickel plating, cobalt plating, tin plating or gold plating.

The copper plating solution is preferably an aqueous solution of sulfuric acid and copper sulfate. The nickel plating solution may for example be an aqueous solution of nickel sulfate, nickel chloride, and boric acid. The cobalt plating solution may be an aqueous solution of cobalt chloride, basic cobalt carbonate and phosphorus acid. The tin plating solution may be an aqueous solution of stannous chloride. For gold plating, an aqueous solution of gold chloride, potassium cyanide and gold metal can be used.

Since the electroplating bath need not be supplemented with a brightener and other additives, the crystallinity of the plated metal deposit is remarkably high.

As the plating metal which serves as the anode, the metal in the form of a ball or a rod, for instance, can be used.

The technology of manufacturing circuit boards in accordance with the inventions belonging to the first group in now described.

The substrate board which can be used includes metal, semiconductor, resin and ceramic substrates, among others.

First, the surface of the substrate board is made electrically conductive so that it may be successfully electroplated. The technique for imparting electrical conductivity to a resin substrate or a ceramic substrate comprises forming metal layer by using an electroless plated deposit layer or a sputter-metalized layer. As an alternative, the technique of incorporating a colloidal or powdery metal in the matrix resin can be used.

On the substrate rendered electrically conductive on the surface, a resist is disposed where necessary. The plating metal adheres to the conductive surface not covered with resist but exposed.

This substrate is immersed in the electroplating solution and subjected to intermittent electroplating using the substrate as cathode and the plating metal as anode.

Referring to the inventions of the first group, the production process relevant to cases in which the circuit board is a printed circuit board is now described.

The substrate which can be used includes insulating substrates such as a resin substrate and a ceramic substrate.

The resin substrate mentioned above includes an insulating board prepared by laminating prepregs each comprising a fibrous matrix impregnated with a thermosetting resin, a thermoplastic resin or a thermosetting resin-thermoplastic resin complex or a copper-clad laminate board prepared by laying up such prepregs and copper foils and hot-pressing them.

As the fibrous matrix mentioned above, glass cloth, aramid clothe etc. can be used.

An electroless plating catalyst such as a Pd catalyst is applied to the surface of said insulating substrate board to form an electroless plated layer. When a copper-clad laminate board is used, the copper foil as such can be utilized as cathode.

A plating resist is then disposed thereon. The plating resist can be formed by a process which comprises pasting a photosensitive dry film followed by exposure and development or a process which comprises coating the substrate board with a liquid resist followed by exposure and development.

The conductor circuit is formed by intermittent electroplating using the conductive layer not covered with resist but exposed, e.g. electroless plated metal layer as cathode and the plating metal as anode.

Then, the plating resist is stripped off and the conductive layer, e.g. electroless plated metal layer, is etched off with an etching solution to complete the conductor circuit.

As the etching solution mentioned above, an aqueous system of sulfuric acid-hydrogen peroxide, ferric chloride, cupric chloride or ammonium persulfate, for instance, can be used.

The following procedure is followed for the production of a multilayer printed circuit board.

A conductor circuit-forming substrate board is first provided with an interlayer resin insulating layer, which is then formed with openings for via holes. The openings are provided by exposure, development or irradiation with laser light.

For the interlayer resin insulating layer mentioned above, a thermosetting resin, a thermoplastic resin, a partially photosensitized thermosetting resin, or a complex resin comprising thereof can be used.

The above interlayer resin insulating layer can be formed by coating with an uncured resin or an uncured resin film by pressure bonding under heating. As an alternative, an uncured resin film carrying a metal layer, e.g. copper foil, on one side can be bonded. When such a resin film is used, the areas of the metal layer which correspond to via holes are etched off, followed by irradiation with a laser beam to provide necessary openings.

The above resin film formed with a metal layer may for example be a copper foil having resin film.

As the interlayer resin insulating layer mentioned above, the layer formed of an adhesive for electroless plating use can be used. The optimum adhesive for electroplating use is a dispersion of a cured acid- or oxidizing agent-soluble heat-resistant resin powder in a substantially acid- or oxidizing agent-insoluble uncured heat-resistant resin. This is because upon treatment with an acid or an oxidizing agent, the heat-resistant resin particles are dissolved and removed so that a roughened surface comprising narrow-necked bottle-like anchors can be provided.

Referring to said adhesive for electroless plating use, the cured heat-resistant resin powder mentioned above, in particular, is preferably ① a heat-resistant resin powder having an average particle diameter of not more than 10 μm, ② a block powder available on aggregation of heat-resistant resin particles having an average particle diameter of not more than 2 μm, ③ a mixture of a heat-resistant resin powder having an average particle diameter of 2 to 10 μm and a heat-resistant resin powder having an average particle diameter of not more than 2 μm, ④ a pseudo-particle comprising a heat-resistant resin powder having an average particle diameter of 2 to 10 μm and at least one of a heat-resistant resin powder and an inorganic powder each having an average particle diameter of not more than 2 μm as adhered to the surface of the first-mentioned resin powder, ⑤ a mixture of a heat-resistant resin powder having an average particle diameter of 0.1 to 0.8 μm and a heat-resistant resin powder having an average particle diameter of over 0.8 μm to less than 2 μm, or ⑥ a heat-resistant resin powder having an average particle diameter of 0.1 to 1.0 μm is preferred. With any of those materials, the more sophisticated anchors can be provided.

The depth of the roughened surface structure is preferably Rmax=0.01 to 20 μm. This is preferred for insuring a sufficient degree of adhesion. Particularly in the semi-additive process, the depth of 0.1 to 5 μm is preferred, for the electroless plated metal layer can then be removed without detracting from adhesion.

The substantially acid- or oxidizing agent-insoluble heat-resistant resin mentioned above is preferably a "complex resin comprising a thermosetting resin and a thermoplastic resin" or a "complex resin comprising a photosensitive resin and a thermoplastic resin". This is because while the former is highly heat-resistant, the latter is capable of forming openings for via holes by a photolithographic technique.

The thermosetting resin which can be used as above includes epoxy resin, phenolic resin and polyimide resin. For imparting photosensitivity, the thermosetting groups are acrylated with methacrylic acid or acrylic acid. The optimum resin is an acrylated epoxy resin.

As the above-mentioned epoxy resin, there can be used novolac epoxy resins such as phenol novolac resin and cresol novolac resin and dicyclopentadiene-modified alicyclic epoxy resin.

As the thermoplastic resin, there can be used polyethersulfone (PES), polysulfone (PSF), polyphenylenesulfone (PPS), polyphenylene sulfide (PPES), polyphenyl ether (PPE), polyetherimide (PI) and fluororesin.

The blending ratio of the thermosetting resin (photosensitive resin) to the thermoplastic resin, i.e. thermosetting (photosensitive) resin/thermoplastic resin, is preferably 95/5 to 50/50. This range contributes to a high level of toughness without compromise in heat resistance.

The blending weight ratio of said heat-resistant resin powder is preferably 5 to 50 weight % based on the solid matter of the heat-resistant resin matrix. The more preferable ratio is 10 to 40 weight %.

The heat-resistant resin powder is preferably an amino resin (melamine resin, urea resin, guanamine resin) or an epoxy resin, for instance.

Further, an electroless plated metal layer is formed over said interlayer resin insulating layer (on the copper foil when a resin-containing copper foil is used) inclusive of surface of openings and after placement of a resist, electroplating is performed to provide a conductor circuit and via holes.

The electroplating is performed intermittently using said electroless plated metal layer as cathode and the plating metal as anode with the voltage between the anode and cathode being kept constant.

Then, the resist is stripped off and the electroless plated metal layer is etched off.

The circuit board and printed circuit board formed by the electroplating process according to the first group of the present inventions, in which the conductor wiring or conductor circuit is made of copper, should satisfy the following conditions (a) and (b).

Thus, (a) as to crystallinity, the half-width of X-diffraction of the (331) plane of copper is not greater than 0.3 deg, and (b) the variation in plating thickness of the copper layer (electrolated copper layer) as measured all over the surface of said substrate board ((maximum thickness-minimum thickness)/average thickness) is not greater than 0.4.

When the half-width of X-ray diffraction of the (331) plane of copper is 0.3 deg. or larger, the residual stress will be increased and, in the case of a delicate pattern, there will be a risk for peeling. If the variation ((maximum thickness-minimum thickness)/average thickness) is greater than 0.4, impedance alignment may hardly be obtained.

The reason for selection of the (331) plane of copper is that this is the plane revealing the most striking change in crystallinity in X-ray diffraction analysis.

The percent elongation mentioned above for the copper layer is preferably not less than 7%. If the elongation is less than 7%, cracks are liable to develop on cold thermal shock.

In the inventions of the first group, the purity of copper deposited is as high as 99.8% or more. Therefore, the inherent ductility of copper is fully expressed to provide a high elongation rate.

The circuit board mentioned above includes printed circuit boards, IC chips and semiconductor devices such as LSI.

The first invention among inventions belonging to a second group is concerned with an electroless plating solution comprising an aqueous solution containing 0.025 to 0.25 mol/L of a basic compound, 0.03 to 0.15 mol/L of a reducing agent, 0.02 to 0.06 mol/L of copper ion and 0.05 to 0.30 mol/L of tartaric acid or a salt thereof.

The second invention among inventions of the second group is concerned with an electroless plating solution comprising an alkaline compound, a reducing agent, copper ion, tartaric acid or a salt thereof and at least one metal ion species selected from the group consisting of nickel ion, cobalt ion and iron ion.

The preferred specific gravity of the electroless plating solutions according to the above first and second inventions is 1.02 to 1.10.

Furthermore, the preferred temperature of those electroless plating solutions is 25 to 40° C. In addition, the copper deposition rate of those electroless plating solutions is preferably 1 to 2 μm/hour.

The third invention among inventions of the second group is concerned with an electroless plating process which comprises immersing a substrate in the electroless plating solution of said first or second invention and performing electroless copper plating with the deposition rate set to 1 to 2 μm/hour.

In the above electroless plating process, said substrate is preferably provided with a roughened surface in advance.

The fourth invention among inventions of the second group is concerned with a process for manufacturing a printed circuit board comprising immersing a resin insulating substrate board in the electroless plating solution of said first or second invention and performing electroless copper plating with the deposition rate set to 1 to 2 μm/hour to provide a conductor circuit.

The fifth invention among inventions of the second group is concerned with a printed circuit board comprising a resin insulating substrate board having a roughened surface and, as an electroless plated layer thereon, a conductor circuit, wherein said electroless plated layer has a stress value of 0 to +10 kg/mm$^2$.

The sixth invention among inventions of the second group is concerned with a printed circuit board comprising a resin insulating substrate board having a roughened surface and, as an electroless plated layer thereon, a conductor circuit, wherein said electroless plated layer is complementary to said roughened surface and relatively increased in thickness in convex areas of the roughened surface as compared with concave areas of said surface.

Figure 16:
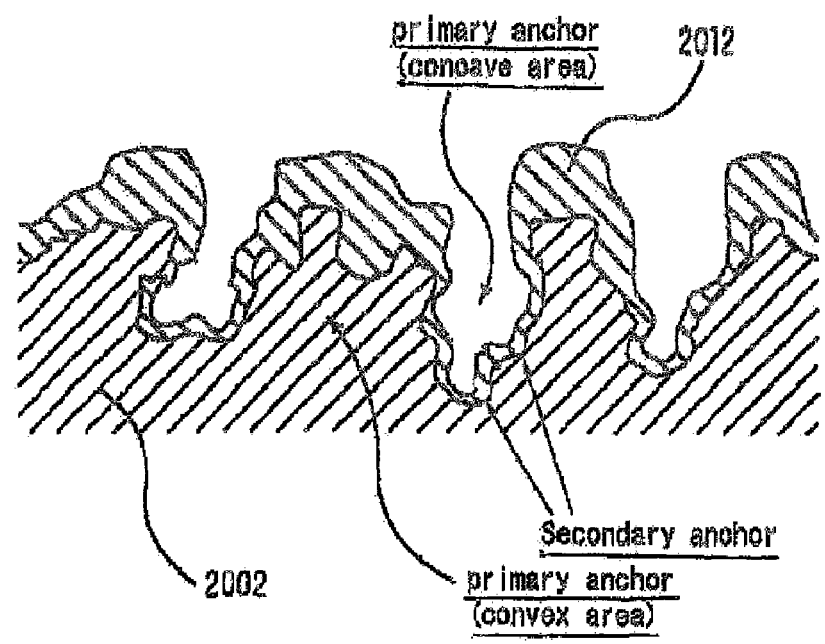
FIG. 16 is a partially exaggerated schematic sectional view showing the thickness profile of the electroless plated metal layer formed by the process according to the second group of the present invention.

The concave and convex areas mentioned above mean the concave and convex parts of the primary anchor and do not refer to the secondary anchor formed on the convex part thereof or the like (ref. FIG. 16).

The seventh invention among inventions of the second group is concerned with a printed circuit board which comprises a substrate board formed with a lower conductor circuit, an interlayer resin insulating layer thereon and an upper conductor circuit as built up with said lower conductor circuit connected to said upper conductor circuit through via holes, wherein said upper-layer conductor circuit comprises at least an electroless plated metal film, said interlayer resin insulating layer has a roughened surface, said electroless plated metal film is complementary to said roughened surface throughout and the bottom parts of said via holes are also provided with a electroless plated layer in a thickness equal to 50 to 100% of the electroless plated layer formed on said interlayer resin insulating layer.

The eighth invention among inventions of the second group is concerned with a printed circuit board comprising a resin insulating substrate board and as built thereon a conductor circuit comprising at least an electroless plated metal layer, wherein said electroless plated metal layer comprises copper and at least one metal selected from the group consisting of nickel, iron and cobalt.

In the printed circuit board according to the above eighth invention of the second group, the preferred content of said at least one metal selected from nickel, iron and cobalt is 0.1 to 0.5 weight %.

The electroless plating solution according to the first invention among inventions of the second group comprises an aqueous solution containing 0.025 to 0.25mol/L of a basic compound, 0.03 to 0.15 mol/L of a reducing agent, 0.02 to 0.06 mol/L of copper ion and 0.05 to 0.3 mol/L of tartaric acid or a salt thereof.

The electroless plating solution according to the second invention among inventions of the second group comprises an aqueous solution containing a basic compound, a reducing agent, copper ion, tartaric acid or a salt thereof and at least one ion species selected from the group consisting of nickel ion, cobalt ion and iron ion.

Since those electroless plating solutions contain tartaric acid or its salt, the amount of hydrogen uptake in the plating metal deposit is so small that a tensile stress is generated in the plated metal layer. Since its absolute value is small compared with the conventional case (when EDTA is used as a completing agent) but appropriate, the plated metal layer adheres intimately to the substrate and hardly peels off from the substrate.

Furthermore, by controlling the proportion of said basic compound within the range of 0.025 to 0.25 mol/L and that of said reducing agent within the range of 0.03 to 0.15 mol/L, the deposition rate of the plating solution can be reduced to 1 to 2 μm/hr. Therefore, when a plating metal is deposited in the openings for via holes, the copper ions are allowed to diffuse far enough down the openings for via holes so that a sufficiently thick plated metal film can be formed even within fine via holes.

Since the electroless plating solution according to the above second invention of the second group contains at least one metal ion species selected from the group consisting of nickel ion, cobalt ion and iron ion in addition to tartaric acid or a salt thereof, the evolution of hydrogen is suppressed with the result that an appropriate tensile stress is generated in the plated metal layer to insure a good adhesion to the substrate and, hence, exfoliation of the plated metal from the substrate is hard to take place.

The specific gravity of those electroless plating solutions is preferably adjusted to 1.02 to 1.10. This is because a plating metal can then be precipitated in the fine openings for via holes.

The preferred temperature of those electroless plating solutions is 25 to 40° C. If the temperature is excessively high, the deposition will be accelerated so much that the plating metal can hardly be deposited within fine openings for via holes. If the temperature is less than 25° C., it takes so much time to deposit the plated metal layer, therefor the temperature is not practical.

Furthermore, the above electroless plating solutions preferably contain 0.01 to 0.0.5 weight % of nickel ion, iron ion and/or cobalt ion.

By setting the concentration of nickel and/or other ion within the above range, the concentration of said at least one metal ion species selected from the group consisting of nickel, iron and cobalt ions can be controlled within the range of 0.1 to 0.5 weight % to thereby provide a plated metal film which is hard enough and shows good adhesion to the resin insulating layer.

Referring to the electroless plating solution according to the first invention among said inventions of the second group, said basic compound may for example be sodium hydroxide, potassium hydroxide or ammonia.

The reducing agent mentioned above includes formaldehyde, sodium hypophosphite, $NaBH_4$ and hydrazine.

The compound mentioned above as a copper ion includes copper sulfate and copper chloride.

The above-mentioned salt of tartaric acid includes the corresponding sodium salt and potassium salt and any of those salts may be the salt derived by substituting only one of the available two carboxyl groups with the above-mentioned particular metal or the salt derived by substituting both the carboxyl groups with the above-mentioned metal.

Referring to the electroless plating solution according to the above second invention of the second group, the compound for providing said nickel ion includes nickel chloride and nickel sulfate; the compound for providing said cobalt ion includes cobalt chloride; and the compound providing for said iron ion includes iron chloride.

The third invention of the second group is concerned with an electroless plating process which comprises immersing a substrate in said electroless plating solution and performing copper electroless plating at the deposition rate set to 1 to 2 μm/hr as mentioned above.

The fourth invention of the second group is concerned with a process for manufacturing a printed circuit board which comprises immersing a resin insulating substrate board in said electroless plating solution and performing copper electroless plating by the above-mentioned electroless copper plating process to provide a conductor circuit.

The resin insulating substrate board mentioned above means not only a resin insulating substrate board not formed with a conductor circuit but a resin insulating substrate board formed with a conductor circuit and, in superimposition, further with an interlayer resin insulating layer having openings for via holes.

In the above electroless plating process or in the above process for manufacturing a printed circuit board, the surface of resin insulating layer constituting said substrate and the resin insulating substrate is preferably a roughened surface.

The roughened surface mentioned above comprises concave areas and convex areas and the plating metal is deposited tracing those concave and convex areas but the thickness of the deposit is larger in the convex areas of the roughened surface than in the concave areas thereof and this thickness profile offers the following advantages.

Thus, in the process generally called the semi-additive process which comprises disposing a plating resist on an electroless plated metal layer, performing electroplating to form a thick plated metal film, stripping off said plating resist and etching the electroless plated metal layer beneath the plating resist, the etching operation is easier when the thickness of the electroless plated metal film is relatively thin in the concave areas as compared with the convex areas and the whole plated metal deposit can be easily removed by this etching without leaving unetched areas, with the result that the insulation reliability of the resulting circuit is very satisfactory.

The printed circuit board fabricated by the process for manufacturing a printed circuit board according to the fourth invention of the second group has the following characteristics.

Thus, the printed circuit board according to the fifth invention of the second group comprises a resin insulating substrate board having a roughened surface and as built thereon a conductor circuit comprising at least an electroless plated metal film, wherein said electroless plated metal film has a stress value of 0 to +10 kg/mm$^2$.

The sign of the above stress value is positive, i.e. +, which means that a tensile stress has been generated in the above-mentioned plated metal film. This stress can be measured with a spiral stress meter (manufactured by Yamamoto Plating Co., Ltd.).

Moreover, within the above stress range, the plated metal film does not undergo blistering or peeling so that the connection reliability of the conductor circuits is high.

The printed circuit board according to the sixth invention of the second group is a printed circuit board comprising a resin insulating substrate board formed with a roughened surface and as built thereon a conductor circuit comprising at least an electroless plated metal film, wherein said electroless plated metal film is complementary to said roughened surface and the thickness of said electroless plated metal film is relatively thick in the convex areas of the roughened surface compared with the concave areas thereof(that is to say, the electroless plated metal film in the concave areas is relatively thin as compared with the convex areas thereof).

Therefore, when a conductor circuit is to be formed by the semi-additive process mentioned above, the electroless plated metal film in the concave areas of said roughened surface, which is thinner than that in the convex areas, can be more readily and completely stripped off, with the result that the problem of unetched residues is obviated in the etching step and a high inter-conductor insulation dependability is assured.

The printed circuit board according to the seventh invention of the second group is concerned with a circuit board which comprises a substrate board carrying a lower conductor circuit built thereon, an interlayer resin insulating layer and an upper conductor circuit as built up with said lower conductor circuit and upper conductor circuit being interconnected by via holes, wherein said upper conductor circuit comprises at least electroless plated metal film, said interlayer resin insulating layer has a roughened surface, said electroless plated metal film is complementary to said roughened surface, and bottoms of said via holes also carry the electroless plated metal film in a thickness equal to 50 to 100% of the thickness of the electroless plated metal film on said interlayer resin insulating layer.

The above printed circuit board is fabricated using the above-described electroless plating solution and, therefore, via holes can be provided because, even when the openings for via holes are as fine as 80 µm or less in diameter, a sufficiently thick plated metal film can be formed on the hole bottoms.

The printed circuit board according to the eighth invention of the second group comprises a resin insulating substrate board and, as built thereon, a conductor circuit comprising at least an electroless plated metal film, wherein said electroless plated metal film comprises copper and at least one metal species selected from the group consisting of nickel, iron and cobalt.

Here, addition of a salt of such a metal ion inhibits the uptake of hydrogen into the plated metal to reduce the compressive stress of plating so that the resulting film may have an improved adhesion to the resin insulating layer. Furthermore, those metals form alloys with copper to increase the hardness of the plated metal film, thus contributing further to the adhesion to the resin insulating layer.

An electrodeposition layer which is high in hardness and adhesion to the resin insulating layer can be obtained when the content of said at least one metal species selected from among nickel, iron and cobalt is within the range of 0.1 to 0.5 weight %.

The technology for manufacture of printed circuit boards according to the inventions of the second group is now described, taking the semi-additive process as an example.
(1) First, a substrate board carrying an inner-layer copper pattern (lower conductor circuit) on the surface of a core board is constructed.

Formation of the conductor circuit on the core board can be achieved typically by a process which comprises etching a copper-clad laminate board according to a predetermined pattern, a process which comprises depositing an electroless plating adhesive layer on a glass-epoxy substrate board, polyimide substrate board, ceramic substrate board or metal substrate board, roughening the adhesive layer to impart a roughened surface and performing electroless plating, or a process which comprises performing electroless plating all over said roughened surface, disposing a plating resist, performing electroplating over the areas other than the plating resist areas, stripping off the plating resist and performing etching to provide a conductor circuit comprising the electroplated metal film and the electroless plated metal film (semi-additive process).

In addition, the surface of the conductor circuit of the above circuit board may be formed with a roughened surface or a roughened layer.

The roughened surf ace or roughened layer mentioned above is preferably formed by any of sanding, etching, blackening-reduction, and plating techniques.

Blackening-reduction, among the above techniques, is preferably carried out by a method using a blackening bath (oxidizing bath) comprising an aqueous solution of NaOH (20 g/l), NaClO$_2$ (50 g/l) and Na$_3$PO$_4$ (15.0 g/l) and a reducing bath comprising an aqueous solution of NaOH (2.7 g/l) and NaBH$_4$ (1.0 g/l).

The preferred procedure for forming a roughened layer by a plating technique comprises performing electroless plating using an electroless plating solution (pH=9) containing copper sulfate (1 to 40 g/l), nickel sulfate (0.1 to 6.0 g/l), citric acid (10 to 20 g/l), sodium hypophosphite (10 to 100 g/l), boric acid (10 to 40 g/l) and a surfactant (Surfinol 465, Nisshin Chemical Industries, Ltd.) (0.01 to 10 g/l) to provide a roughened layer composed of Cu—Ni—P alloy.

The crystal of the plated metal deposit formed within the above range has an acicular structure which has an excellent anchor effect. This electroless plating bath may contain a complexing agent and various additives in addition to the above compounds.

The method for providing a roughened layer by etching includes a process which comprises permitting an etching solution containing a cupric complex compound and an organic acid to act upon the surface of the conductor circuit in the presence of oxygen to thereby roughen said surface.

In this case, etching proceeds according to the chemical reactions represented by the following expression (1) and expression (2).

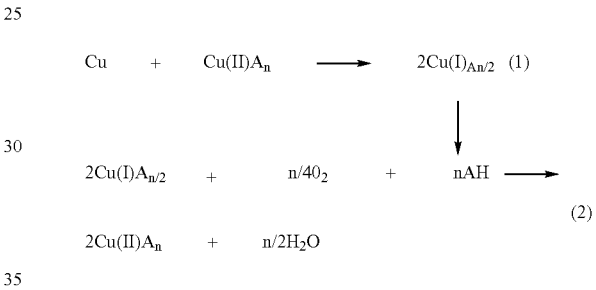

(wherein A represents a complexing agent (which functions as a chelating agent) and n represents a coordination number).

The cupric complex mentioned above is preferably a cupric azole complex. This cupric azole acts as an oxidizing agent which oxidizes metallic copper or the like. The azole may for example be a diazole, a triazole or a tetrazole. Particularly preferred species are imidazole, 2-methylimidazole, 2-ethylimidazole, 2-ethyl-4-methylimidazole, 2-phenylimidazole, 2-undecylimidazole, etc. The cupric azole complex content of said etching solution is preferably 1 to 15 weight %. Within this range, the complex is good in solubility and stability and capable of dissolving even a noble metal, such as Pd, which constitutes the catalyst nucleus.

To insure dissolution of copper oxide, an organic acid is used in association with the cupric azole complex. The organic acid includes formic acid, acetic acid, propionic acid, butyric acid, valeric acid, caproic acid, acrylic acid, crotonic acid, oxalic acid, malonic acid, succinic acid, glutaric acid, maleic acid, benzoic acid, glycolic acid, lactic acid, malic acid and sulfamic acid. Those acids may be used each independently or in a combination of two or more species The preferred organic acid content of the etching solution is 0.1 to 30 weight %. In this range, the solubility of oxidized copper and the solution stability can be sufficiently insured. As expressed by the above expression (2), the cuprous complex generated is dissolved under the influence of the acid and binds oxygen to form the cupric complex, thus contributing to the oxidation of copper again.

To assist in the dissolution of copper and the oxidizing action of the azole compound, the etching solution mentioned above may be supplemented with a halide ion, e.g. fluoride ion, chloride ion or bromide ion. The halide ion may also be supplied by adding hydrochloric acid, sodium chloride or the like. The halide ion content of the etching solution is preferably 0.01 to 20 weight %. In this range, a good adhesion can be insured between the roughened surface and the interlayer resin insulating layer.

In preparing the etching solution, said cupric azole complex and organic acid (where necessary, one having a halide ion is used) are dissolved in water. As said etching solution, a commercial etching solution, for example "Meck Etch Bond", trade mark, manufactured by Meck Co., Ltd., can be used. The etching amount, when the above etching solution is used, is preferably 0.1 to 10 μm, the optimum range being 1 to 5 μm. If the etching amount exceeds 10 μm, a connection defect occurs between the roughened surface and the via hole conductor. On the other hand, if the etching amount is less than 0.1 μm, the adhesion to the interlayer resin insulating layer to be built thereon will not be sufficiently high.

The roughened layer or roughened surface may be covered with a layer made of a metal having an ionization tendency greater than copper but not greater than titanium or a noble metal layer (hereinafter referred to as the metal layer). The metal mentioned above includes titanium, aluminum, zinc, iron, indium, thallium, cobalt, nickel, tin, lead and bismuth. The noble metal includes gold, silver, platinum and palladium. Those metal species may be used either independently or in a combination of two or more species to form a plurality of layers.

Such a metal layer covers the roughened layer and roughens the interlayer resin insulating layer to prevent local electrode reactions and thereby protect the conductor circuit against dissolution. The preferred thickness of such a metal layer is 0.1 to 2 μm.

Among the metals used to constitute said metal layer, tin is preferred. This is because tin may form a thinner layer on lectroless substituted plated layer faithfully tracing the roughened layer.

To form a metal layer composed of tin, substitution plating is carried out using a tin borofluoride-thiourea containing solution or a tin chloride-thiourea containing solution. In this case, an Sn layer about 0.1 to 2 μm thick is formed by the Cu-Sn substitution reaction. To form a metal layer composed of a noble metal, sputtering or vapor deposition can be used, for instance.

The core substrate board may be equipped with plated-through holes so that the wiring layer on the face side and the reverse side may be electrically connected through said plated-through holes.

Moreover, between the plated-through holes and conductor circuits of the core board, a low-viscosity resin such as bisphenol F epoxy resin may be filled in to insure evenness.

(2) Then, the substrate board prepared as above in (1) is coated with a organic solvent-containing resin composition for preparation of a roughened surface and the coat is dried to provide a layer of the resin composition for preparation of a roughened surface.

The resin composition for preparation of a roughened surface mentioned above is preferably a composition comprising an uncured heat-resistant resin matrix, which is hardly soluble in a roughing solution comprising at least one member selected from the group consisting of an acid, an alkali and an oxidizing agent, and, as dispersed therein, a substance soluble in said roughening solution comprising at least one member selected from the group consisting of an acid, an alkali and an oxidizing agent.

The terms "hardly soluble" and "soluble" are used here in connection with the inventions of the second group to mean that, when immersed in the same roughening solution for the same duration of time, the substance which dissolves at a relatively high dissolution rate is described as being "soluble" and the one which shows a relatively low dissolution rate is described as being "hardly soluble", for convenience's sake.

As the heat-resistant resin matrix mentioned above, a thermosetting resin or a complex resin composed of a thermosetting resin (inclusive of one in which some of the thermosetting groups have been photosensitized) and a thermoplastic resin, for instance, can be used.

The thermosetting resin mentioned above includes epoxy resin, phenolic resin, polyimide resin and thermosetting polyolefin resins. Photosensitization of the thermosetting resin, referred to above, can be achieved by (meth) acrylating the thermosetting groups of the resin with methacrylic acid or acrylic acid. The most preferred example is a (meth)acrylated epoxy resin.

The epoxy resin mentioned above includes novolac epoxy resin and alicyclic epoxy resin.

The thermoplastic resin mentioned above includes polyethersulfone, polysulfone, polyphenylenesulfone, polyphenylene sulfide, polyphenyl ether and polyetherimide.

The above-mentioned substance soluble in said roughening solution comprising at least one member selected from the group consisting of an acid, an alkali and an oxidizing agent is preferably at least one member selected from the group consisting of an inorganic powder, a resin powder, a metal powder, a rubber powder, a liquid-phase resin and a liquid-phase rubber.

The inorganic powder mentioned above includes powders of silica, alumina, calcium carbonate, talc and dolomite. Those substances can be used either independently or in a combination of two or more species.

The alumina powder mentioned above can be dissolved and removed with fluoric acid and the calcium carbonate powder can be dissolved and removed using hydrochloric acid. The sodium-containing silica and dolomite can be dissolved and removed with an aqueous alkaline solution.

The resin powder mentioned above includes amino resin (e.g. melamine resin, urea resin, guanamine resin, etc.), epoxy resin and bismaleimide-triazine resin. Those resins can be used either independently or in a combination of two or more species.

As said epoxy resin, either the resin soluble in acids and oxidizing agents or the resin hardly soluble therein can be freely prepared by selecting kind of oligomers and curing agents. For example, whereas the resin obtainable by curing bisphenol A epoxy resin with an amine series curing agent is readily soluble in chromic acid, the resin obtainable by curing cresol novolac epoxy resin with an imidazole series curing agent is hardly soluble in chromic acid.

It is essential that said resin powder be cured in advance. Unless cured ahead of time, the resin powder dissolves in the solvent for the resin matrix to give a homogeneous mixture so that the resin powder cannot be selectively dissolved off with an acid or an oxidizing agent.

The metal powder mentioned above includes powders of gold, silver, copper, tin, zinc, stainless steel and aluminum. Those metal powders can be used either independently or as a mixture of two or more species.

The rubber powder mentioned above includes acrylonitrile-butadiene rubber, polychloroprene rubber, polyisoprene rubber, acryl rubber, polysulfide-vulcanized hard rubber, fluoro rubber, urethane rubber, silicone rubber and ABS resin powders. Those rubber powders can be used either independently or in a combination of two or more species.

As the liquid resin mentioned above, a solution of said thermosetting resin in uncured state can be used. For example, a mixture of an uncured epoxy oligomer and an amine series curing agent can be mentioned.

As the liquid rubber, a solution of the above-mentioned rubbers in uncured state can be used.

In preparing said photosensitive resin composition using said liquid resin or liquid rubber, these substances should be selected to insure that said heat-resistant resin matrix and the selected soluble substance will not form a homogeneous mixture (i.e. but will form discrete phases).

By using the heat-resistant matrix resin and soluble substance selected according to the above criterion, there can be obtained a photosensitive resin composition in which many islands of said liquid resin or liquid rubber are scattered in an ocean of said heat-resistant resin or conversely islands of said heat-resistant resin matrix are scattered in an ocean of said liquid resin or liquid rubber.

After curing of such a photosensitive resin composition, the liquid resin or liquid rubber forming said ocean or said is lands, as the case maybe, is removed, whereupon the objective roughened surface is obtained.

The acid which can be used as said roughening solution includes phosphoric acid, hydrochloric acid, sulfuric acid and a variety of organic acids such as formic acid and acetic acid, among others, although an organic acid is preferably used. This is because when an organic acid is used for roughening, it does hardly corrode the metal conductor layer exposed from via holes.

As the oxidizing agent mentioned above, chromic acid or an aqueous solution of an alkali permanganate (e.g. potassium permanganate), for instance, is preferably selected.

The alkali mentioned hereinbefore is preferably an aqueous solution of sodium hydroxide or potassium hydroxide, for instance.

In the second group of the present invention, wherein said inorganic powder, metal powder or resin powder is used, the average particle diameter of the powder is preferably not greater than 10 µm.

Particularly, even if a mixed powder is not greater than 2 µm in average particle diameter, the use of the mixed powder which actually comprises a coarse powder having a relatively large average particle diameter and a fine powder having a relatively small average particle diameter will eliminate residues of undissolved electroless plated metal, reduce the amount of the palladium catalyst underneath the plating resist and, moreover, provide a shallow but complex roughened surface. By providing such a roughened surface of complexity, a practically useful peel strength can be imparted even with a shallow roughened depth profile.

The reason why a shallow but complex roughened surface can be provided by using said coarse powder and fine powder in combination is that because the average particle diameter of even the coarse powder is less than 2 µm, the anchors available upon dissolution and removal of the particles are small in depth and, at the same time, because the particle removed is actually a mixture of a coarse powder having a relatively large particle size and a fine powder having a relatively small particle size, the resulting roughened surface becomes a complex texture.

Furthermore, since the average particle diameter of even the coarse powder used is less than 2 µm, there is no risk for clearances arising from excessive roughening, so that the resulting interlayer resin insulating layer is excellent in interlayer insulation.

It is preferable that the average particle diameter of said coarse powder be over 0.8 µm but less than 2.0 µm and that of said fine powder be 0.1 to 0.8 µm.

Within the above range, the depth of said roughened surface is approximately Rmax=3 µm, and in the semi-additive process, it is not only easy to etch off the electroless plated metal deposit but also easy to remove the Pd catalyst beneath the electroless plated metal deposit and, moreover, a practically useful peel strength of 1.0 to 1.3 kg/cm can be insured.

The organic solvent content of the above resin composition for preparation of roughened surfaces is preferably not more than 10 weight %.

Coating with the resin composition for preparation of roughened surfaces can be carried out using a roll coater or a curtain coater, for instance.

(3) The resin composition layer for preparation of roughened surfaces formed in (2) above is dried to a semi-hardened state and, then, provided with openings for via holes.

In the dry state of the resin composition layer for preparation of roughened surface, the thickness of the resin composition layer on the conductor circuit pattern is small while the thickness of the plain layer having large area is large and, moreover, the interlayer resin insulating layer has been corrugated due to the non-uniformity in level of the conductor circuit area and the non-circuit area. Therefore, the surface of the interlayer resin insulating layer is preferably smoothened by pressing with a metal plate or roll under heating.

The openings for via holes are formed by a process which comprises exposing the resin composition layer for preparation of roughened surface imagewise to ultraviolet or other light and developing. For exposure and development, a photomask (preferably a glass substrate) marked with a pattern of black dots in the areas corresponding to said openings for via holes is placed with its patterned side in intimate contact with the roughened surface-forming resin composition layer and, in this state, exposure and development are carried out.

(4) Then, the roughened surface-forming resin composition layer is cured to provide an interlayer resin insulating layer, which is then roughened.

The roughening treatment comprises removing said at least one soluble substance selected from the group consisting of an inorganic powder, a resin powder, a metal powder, a rubber powder, a liquid resin and a liquid rubber, which exists on the surface of said interlayer resin insulating layer with a roughening solution such as said acid, oxidizing agent or alkali. The depth of roughening is preferably about 1~5 µm.

(5) Then, a catalyst nucleus is applied to the circuit board comprising the roughened interlayer resin insulating layer.

This application of a catalyst nucleus is preferably carried out using a noble metal ion or a noble metal colloid. Generally, palladium chloride or colloidal palladium is used. A heat treatment is preferably carried out for immobilizing the catalyst nucleus. The preferred catalyst nucleus is palladium.

(6) Then, an electroless plating metal is deposited all over the roughened surface. As the electroless plating solution, the above-described electroless plating solution according to the second group of the present invention is employed.

With regard to the plating bath formula, a preferred example is an aqueous solution containing $NiSO_4$ (0.001 to 0.003 mol/L), copper sulfate (0.02 to 0. 04mol/L), tartaric acid (0.08 to 0.15 mol/L), sodium hydroxide (0.03 to 0. 08 mol/L) and 37% formaldehyde (0.03 to 0.06 mol/L). The thickness of the electroless metal deposit is preferably 0.1 to 5 µm, more preferably 0.5 to 3 µm.

(7) Then, a photosensitive resin film (dry film) is laminated onto the electroless plated metal layer and a photomask (preferably a glass substrate) marked with a plating resist pattern is set in intimate contact with the photosensitive resin film. Thereafter, exposure and development are carried out to form a plating resist pattern.

(8) Then, the resist-free surface is electroplated to form the conductor circuit and via holes.

As the above-mentioned electroplating, copper electroplating is preferred to use and the plating thickness is preferably 1 to 20 μm.

(9) After removal of the plating resist, the electroless plated metal deposit is removed using an etching solution containing sulfuric acid-hydrogen peroxide mixture, sodium persulfate, ammonium persulfate, ferric chloride or cupric chloride to provide an isolated conductor circuit. Since the palladium catalyst nucleus is simultaneously removed by said etching, it is not particularly necessary to remove the palladium catalyst nucleus using chromic acid or the like.

(10) Then, the surface of the conductor circuit is provided with a roughened layer or roughened surface.

Formation of said roughened layer or roughened surface is carried out by the procedure described above in (1).

(11) Then, using said resin composition for preparation of roughened surface, an interlayer resin insulating layer is formed on the above substrate board in the same manner as described above.

(12) Then, the steps (3) to (10) are repeated to form an upper-layer conductor circuit and, then, planar conductor pads to serve as solder pads, via holes, etc. are formed. Finally, a solder resist layer and solder bumps are formed to complete the manufacture of a printed circuit board. While the above description pertains to the semi-additive process, the full-additive process may likewise be used.

The first invention of the third group is concerned with a process for manufacturing a multilayer printed circuit board comprising at least the following steps (1) to (5).

(1) A step for thinning the copper foil of a copper-clad Laminate by etching (2) A step for piercing through holes in said Copper-clad laminate (3) A step for forming plated-through holes in the resulting holes by plating said copper-clad laminate (4) A step for constructing a conductor circuit by pattern-etching the copper foil and plated metal layer on the surface of said copper-clad laminate (5) A step for building up an interlayer resin insulating layer and a conductor layer in an alternate fashion over said conductor circuit.

The second invention of the third group is concerned with a process for manufacturing a multilayer printed circuit board comprising at least the following steps (1) through (7).

(1) A step for thinning the copper foil of a copper-clad laminate board by etching (2) A step for piercing through holes in said copper-clad laminate board (3) A step for depositing a conductor layer on said is copper-clad laminate board (4) A step for disposing a resist over the area other than the conductor circuit-forming and the area of plated-through hole (5) A step for forming a conductor circuit and plated-through holes by plating the resist-free area (6) A step for stripping the resist off and etching the conductor film and copper foil underneath the resist (7) A step for building up an interlayer resin insulating layer and a conductor layer in an alternate fashion over said conductor circuit.

In the above process for manufacturing a multilayer printed circuit board, the step of piercing through holes in said copper-clad laminate can be carried out using a laser or a drill.

In the step of thinning the copper foil of said copper-clad laminate board by etching in the first and second inventions of the third group, the thickness of copper foil is reduced preferably to 1 to 10 μm, more preferably 2 to 7 μm.

The third invention of the third group is concerned with a multilayer printed circuit board comprising a core board having a conductor circuit and, as disposed on said conductor circuit, a buildup wiring layers obtainable by building up an interlayer resin insulating layer and a conductor layer alternately, with via holes interconnecting the conductor layers, which has technical properties that the thickness of the conductor circuit on the core board is restricted to a maximum of 10 μm over the thickness of the conductor layer on the than 7 μm.

It is also preferable that the above-mentioned interlayer resin insulating layer.

Preferably the thickness of the conductor circuit on said core board is not greater by more that said core board comprises a copper-clad laminate and that the conductor circuit on the core board comprises the copper foil of said copper laminate and a plated metal layer.

The fourth invention of the third group is concerned with a process for manufacturing a multilayer printed circuit board which comprises thinning the copper foil of a copper-clad laminate by etching, pattern-etching the copper foil of said copper-clad laminate board to form a conductor circuit, and building up an interlayer resin insulating layer and a conductor layer in an alternate fashion over said conductor circuit, wherein the thickness of the conductor circuit on said core board is restricted to a maximum of 10 μm in excess over the thickness of the conductor layer on the interlayer resin insulating layer.

In the process for manufacturing a multilayer printed circuit board according to the first invention of the third group, the thickness of the copper foil of a copper-clad laminate is reduced by etching. Then, plating is performed to form plated-through holes. In this step, a plated metal film is formed on the copper foil. The copper foil carrying this plated metal film is pattern-etched to construct a conductor circuit. Since the copper foil has been reduced in thickness in advance, the combined thickness of the copper foil and plated metal film to constitute a conductor circuit is small so that a fine-line circuit can be formed by pattern etching.

Furthermore, while interlayer resin insulating layers and conductor layers are built up in alternate succession on the copper-clad laminate forming said conductor circuit, the combined thickness of the copper foil and plated metal film forming said conductor circuit will not be small and much different from the thickness of the conductor layer on the interlayer resin insulating layer so that an impedance alignment can be obtained between said conductor circuit on core board and the conductor layer on the interlayer resin insulating layer. As a result, high-frequency characteristic of the multilayer printed circuit board can be improved.

In the process for manufacturing a multilayer printed circuit board according to said second invention of the third group, which comprises thinning the copper foil of a copper-clad laminate by etching, forming a uniform conductor film thereon, plating the resist-free area to construct a conductor circuit, stripping the resist off and etching the conductor film and copper foil under the resist, the copper foil is thinned by etching in the first place so that the combined thickness of conductor film and copper foil is reduced, contributing to the implementation of an elaborate circuit pattern.

Furthermore, while an interlayer resin insulating layer and a conductor layer are thus built up alternately on a copper-clad laminate formed with said conductor circuit, the combined thickness of the copper foil and plated metal film forming said conductor circuit has been reduced and is not much different from the conductor layer on the interlayer resin insulating layer, with the result that an impedance alignment is obtained between the conductor circuit on the core board and the conductor layer on the interlayer resin insulating layer, thus contributing an improved high-frequency characteristic of the multilayer printed circuit board.

In the above step of piercing through holes in said copper-clad laminate, when piercing through holes by means of a laser beam, for instance, to thin the copper foil by etching in advance suppresses the conduction of laser light as a thermal energy through the copper foil, so that the through holes can be easily pierced by a laser beam.

In the case of piercing through holes with a drill, through holes can also be easily pierced in the copper-clad laminate.

In the above step of thinning the copper foil of the copper-clad laminate by etching, controlling the thickness of the copper foil within the range of 1 to 10 μm leads to a reduced combined thickness of the copper foil and plated metal film constituting the conductor circuit so that an elaborate circuit can be formed by pattern etching. Moreover, since the differential in thickness between the conductor circuit on core board and the conductor layer on the interlayer resin insulating layer can be set small, the impedances of both layers can be easily aligned.

The optimum copper foil thickness is 2 to 7 μm. Generally, a resin filler is filled in between the conductor circuits formed on the surface of a core board so as to prepare a flat surface and, then, an interlayer resin insulating layer is formed thereon but, in accordance with this invention, the interlayer resin insulating layer naturally assumes a flat surface in sole dependence on the inherent levelling function of the interlayer resin insulating layer.

Furthermore, the core board may have been provided with plated-through holes In the second invention among inventions of the third group, the difference between the thickness of the plated-through hole conductor and the thickness of the conductor circuit on the interlayer resin insulating layer is so small that an impedance alignment between the two conductors can be more easily attained.

In the multilayer printed circuit board according to the third invention of the third group, the thickness of the conductor circuit on the core board is restricted to a maximum of 10 μm in excess of the thickness of the conductor layer on the interlayer resin insulating layer. Since the thickness of the former is not much different from and the conductor layer on the interlayer resin insulating layer, an impedance alignment can be easily attained between the conductor circuit on the core board and the conductor layer on the interlayer resin insulating layer, with the result that the high-frequency characteristic of the multilayer printed circuit board can be improved.

It is preferable that the thickness of the conductor circuit on the core board be not greater than the conductor layer on the interlayer resin insulator layer by more than 7 μm. If the thickness difference between the conductor circuit on the core board and the conductor layer on the interlayer resin insulating layer is too large, a heat cycle-associated stress may develop to cause cracks in the interlayer resin insulating layer.

The process for manufacturing a multilayer printed circuit board according to the fourth invention of the third group comprises thinning the copper foil of a copper-clad laminate by etching, pattern-etching the copper foil of the copper-clad laminate to provide a conductor circuit, and, over this conductor circuit, building up an interlayer resin insulating layer and a conductor layer alternately and repeatedly to provide a multilayer printed circuit board, wherein the thickness of the conductor circuit on said core board is restricted to a maximum of 10 μm over the thickness of the conductor layer on the interlayer resin insulating layer.

In accordance with this production process, detailed patterning and impedance alignment can be simultaneously accomplished.

Meanwhile, Japanese Kokai Publication Hei-2-22887 discloses a process for manufacturing a thin copper-clad substrate board by a 25 to 90% etch of copper foil but this publication does not describe, or even suggest, the manufacture of a multilayer printed circuit board having a multilayer or structure, nor does it address to a problem of an impedance alignment between the conductor circuit on a core board and a conductor layer on an interlayer resin insulating layer, which is mentioned in this invention of the third group, thus differentiating itself from this invention belonging to the third group.

The copper-clad laminate which can be used in the inventions of the third group includes various prepregs such as a glass cloth-epoxy resin prepreg, a glass cloth-bismaleimide-triazine resin prepreg, a glass cloth-fluororesin prepreg or the like., each claded with copper foil. As the copper-clad laminate board, both a two-side copper-clad laminate and a one-side copper-clad laminate can be used and a two-side copper-clad laminate is most preferred.

Adjustment of the thickness of copper foil is effected by etching. The specific technique which can be used includes chemical etching with an aqueous sulfuric acid-hydrogen peroxide solution or an aqueous solution of ammonium persulfate, cupric chloride or ferric chloride or physical etching such as ion beam etching.

In the inventions belonging to the third group, the etching rate is preferably 0.001 to 10 m/min., particularly 0.01 to 0.3 μm/min. If the etching rate is too fast, thickness control will be difficult and a variation in thickness will be large. Conversely, an excessively slow etching speed will not be practically acceptable.

The etching temperature is preferably 20 to 80° C. The etching can be effected by whichever of spraying and dipping The optimum variation in the etch-reduced thickness of copper foil is not greater than ±1.0 μm.

The thickness of said copper-clad laminate is preferably 0.5 to 1.0 mm. If the laminate is too thick, it cannot be neatly pierced, and if it is too thin, warpage tends to take place.

The laser for use in the formation of through holes in the inventions of the third group is preferably a short-pulse carbon dioxide laser with an output of 20 to 40 mJ and a pulse duration of $10^{-4}$ to $10^{-8}$ seconds. The number of shots may be 5 to 100 shots.

When plated-through holes are formed by metallizing the inner walls of through holes using an electroplating, electroless plating, sputtering or vapor deposition technique, too, a filler may be filled into the plated-through holes.

The metallized inner walls of plated-through holes may be roughened.

When the inner walls of plated-through-holes are metallized, the thickness of the copper foil and the metal layer (e.g. electroless plated metal layer) is preferably 10 to 30 μm.

As the filler, fillers comprising bisphenol F epoxy resin and inorganic particulate fillers such as silica, alumina, etc., and those comprising particulate metal and particulate resin and the like can be used.

The substrate board thus formed with plated-through holes is then provided with a conductor circuit. The conductor circuit is formed by an etching technique.

The surface of the conductor circuit is preferably roughened for improved adhesion.

Then, an interlayer resin insulating layer comprising insulating resin is constructed.

As the insulating resin which can be used for the formation of said interlayer resin insulating layer, the same resins as those mentioned for the inventions of the first group can be used.

In the inventions of the third group, the interlayer resin insulating layer may comprise an adhesive for electroless plating use. The surface of the insulating resin layer can be roughened by, for example, incorporating a powder soluble in an acid or oxidizing agent in the heat-resistant resin in advance which is hardly soluble in the acid or oxidizing agent and dissolving the powder with the acid or oxidizing agent.

The heat-resistant resin powder mentioned above includes powders of various amino resins (melamine resin, urea resin, guanamine resin, etc.), epoxy resins (the optimum resin is a bisphenol epoxy resin cured with an amine series curing agent), bismaleimide-triazine resin and other heat-resistant resins.

Where necessary, such an adhesive for electroless plating use maybe supplemented with a cured heat-resistant resin powder, an inorganic powder and/or a fibrous filler.

The heat-resistant resin powder mentioned above is preferably at least one member selected from the group consisting of (1) a heat-resistant resin powder having an average particle diameter of not more than 10 µm, (2) a flocculated particle derived from heat-resistant resin particles having an average diameter of not more than 2 µm, (3) a mixture of a heat-resistant resin powder having an average particle diameter of 2 to 10 µm and a heat-resistant resin powder having an average particle diameter of less than 2 µm, (4) a pseudo-powder comprising a heat-resistant resin powder having an average diameter of 2 to 10 µm and, as adhered to the surface thereon, at least one member selected from the group consisting of a heat-resistant resin powder or inorganic powder having an average particle diameter of not more than 2 µm, (5) a mixture of a heat-resistant resin powder having an average particle diameter of more than 0.8 µm but less than 2.0 µm and a heat-resistant resin powder having an average particle diameter of 0.1 to 0.8 µm and (6) a heat-resistant powder having an average particle diameter of 0.1 to 1.0 µm. This is because those powders are capable of providing the more complex roughened surface.

The interlayer resin insulating layer can be formed with openings by means of a laser beam or by actinic light exposure and development.

Then, a catalyst for electroless plating use, such as a Pd catalyst, is applied and the interior of the openings for via holes is plated to form the required via holes and, in addition, a conductor circuit is formed on the surface of the insulating resin layer. After an electroless plated metal film is formed on the inner walls of the openings and all over the surface of the insulating resin layer, a plating resist is disposed and electroplating is carried out, the plating resist is then stripped off and a conductor circuit is formed by etching.

The fourth group of the present invention is concerned with a technology for manufacturing a multilayer printed circuit board which comprises forming an interlayer insulating layer on a substrate board carrying a bottom-layer conductor circuit, piercing openings in said interlayer insulating layer, imparting electrical conductivity to the surface of said interlayer insulating layer and inner walls of openings, filling up the openings by electroplating to provide via holes, and then forming an upper-layer conductor circuit, wherein said electroplating is performed using a plating solution comprising an aqueous solution containing 0.1 to 1.5 mmol/L of at least one additive selected from the group consisting of a thiourea, a cyanide and a polyalkylene oxide and a metal ion species.

In the above process for manufacturing a multilayer printed circuit board, an aqueous solution containing 0.1 to 1.5 mmol/L of at least one additive selected from the group consisting of thioureas, cyanides and polyalkylene oxides and a metal ion species is used as the electroplating solution.

The above-mentioned additive for incorporation in the electroplating solution is by nature ready to be adsorbed on the surface of conductive substances such as metals. Therefore, the additive is deposited on the surface of the interlayer insulating layer and the inner walls of the openings, which have been made conductive in advance.

However, since the rate of deposition of said additive depends on the rate of diffusion, the deposition does not take place at a uniform rate but rather the additive is adhered to more readily on the conductivity-imparted surface of the interlayer insulating layer (the lands of via holes and the wiring), not adsorbing into the openings.

The deposited additive acts as a plating inhibitor to interfere with the deposition by electroplating. Therefore, the metal ion is preferentially precipitated in the openings for via holes in the course of electroplating, while the ion is harder to be deposited on the conductivity-imparted surface of the insulating layer. As a result, whereas the interiors of openings for via holes are filled up with the metal deposit, the thickness of the conductor circuit-forming metal film on the surface of the insulating layer is not increased as much. Thus, the filling of openings for via holes with the plating metal and the formation of a circuit board are concurrently achieved.

As the additive mentioned above, at least one member selected from the group consisting of thioureas, cyanides and polyalkylene oxides can be employed.

The thiourea mentioned above is preferably at least one compound selected from the group consisting of thiocarbamide (which is also known generally as thiourea) and isothiourea.

The cyanide mentioned above is preferably an alkali metal cyanide. The alkali metal cyanide includes sodium cyanide and potassium cyanide.

The preferred species of said polyalkylene oxide is polyethylene glycol.

In the invention of the fourth group, those additives can be used each independently or in a combination of two or more species.

The concentration of said additive is 0.1 to 1.5 mmol/L.

If the amount of the additive is less than 0.1 mmol/L, the additive will not be deposited on the inner walls of openings for via holes at all so that the metal ion precipitates out in excess in the interior of the openings for via holes causing an excess blister of the deposited metal from the openings, while the metal ion will not precipitate appreciably on the conductor circuit. If the amount of the additive exceeds 1.5 mmol/L, the additive will be deposited as much on the interior of openings for via holes as on the conductivity-imparted surface of the insulating layer, with the result that the openings cannot be filled up with the plating metal.

Particularly when a thiourea is used as the additive, its concentration is preferably 0.3 to 0.5 mmol/L, for in this range the openings for via holes will present with a flat smooth surface.

The metal ion species to be incorporated in the electroplating solution for use in this invention of the fourth group includes copper ion, nickel ion, cobalt ion, tin ion and gold ion.

As the copper plating solution, an aqueous solution containing copper sulfate and sulfuric acid is preferably used. The preferred nickel plating solution is an aqueous solution containing either nickel sulfate or nickel chloride and boric acid. The cobalt plating solution is preferably an aqueous solution containing either cobalt chloride or basic cobalt carbonate and hypophosphorous acid. The tin plating solution is preferably an aqueous solution of tin chloride. The gold plating solution is preferably an aqueous solution containing gold chloride or gold-potassium cyanide.

The electroplating solution mentioned above may be thickened by adding glycerin, polyethylene glycol, cellulose, chitosan or the like. Thickening results in retarded diffusion of the additive so that a definite difference can be easily established in the deposition amount of the additive between the opening for a vial hole and the surface of the insulating layer and, hence, it is easier to fill up the openings for via holes with the plating metal.

Thus, by the process for manufacturing a multilayer printed circuit board according to this invention of the fourth group, the filling of via holes and the formation of a conductor circuit can be concurrently accomplished by using at least one additive selected from the group consisting of thiourea, cyanides and polyalkylene oxides as a plating inhibitor.

As prior art, Japanese Kokai Publication Sho-57-116799 discloses a technology wherein electroplating and acid cleaning are performed in a thiourea-containing aqueous solution of sulfuric acid. Japanese Patent Publication Sho-62-8514 discloses a technology for pattern plating with a thiourea-containing copper sulfate plating solution. In addition, Japanese Kokai Publication Sho-49-3633 discloses a process for manufacturing a multilayer circuit board wherein a selective electroless plating is performed with thiourea.

However, none of those patent publications describe, or even suggest, the feasibility of achieving the concurrent filling of via holes and the formation of a conductor circuit by electroplating. Thus, those prior art methods are technically distinct from the invention of the fourth group.

The process according to this invention of the fourth group comprises constructing an interlayer insulating layer on a bottom-layer conductor circuit-carrying substrate board, piercing openings in this interlayer insulating layer, imparting electrical conductivity to the surface of said interlayer insulating layer and inner walls of said openings and finally performing electroplating.

The preferred opening for a vial hole with which the interlayer insulating layer is to be provided has an aspect ratio, i.e. the depth/diameter of the opening, of 1/3 to 1/1. If the aspect ratio is less than 1/3, the opening will be too large in diameter to fill up with the plating metal. On the other hand, if the aspect ratio exceeds 1/1, the metal ions will be hard to diffuse into the openings, resulting in a failure to fill up with the plating metal.

The diameter of openings for via holes is preferably 20 to 100 μm. This because if 100 μm is exceeded, the metal ion may not be supplied in a sufficient amount to fill the via holes. Conversely, if the diameter is less than 20 μm, the metal ion will not be able to diffuse well into the via holes, thus failing to fill the holes.

The depth of the openings for via holes is preferably 10 to 100 μm. If the depth is less than 10 μm, the interlayer insulation will be too thin. If it exceeds 100 μm, the metal ions will not easily diffuse and those may not be supplied in a sufficient amount to fill up with the plating metal.

The means for imparting electrical conductivity to the surface of said interlayer insulating layer and the inner walls of openings includes the formation of a metal layer by electroless plating, sputtering or vapor deposition.

The metal layer mentioned above is preferably comprised of at least one member selected from the group consisting of copper, nickel, tin and noble metals.

The thickness of said metal layer is preferably 0.1 to 1.0 μm. If the thickness is less than 0.1 μm, electroplating may not be successfully accomplished. If 1 μm is exceeded, there will be cases in which the deposited metal cannot be etched off to provide a discrete conductor circuit.

While said electroplating is carried out using the electroplating solution described hereinbefore, the procedure uses the conductivity imparted board as cathode and the plating metal as anode.

The plating metal as anode may be in the form of a ball or a rod, for instance.

The current density is preferably 0.5 to 3 A/dm$^2$. The rationale is that at a current density of less than 0.5 A/dm$^2$, the effect of the additive contained in the plating solution will be too weak to successfully fill the via holes. If, conversely, the current density exceeds 3 A/dm$^2$, the supply of the metal ion will not catch up with the deposition speed to cause an uneven electrodeposition, leading to the so-called "burnt plating".

The thickness of the conductor circuit after electroplating is preferably 5 to 30 μm. If the conductor circuit is less than 5 μm in thickness, the etch-off of the thin conductivity-imparting layer formed for electroplating may result in elimination of the very conductor circuit formed. In order to form a conductor circuit over 30 μm in thickness, the thickness of the plating resist must be increased, with the result that a fine conductor circuit pattern cannot be implemented.

Incidentally, after the plating of openings for via holes, intermittent electroplating (constant-voltage pulse plating) can be formed in a plating solution containing the plating metal ion using the conductor circuit-forming surface (substrate surface) as cathode and the plating metal as anode to provide a thick conductor circuit. The constant-voltage pulse plating mentioned above is outstanding in the uniformity of deposited film thickness and, therefore, makes it possible to provide conductor circuits of uniform thickness capable of impedance alignment in the final multilayer printed circuit board.

The reason why the uniformity of plating thickness can be attained by said intermittent electroplating is that at the edges of the substrate surface and in the vicinity of openings for via holes, where the amount of electrodeposition tends to be large, the metal deposit is melted by the spike current flowing momentarily toward the anode and, conversely, in the center of the substrate surface and within the openings for via holes, where the amount of electrodeposition tends to be smaller, the plating metal is caused to precipitate out by the spike current flowing momentarily toward the cathode just as in the remaining area, with the result that a highly uniform electrodeposition can be achieved.

Moreover, the reason why said intermittent electroplating results in an increased crystallinity of the plated metal film is that every interruption of voltage application causes a diffusion of the metal ion near the interface of the surface being plated to insure a constant ion concentration so that a defect of the crystal lattice hardly occurs in the electro deposited metal film.

The process for manufacturing a multilayer printed circuit board according to the invention of the fourth group is now described.
(1) As the substrate board, an insulating substrate board such as a resin substrate board or a ceramic substrate board can be used.

The resin substrate board includes an insulating board prepared by laminating prepregs made of fibrous sheets impregnated with a thermosetting resin, a thermoplastic resin or a complex resin which comprises thermosetting resin and thermoplastic resin, or one obtained by hot-pressing copper-clad laminate board prepared by laminating copper foil and such preparegs in proper registration.

As the fibrous matrix sheet, glass cloth, aramid cloth or the like can be used.

Where necessary, plated-through holes may be provided. The plated-through holes may have been filled with a filler and/or the plated-through holes may be covered by plating, i.e. the so-called cover plating.
(2) On the above substrate board, a conductor wiring is formed by a known method, then an interlayer insulating layer is constructed on the conductor circuit-carrying substrate board, and openings for via holes are formed in this interlayer insulating layer. The openings in the interlayer insulating layer can be formed by exposure and development treatment or by irradiation with laser light.

When the interlayer insulating layer of ceramic material is to be used, a ceramic green sheet is formed with openings in advance and this green sheet is laminated.

The material for the interlayer resin insulating layer includes a thermosetting resin, a thermoplastic resin, or a resin available on partial photosensitization of a thermosetting resin or a complex resin comprising such resins.

The interlayer insulating layer can be provided by coating with an uncured resin or by hot-press lamination of an uncured resin film. As an alternative, an uncured resin film in which a metal layer, such as copper foil, has been laminated on one side can be pasted. When such a resin film is used, the metal layer in the via hole-forming areas is etched off and, then, openings are formed by irradiation with laser light.

The resin film carrying a metal layer may for example be a copper foil having resin.

In forming said interlayer insulating layer, an adhesive for electroless plating can be utilized. The adhesive for electroless plating is most preferably a dispersion of a cured heat-resistant resin powder soluble in an acid or oxidizing agent in an uncured heat-resistant resin which is hardly soluble in the acid or oxidizing agent. Upon treatment with the acid or oxidizing agent, the heat-resistant resin powder is dissolving and removed to leave a roughened surface comprising anchors resembling narrow-neck pots.

As said electroless plating adhesive, particularly in regard of cured heat-resistant resin powder, the same kinds of adhesives as mentioned hereinbefore for the inventions of the first group are preferably used. This is because, with those adhesives, the more complex anchors can be produced.

The preferred depth profile of said roughened surface is Rmax=0.01 to 20 μm for insuring a good adhesion to the conductor circuit. Particularly in the semi-additive process, the range of 0.1 to 5 μm is recommended because the electroless plated metal film can then be removed without sacrificing the adhesion.

The heat-resistant resin which is hardly soluble in an acid or an oxidizing agent, mentioned above, is preferably "a complex resin comprising a thermosetting resin and a thermoplastic resin" or "a complex resin comprising a photosensitive resin and a thermoplastic resin". The former is excellent in heat resistance, while the latter enables photolithographic to form openings for via holes.

The optimum thermosetting resin is the same resin for use in the inventions of the first group.

As to the epoxy resin, the same epoxy resin as mentioned for the inventions of the first group can be used.

The thermoplastic resin mentioned above can also be the same resin as described for the inventions of the first group.

The preferred blending ratio of the thermosetting resin (photosensitive resin) to the thermoplastic resin is (thermosetting resin(photosensitive resin)/thermoplastic resin=)95/5 to 50/50. Within this range, a high degree of toughness can be expected without compromise in heat resistance.

The weight ratio of the above heat-resistant resin powder to the solid matter of said heat-resistant resin matrix is preferably 5 to 50 weight %, more preferably 10 to 40 weight %.

The heat-resistant resin powder is preferably of the same type as that mentioned for the inventions of the first group.
(3) Then, on this interlayer insulating layer (on the copper foil of the copper foil having resin, if used, as well), inclusive of the surface of openings for via holes, a metal layer is formed to obtain conductivity by electroless plating or sputtering.
(4) Further, a plating resist is disposed thereon. As the plating resist, a commercial photosensitive dry film or liquid resist can be used.

After application of the photosensitive dry film or coating with the liquid resist, exposure with ultraviolet light and development with an alkaline aqueous solution are sequentially carried out.
(5) The substrate board treated mentioned above is then immersed in said electroplating, solution and using the electroless plated metal layer as cathode and the plating metal as anode, direct-current electroplating is carried out to fill up the openings for via holes and, at the same time, form an upper-layer conductor circuit.
(6) The plating resist is then stripped off with a strongly alkaline aqueous solution and the electroless plated metal layer is etched off, whereupon said upper-layer conductor circuit and via holes are provided as a discrete pattern.

The etching solution mentioned above is an aqueous sulfuric acid/hydrogen peroxide solution, an aqueous solution of ferric chloride or cupric chloride, or an aqueous solution of ammonium or other persulfate.
(7) Thereafter, the steps (2) to (6) are repeated where necessary and finally solder resists and solder bumps are formed to complete the manufacture of a multilayer printed circuit board.

The first invention of the fifth group is concerned with a multilayer printed circuit board which comprises a buildup circuit stratum obtainable by building up interlayer resin insulating layers and conductor layers alternately, with said conductor layers being interconnected by via holes, as constructed on both sides of a core board, wherein said via holes are formed to plug the through holes in the plated-through holes of said core board.

In the above multilayer printed circuit board, the through holes in said plated-through holes are preferably not larger than 200 μm in diameter.

The second invention of the fifth group is concerned with a process for manufacturing a multilayer printed circuit board comprising at least the following steps (1) to (4).
(1) A step for piercing through holes not larger than 200 μm in diameter in a core substrate board by means of laser light.
(2) A step for plating said through holes to prepare plated-through holes.

(3) A step for forming an interlayer resin insulating layer having openings communicating with said plated-through holes on said core board.

(4) A step for plating said openings in said interlayer resin insulating layer to form via holes in the manner of filling the through holes in said plated-through holes.

In the multilayer printed circuit board according to the first invention of the fifth group and the process for manufacturing a multilayer printed circuit board according to the second invention of the fifth group, via holes are formed in the manner of filling the through holes in the plated-through holes formed in the core board and as the region immediately over the plated-through hole is thus allowed to function as an internal layer pad, the dead space is eliminated. Moreover, since there is no need for wiring the internal layer pad for the connection from the plated-through hole to the via hole, the land configuration of the plated-through hole can be true-round. As a result, the layout density of plated-through holes in the multilayer core board can be increased, and because the wires can be consolidated at the same pace between the multilayer circuit stratum formed on the face side of the core board and the multilayer circuit stratum formed on the reverse side, the number of layers can be minimized by equating the number of layers of the upper-layer multilayer circuit stratum to the number of layers of the lower-layer multilayer circuit stratum. Furthermore, since the via hole is disposed immediately over the plated-through hole, the wiring length can be decreased to increase the signal transmission speed.

Furthermore, when the through hole in the plated-through hole is not larger than 200 μm in diameter, formation of a via hole in the manner of filling the through hole does not result in any remarkable increase in the size of the via hole so that the wiring density in the interlayer resin insulating layer provided with via holes is not decreased.

In the first and second inventions of the fifth group, an adhesive for electroless plating is preferably used as said interlayer resin insulating layers The optimum electroless plating adhesive is a dispersion of a cured heat-resistant resin powder soluble in an acid or an oxidizing agent in an uncured heat-resistant resin which is hardly soluble in the acid or oxidizing agent.

Upon treatment with the acid or oxidizing agent, the heat-resistant resin powder is dissolved and removed to leave a roughened surface which comprises anchors resembling narrow-neck pots.

As said electroless plating adhesive, particularly in regard of said cured heat-resistant resin powder, the same kinds of adhesives as mentioned before for the inventions of the first group can be used. This is because, with those adhesives, the more complex anchors can be produced.

The preferred depth of said roughened surface is Rmax=0.01 to 20 μm for insuring a good adhesion to the conductor circuit. Particularly in the semi-additive process, the range of 0.1 to 5 μm is preferred because the electroless plated metal film can then be removed without sacrificing the adhesion.

The heat-resistant resin which is hardly soluble in an acid or an oxidizing agent, mentioned above, is preferably "a complex resin comprising a thermosetting resin and a thermoplastic resin" or "a complex resin comprising a photosensitive resin and a thermoplastic resin". The former is excellent in heat resistance, while the latter enables photolithographic formation of openings for via holes.

The optimum thermosetting resin is the same resin as mentioned hereinbefore for the inventions of the first group.

The thermoplastic resin can be the same resin as mentioned hereinbefore for the inventions of the first group.

The preferred blending ratio of the thermosetting resin (photosensitive resin) to the thermoplastic resin is (thermosetting resin (photosensitive resin)/thermoplastic resin)=95/5 to 50/50. Within this range, a high degree of toughness can be expected without compromise in heat resistance.

The weight ratio of the above heat-resistant resin powder to the solid matter of said heat-resistant resin matrix is preferably 5 to 50 weight %, more preferably 10 to 40 weight %.

The heat-resistant resin powder is preferably of the same type as that mentioned for the inventions of the first group.

The adhesive layer may be comprised of two layers each having a different composition.

As the solder resist layer added to the surface of the multilayer printed circuit board, a variety of resins can be used. For example, bisphenol A epoxy resin, bisphenol A epoxy resin acrylate, novolac epoxy resin, and novolac epoxy resin acrylate cured with an amine series curing agent or an imidazole series curing agent can be mentioned.

Meanwhile, because such a solder resist layer is made of a resin having a rigid skeleton, the layer tends to peel off. Such peeling of the solder resist layer can be prevented by providing a reinforcing layer.

Referring to said novolac epoxy resin acrylate, the epoxy resin obtainable by reacting a phenol novolac or cresol novolac glycidyl ether with acrylic acid or methacrylic acid, for instance, can be used.

The imidazole series curing agent mentioned above is preferably liquid at 25° C. Being a liquid, it can be uniformly blended.

The liquid imidazole series curing agent includes 1-benzyl-2-methylimidazole (product designation: IB2MZ), 1-cyanoethyl-2-ethyl-4-methylimidazole (product designation: 2E4MZ-CN), and 4-methyl-2-ethylimidazole (product designation: 2E4MZ).

The amount of addition of said imidazole series curing agent is preferably 1 to 10 weight % based on the total solid matter of said solder resist composition. This is because, within the above range, uniform blending can be effected.

As to the pre-cure composition of said solder resist, a glycol ether series solvent as a solvent is preferably used.

The solder resist layer formed from such a composition does not generate free acids so that the copper pad surface is not oxidized. Moreover, the risk for health hazards is low.

The glycol ether series solvent mentioned above is a solvent having the following chemical formula (3) and is preferably at least one member selected from the group consisting of diethylene glycol dimethyl ether (DMDG) and triethylene glycol dimethyl ether (DMTG).

$$CH_3O-(CH_2CH_2O)_n-CH_3 \; (n=1 \text{ to } 5) \qquad (3)$$

This is because those solvents can dissolve the initiator benzophenone or Michler's ketone thoroughly at an elevated temperature of about 30 to 50° C.

The glycol ether series solvent mentioned above is used preferably in a proportion of 10 to 70 wt. % based on the total weight of the solder resist composition.

The solder resist composition described above may be supplemented with various antifoams, leveling agents, thermosetting resins for improving heat resistance and alkali resistance or imparting flexibility, and/or photosensitive monomers for improving image resolution.

For example, the preferred leveling agent is an acrylic ester polymer. The preferred initiator includes Ciba-Geigey's Irgacure I907, Sand the preferred photosensitizer includes Nippon Kayaku's DETX-S.

The solder resist composition may be further supplemented with a dye or pigment. This is because the wiring pattern can be masked As such a dye, phthalocyanine blue is preferred.

The thermosetting resin mentioned above as an additive includes bisphenol epoxy resin. The bisphenol epoxy resin includes bisphenol A epoxy resin and bisphenol F epoxy resin. The former is preferred when alkali resistance is an important parameter, while the latter is preferred when viscosity reduction is required (when coatability is an important consideration).

The photosensitive monomer mentioned above as an additive component includes polyfunctional acrylic monomers. This is because such polyfunctional acrylic monomers contribute to improving image resolution. As such polyfunctional acrylic monomers, Nippon Kayaku's DPE-6A and Kyoeisha Kagaku's R-604 can be mentioned by way of example.

The viscosity of such a solder resist composition is preferably 0.5 to 10 Pa·s at 25° C., more preferably 1 to 10 Pa·s. Within this viscosity range, the composition can be easily applied with a roll coater.

The first invention among inventions of the sixth group is concerned with a multilayer printed circuit board comprising a buildup wiring layers obtainable by building up an interlayer resin insulating layer and a conductor layer alternately, with each conductor layers being interconnected by via holes, as constructed on both sides of a core board, wherein lower-layer via holes are disposed immediately over the plated-through holes formed in said core substrate, with upper-layer via holes being disposed immediately over said lower-layer via holes.

The second invention of the sixth group is concerned with a multilayer printed circuit board comprising buildup wiring statum obtainable by building up an interlayer resin insulating layer and a conductor layer alternately, with each conductor layers being interconnected by via holes, as constructed on both sides of a core board wherein said core board has plated-through holes filled up with a filler and a conductor layer covering the surface of said filler which is exposed from the plated-through holes having lower-layer via holes, with upper-layer via holes being disposed just above said lower-layer via holes.

The third invention of the sixth group is concerned with a multilayer printed circuit comprising a buildup wiring layers obtainable by building up an interlayer resin insulating layer and a conductor layer alternately., with the conductor layers being interconnected by via holes, as constructed on both sides of a core board, wherein lower-layer via holes are disposed to plug the through holes in the plated through-holes formed in said core board, with upper-layer via holes being disposed just above said lower-layer via holes.

In the above multilayer printed circuit boards, bumps are preferably located just above the plated-through holes.

Furthermore, in those multilayer printed circuit boards, the structure in which said lower-layer via holes are filled with a metal is preferred.

Moreover, when the multilayer printed circuit boards contain no metal filler, the recesses in said lower-layer via holes are preferably filled with a conductive paste or resin.

In the multilayer printed circuit board according to the first invention of the sixth group, wherein lower-layer via holes are disposed just above plated-through holes and upper-layer via holes are disposed just above said lower-layer via holes, the plated-through hole, lower-layer via hole and upper-layer via hole are lined up so that the wiring length is reduced and, hence, the signal transmissions speed is high.

The multilayer printed circuit board according to the second invention of the sixth group is characterized in that the plated-through holes in the core board are filled with a filler and the surface of the filler which is exposed from the plated-through hole is covered with a conductor layer so that the buildup circuit is connected to the plated-through holes through contact of said conductor layer with the via holes. Thus, as the region just above the plated-through hole is used to function as an internal layer pad, lower-layer via holes can be disposed immediately over the plated-through holes. Moreover, as the upper-layer via hole is disposed just over the lower-layer via hole, the plated-through hole, lower-layer via hole and upper-layer via hole are lined up so that the wiring length is reduced and the signal transmission speed is increased.

In the multilayer printed circuit board according to the first invention of the sixth group, lower-layer via holes are disposed in the manner of plugging the through holes of plated-through holes formed in the core board to connect between the lands of the plated-through holes with the via holes. Moreover, as the upper-layer via hole is disposed immediately over the lower-layer via hole, the plated-through hole, lower-layer via hole and upper-layer via hole are brought into registration, with the result that the necessary wiring length is reduced and the signal transmission speed is increased.

Furthermore, when the lower-layer via hole is disposed immediately over the plated-through hole, the upper-layer via hole can be disposed immediately over said lower-layer via hole, and the bump is disposed immediately over said plated-through hole, the plated-through hole, lower-layer via hole, upper-layer via hole and bump are arranged in perfect registry so that the wiring length is reduced and the signal transmission speed can be increased.

In the multilayer printed circuit board according to the sixth group of the present invention, an electroless plating adhesive is preferably used as the interlayer resin insulating layer. The optimum electroless plating adhesive is a dispersion of a cured, heat-resistant resin powder which is soluble in acid or oxidizing agent in an uncured, heat-resistant resin matrix which is hardly soluble in acid or oxidizing agent.

Upon treatment with an acid or an oxidizing agent, the heat-resistant resin powder is dissolved and removed to leave a roughened surface comprising anchors resembling narrow-necked pots.

Referring to the above electroless plating adhesive, the cured heat-resistant resin powder, in particular, is preferably the same powder as that mentioned for use in the inventions of the first group. Such a powder forms the more complex anchors.

The depth of the roughened surface is preferably Rmax=0.01 to 20 μm for insuring good adhesion. Particularly in the semi-additive process, the range of 0.1 to 5 μm is preferred. This is because the electroless plated metal film may be removed without adversely affecting adhesion.

The heat-resistant resin which is hardly soluble in acid or oxidizing agent mentioned above is preferably "resin complex comprising a thermosetting resin and thermoplastic resin" or a "photosensitive resin-thermoplastic resin complex". This is because the former is highly heat-resistant, while the latter has the advantage that openings for via holes can be formed by photolithography.

As said thermosetting resin, the resin mentioned for use in the inventions of the first group is preferably used.

As said thermoplastic resin, the resin mentioned for use in the inventions of the first group is preferably used.

The preferred blending ratio of thermosetting resin (photosensitive resin) to thermoplastic resin is thermosetting (photosensitive resin)/thermoplastic resin=95/5 to 50/50. Within this range, a high degree of toughness can be insured without compromise in heat resistance.

The mixing weight ratio of said heat-resistant resin powder is 5 to 50 weight %, preferably 10 to 40 weight %, based on the solid matter of the heat-resistant resin matrix.

As the heat-resistant resin powder, the resin powder mentioned for use in the inventions of the first group is preferably used.

The adhesive layer may comprise two layers of dissimilar compositions.

As the solder resist layer to be disposed on the surface of the printed circuit board, the same layer as mentioned for the inventions of the fifth group can be used.

BEST MODE FOR CARRYING OUT THE INVENTION

The following examples are intended to illustrate the present invention in further detail and should by no means be construed as defining the scope of the invention.

EXAMPLE 1

FIGS. 1(a) to (g) show an exemplary process for fabricating the conductor circuit of the printed circuit board according to the invention and FIGS. 2(a) to (e) show an exemplary process for manufacturing a multilayer printed circuit board in accordance with the invention.

In constructing the conductor circuit on a printed circuit board, an insulating substrate 1001 of glass cloth-epoxy resin or BT material was used as the insulating sheet as shown in FIG. 1(a).

Then, 35 weight parts of acrylate (25 wt. %) of cresol novolac epoxy resin (Nippon Kayaku; mol. wt. 2500), 3.15 weight parts of photosensitive monomer (Toa Gosei Co.; trade mark, Aronix M315), 0.5 weight part of antifoam (Sun Nopco, S-65), 3.6 weight parts of N-methylpyrrolidone (NMP), 12 weight parts of polyethersulfone (PES), and epoxy resin powders (Sanyo Kasei; Polymerpol; 1.0 µm of average particle diameter, 7.2 wt. Parts, and 0.5 µm of average particle diameter, 3.09 wt. parts) were mixed together, and after supply of additional 30 weight parts of NMP, the mixture was milled in a bead mill. Then, 2 weight parts of imidazole series curing agent (Shikoku Kasei; product designation 2E4MZ-CN), 2 weight parts of photopolymerization initiator (Ciba-Geigy; Irgacure I-907), 0.2 weight part of photosensitizer (Nippon Kayaku; DETX-S) and 1.5 weight parts of NMP were added and the whole mixture was stirred to give an electroless plating adhesive composition.

Using a roll coater, this electroless plating adhesive 1013 was coated on the substrate and after 20 minutes of sitting horizontally, dried at 60° C. for 30 minutes to provide an electroless plating adhesive layer 1013 in a thickness of 35 µm.

Both sides of the wiring substrate thus prepared were irradiated for exposure at 500 mJ/cm$^2$ with a ultra-high-pressure mercury arc lamp and heated at 150° C. for 5 hours.

The substrate was then immersed in chromic acid for 19 minutes to dissolve out epoxy resin particles from the surface of the adhesive layer. By this procedure, the electroless plating adhesive layer 1013 was provided with a roughened surface (FIG. 1(b)).

Under the following conditions, a thin electroless plated copper layer 1002 was constructed in a thickness of about 1 µm (FIG. 1(c)). A photosensitive dry film was then superimposed on the copper layer and a resist 1003 was formed by light exposure and development (FIG. 1(d)).

Electroless Copper Plating Solution:

| | |
|---|---|
| EDTA | 150 g/L |
| Copper sulfate | 20 g/L |
| HCHO | 30 mL/L |
| NaOH | 40 g/L |
| α,α'-Bipyridyl | 80 mg/L |
| PEG | 0.1 g/L |

Electroless Plating Conditions:

Solution temperature: at 70° C., for 30 min.

After a thick copper electro deposit layer 1004 was thus formed (FIG. 1(e)), the resist 1003 was removed by stripping with aqueous sodium hydroxide solution (FIG. 1(f)). Then, using an aqueous sulfuric acid-hydrogen peroxide solution, the thin electroless plated copper layer 1002 was etched off (FIG. 1(g)) to provide a conductor circuit 1005.

The process shown in FIGS. 2(a) to (e) is a process for establishing an electrical connection between two or more conductor layers 1006a, 1006b (2 layers in the drawing) which partly comprises piercing openings in the conductor layer 1006a by etching, forming openings for via holes 1007 within said opening between 1006a and 1006b by laser or other means (FIG. 2(c)), forming a thin electroless plated metal layer 1008 within said openings 1007 (FIG. 2(d)) and forming a thick electroplated plated metal layer 1009 (FIG. 2(e)) to provide via holes 1010.

First, a resin-copper foil laminate 1012 comprising copper foil 1006a, i.e. as a metal layer, and insulating resin 1011 was hot-pressed against the substrate sheet on which the conductor circuit 1006b had been formed (FIG. 2(a)).

Then, openings for via holes were formed by etching with an aqueous sulfuric acid-hydrogen peroxide solution and the insulating resin 1011 was removed by means of a carbon dioxide gas laser, for instance (FIG. 2(c)).

Then, electroless copper plating was carried out under the above-mentioned conditions to deposit an electroless plated copper layer 1008 within said openings for a via holes.

Thereafter, a plating resist 1003 was disposed and electroplating was carried out to form via holes 1010 and an electroplated metal layer 1009.

The outstanding feature of the process for manufacturing a printed circuit board according to the first group of the present invention is that the electroplated metal layer is formed by a constant-voltage pulse plating technique.

FIGS. 3(a) and (b) show the typical voltage and current waveforms used in the constant-voltage pulse plating processes according to the invention. For reference's sake, the voltage and current waveforms of PC plating are shown in FIGS. 8(a) and (b) and the voltage and current waveforms of PR plating are shown in FIGS. 9(a) and (b).

Those waveforms were observed with the SS-570S synchroscope manufactured by IWATSU. Sony Techtonix A6303 current probe was used as current probe, Sony Techtonix A503B as current probe amplifier, and Sony Techtonix TM502AWO as power supply.

Comparison of the voltage and current waveforms shown in FIGS. 3(a), (b), FIGS. 8(a), (b), and FIGS. 9(a), (b) reveals that whereas, despite a difference in the occurrence of dissolution of the anode due to reverse electrolysis, both the PR plating technique and the PC plating technique show generally square current waveforms, the novel constant-voltage pulse plating technique according to the first invention of the first group showed a current waveform such that a spike current flows momentarily toward the cathode on voltage application while a spike current flows momentarily toward the anode on voltage interruption.

A direct current source (Sansha Denki; DC AUTO Series) was used as power supply and the voltage application and interruption were controlled by ON-OFF of a relay using a digital timer.

Electroplated copper layers were built on 255 mm×340 mm substrate sheets by depositing substantially uniform amounts of copper by 4 different electroplating techniques, namely direct-current plating, PC plating, PR plating and constant-voltage pulse plating techniques, using a copper sulfate plating solution containing 180 g/L of sulfuric acid and 80 g/L of copper sulfate under the conditions respectively indicated below in Table 1 to prepare printed circuit boards. The thickness of the electroplated copper layer of each board was measured in the central and marginal areas of substrate and the variation in thickness of the electroplated copper layer in the central and marginal areas of each board, i.e. [(maximum thickness-minimum thickness)/average thickness], was calculated to evaluate the electrodeposition uniformity.

The results of this evaluation are presented in FIG. 4. The smaller the value is, the higher is the uniformity of electrodeposition.

TABLE 1

| | Plating time | | | |
|---|---|---|---|---|
| | Pulse condition | | Current | Plating |
| | ON | OFF (reverse) | density (A/dm$^2$) | time (sec.) |
| DC plating | −1.8 A | — | −1.2 | 52 |
| PC plating | −6.0 A(1 msec.) | 0 A(4 msec.) | 6.0 (ON) | 52 |
| PR plating | −1.2 A(50 msec.) | +3.6 A(2 msec.) | 1.2 (ON) | 57 |
| Constant-voltage pulse plating | −0.5 V(1 msec.) | 0 V(4 msec.) | — | 52 |

Power supply:
DC plating: Sansha DC AUTO 1520
PC plating: Kikusui Denshi Kogyo, Bipolar PBX20-20
PR plating: Kikusui Denshi Kogyo, Bipolar PBX20-20
Constant-voltage pulse plating: Sansha DC AUTO 1520 as DC source. OMRON solid-state relay (G3WA-D210R) was connected to the output terminal and switched ON and OFF with OMRON digital timer (H5CL).

It can be seen from the data in FIG. 4 that, of the above-mentioned four different electroplating techniques, the constant-voltage pulse plating technique provides the highest electrodeposition uniformity.

Figure 5:
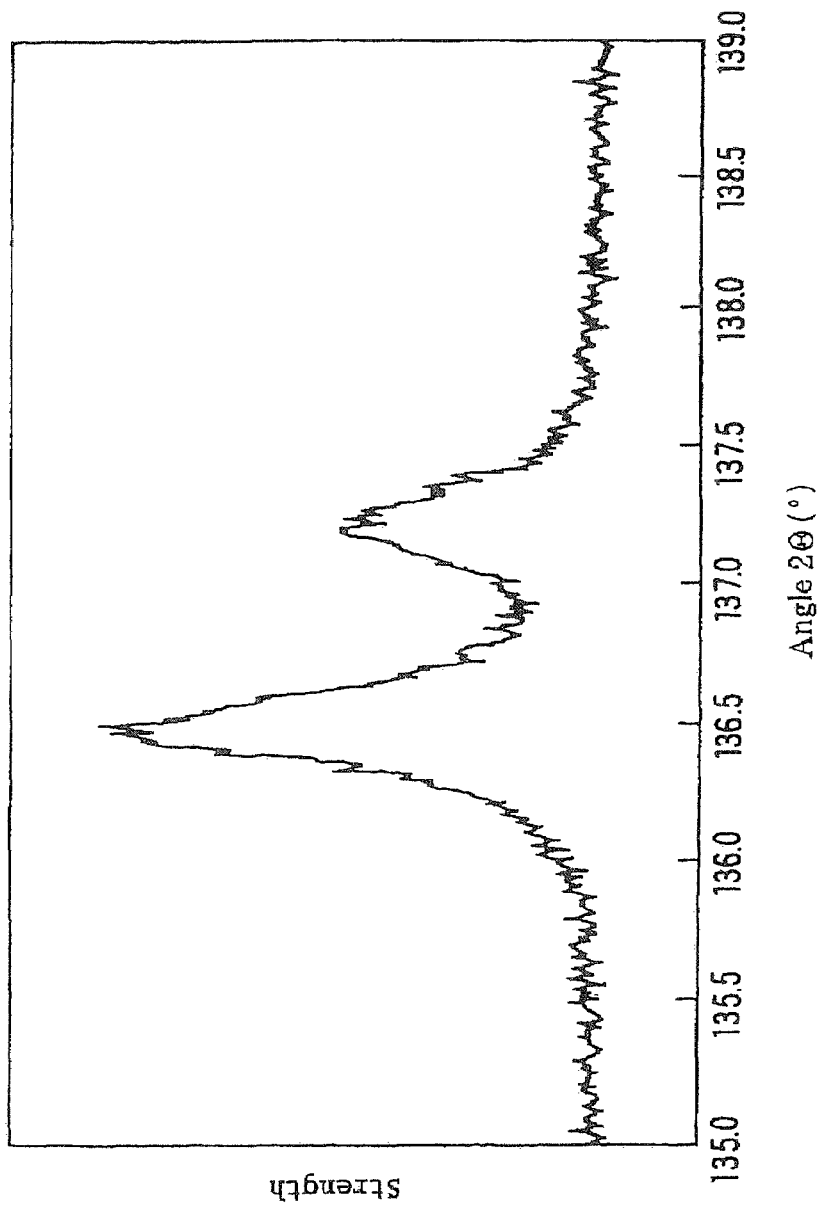
FIG. 5 is a diagram showing the result of X-ray diffraction analysis of the electroplated copper layer formed by the constant-voltage pulse plating technique.

Then, the electroplated copper layer formed on a stainless steel sheet by the constant-voltage pulse technique was not annealed but directly subjected to X-ray diffraction analysis to determine its diffraction pattern. The data are plotted in FIG. 5. The half-width value was 0.25 deg.

As controls, the electroplated copper layers formed by the DC, PC and PR plating techniques, respectively, were also subjected to X-ray diffraction analysis in the same manner as above. The diffraction patterns obtained are shown in Table 2. The respective half-width values were 0.45 deg., 0.40 deg. and 0.30 deg.

TABLE 2

| Plating process | Half-width (degrees) |
|---|---|
| DC plating | 0.45 |
| PC plating | 0.40 |
| PR plating | 0.30 |
| Constant-voltage pulse plating | 0.25 |

Comparison of the data given in Table 2 reveals that, of the above-mentioned four different electroplating techniques, the constant-voltage pulse plating technique provides the narrowest half-width and, hence, highest crystallinity.

It is, therefore, clear that a conductor circuit comprising an electroplated metal layer of remarkably high crystallinity and electrodeposition uniformity can be provided by adopting the constant-voltage pulse plating technique in the construction of the electroplated metal layer as an essential requisite in the process of the first group of invention.

The plating substrate surface area, the composition of the constant-voltage pulse plating solution and the plating conditions are not particularly restricted but the following can be mentioned as preferred typical ranges.

Plating surface size: 255~510 mm L×255~510 mm W

Plating bath composition

Cu sulfate: 50 to 80 g/L, sulfuric acid: 180 to 240 g/L, chloride ion: 40 to 50 ppm, pH<1, bath temperature: room temp.; anode-to-cathode distance: 10 to 20 cm Plating Conditions Anode: oxygen-free copper, application voltage: 0.01 to 10 V, voltage application time: $\leq$10 sec., preferably 0.5×10$^{-3}$18 5×10$^{-3}$ sec., interruption time: $\leq$10$^{-12}$ sec., preferably 1×10$^{-3}$~8×10$^{-3}$ sec., voltage time/interruption time ratio=0.01 to 100.

Furthermore, since the electroplated metal layer according to the process of this invention is of high crystallinity and features a low internal residual stress, it can be used as it is to insure highly dependable circuits and connections and the annealing for decreasing stress may be omitted.

EXAMPLE 2

The following is an example of application of this invention to the manufacture of a CMOS IC chip.

An IC wafer was fabricated by the well-known MOS wafer production technology, for example by the process described in LSI Process Engineering, pp. 22 to 23 [Published by Ohm-sha, K. K., Jun. 20, 1987] [FIG. 10(a)].

The whole surface of a substrate was subjected to Cu sputtering to provide a Cu layer 1014 in a thickness of 0.6 µm (FIG. 10(b)). Cu sputtering can be carried out using a vacuum sputtering equipment (Tokuda Seisakusho; CFS-8EP).

Then, using a spin coater, a negative photoresist (Tokyo Auka Kogyc; OMR83) was coated on the Cu layer 1014, followed by drying. Thereafter, prebaking, exposure, development and postbaking were performed in succession to provide a plating resist 1015 (4 µm thick, L/S=20/20 µm). Then, the sheet was immersed in 10% aqueous solution of sulfuric acid for surface activation and constant-voltage pulse copper electroplating was performed under the conditions described above (FIG. 10(c)).

The plating resist 1015 was removed with aqueous sodium hydroxide solution and the exposed copper film 1016 was dissolved and removed with aqueous sulfuric acid-hydrogen peroxide solution to provide a CMOS IC (FIG. 10(d)).

EXAMPLE 3

A. Preparation of a Resin Composition for Forming Roughened Surface

Mixing 34 weight parts of the resin solution dissolving 25% acrylate of a cresol novolac epoxy resin (Nippon Kayaku, mol. wt. 2500) in diethylene glycol dimethyl ether (DMDG), and, 2 weight parts of imidazole curing agent (Shikoku Kasei; 2E4MZ-CN), 4 weight parts of the photosensitive monomer caprolactone-modified tris(acryloxyethyl)isocyanurate (Toa Gosei; trade mark, Aronix M325), 2 weight parts of the photopolymerization initiator benzophenone (Kanto Chemical) 0.2 weight part of the photosensitizer Michler's ketone (Kanto chemical), 10 weight parts of photosensitive monomer (Nippon Kayaku; KAYAMER PM-21), and epoxy resin powders (Sanyo Kasei, trade mark, Polymerpole; average particle diameter 1.0 μm, 15 weight parts and average particle diameter 0.5 μm, 10 weight parts), and with addition of 30.0 weight parts of N-methylpyrrolidone (NMP), the mixture was adjusted to a viscosity of 7 Pa·s using a homodisper and further compounded with a 3-roll calender to provide a photosensitive resin composition for forming a roughened surface (for an interlayer resin insulating layer).

B. A Process for Manufacturing a Printed Circuit Board (1) A copper-clad laminate prepared by laminating a 18 μm-thick copper foil 2008 to both sides of a 0.6 mm-thick substrate 2001 comprising glass epoxy resin or BT (bismaleimide triazine) was used as a starting material (FIG. 11(*a*)). First, this copper-clad laminate was drilled, electroless plated, and pattern-etched to provide a lower-layer conductor circuit 2004 and plated-through holes 2009 on both sides of the substrate 2001.

(2) The substrate board thus formed with plated-through holes 2009 and a lower-layer conductor circuit 2004 was rinsed, dried and subjected to blackening using an aqueous solution containing NaOH (10 g/L), NaClO$_2$ (40 g/L) and Na$_3$PO$_4$ (16 g/L) as blackening bath (oxidizing bath) and a reduction treatment using an aqueous solution containing NaOH (19 g/L) and NaBH$_4$ (5 g/L) as reducing bath to provide the whole surface of the lower-layer circuit 2004 inclusive of plated-through holes 2009 with roughened surfaces 2004*a* and 2009*a* (FIG. 11(*b*)).

(3) Using a roll coater, a filler 2010 containing bisphenol F epoxy resin was coated on one side of the substrate to fill the spaces between the lower-layer conductors 2004 or in the plated-through holes 2009 and oven-dried. Then, the resin filler 2010 was similarly filled up in the spaces between the conductors 2004 on the other side or in the plated-through holes 2009 and oven-dried (FIG. 11(*c*)).

(4) One side of the substrate board which had undergone the above procedure (3) was abraded with a belt sander using #600 belt sanding paper (Sankyo Rikagaku) to thoroughly remove the resin filler 2010 from the surface of the inner-layer copper pattern 2004 and the lands of the plated-through holes 2009. Then, buffing was carried out to remove the flaws produced by the above belt-sanding. The above series of operations was repeated for the other side of the substrate board.

Then, the substrate board was heat-treated at 100° C. for 1 hour, 120° C. for 3 hours, 150° C. for 1 hour and 180° C. for 7 hours to cure the resin filler 2010.

Since the surface layer of the resin filler 2010 in plated-through holes 2009 and non-conductor circuit-forming area and the surface of the lower-layer conductor circuit 2004 were thus flattened, the resin filler 2010 was firmly bonded to the roughened lateral sides 2004*a* of the lower-layer conductor circuit 2004 and also to the roughened inner wall surfaces 2009*a* of plated-through holes 2009 to provide an insulating substrate board (FIG. 11(*d*)).

(5) The above substrate board was rinsed with water, acid-degreased, and soft-etched. Then, both sides of the substrate board are sprayed with an etching solution to etch the surface of the lower-layer conductor circuit 2004 and the land and inner wall surfaces of the plated-through holes 2009, thus forming roughened surfaces 2004*a* and 2009*a* over the whole surface of the lower-layer conductor circuit 2004 (FIG. 12(*a*)). The etching solution used was a mixture of 10 weight parts of imidazole copper (II) complex, 7 weight parts of glycolic acid, 5 weight parts of potassium chloride and 78 weight parts of deionized water.

This substrate board was further immersed in an electroless tin substitution plating bath comprising a tin borofluoride (0.1 mol/L)-thiourea (1.0 mol/L) solution at 50° C. for 1 hour to provide a 0.3 μm-thick substitution-plated tin layer on the surface of the roughened layer. This plated metal layer is not shown in the drawing.

Figure 12:
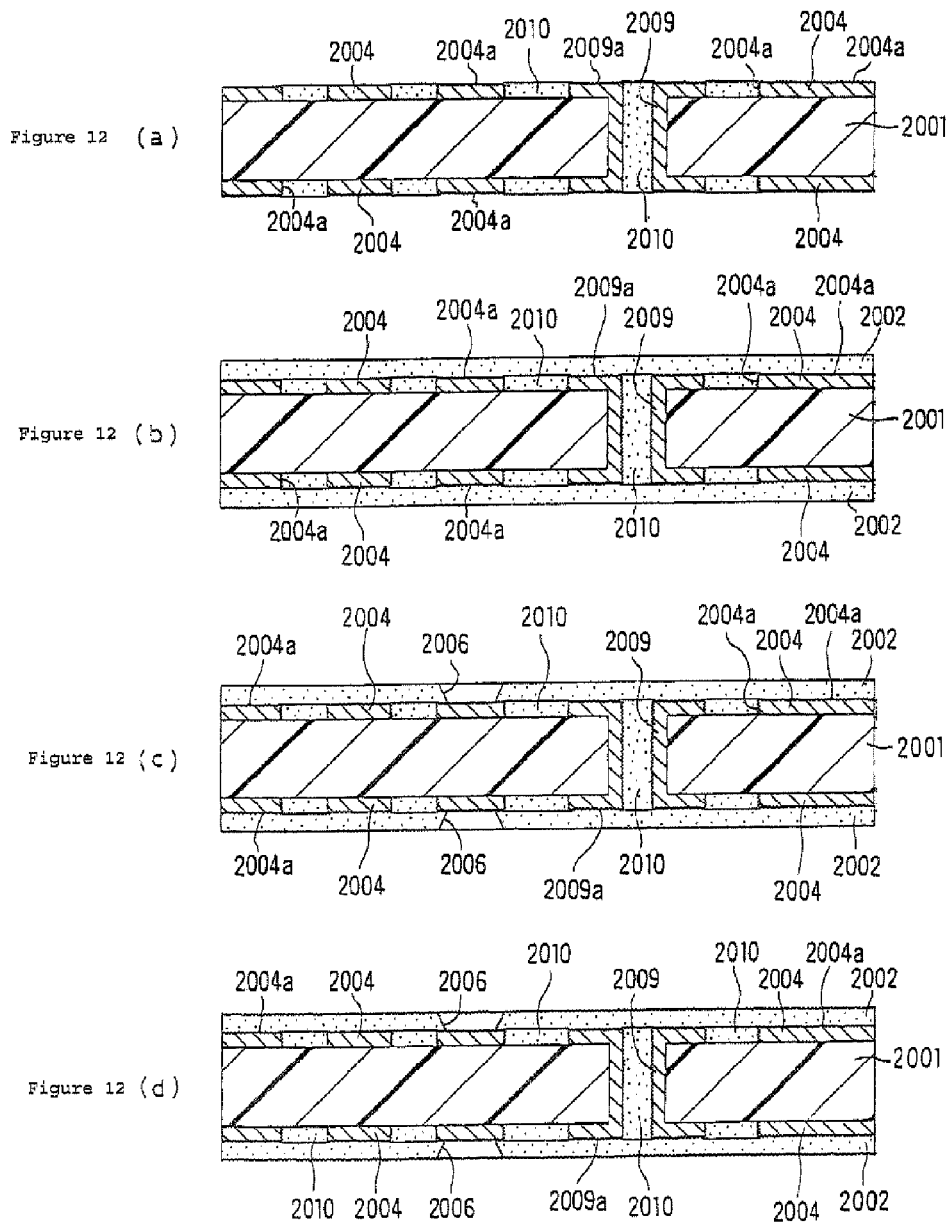
FIGS. 12(a) to (d) are sectional views showing a part of the process for manufacture of printed circuit boards according to the second group of the present invention.

(6) Using a roll coater, the resin composition for forming roughened surface prepared by the procedure described above in A was applied on both sides of the substrate board which had undergone the above treatment (5) and the coated board was allowed to sit in the horizontal position for 20 minutes and oven-dried at 60° C. for 30 minutes to provide a 60 μm-thick resin composition for forming roughened surface layer 2002 (FIG. 12(*b*)). Then, a polyethylene terephthalate film was pasted to this resin composition for forming roughened surface layer 2002 with an addhesive.

(7) A 5 mm-thick soda-lime glass substrate printed with black circular dots using light-screen ink was superimposed on both sides of the substrate board 2001 treated with the resin composition for forming roughened surface layer 2002 in (6) above, with its printed side in intimate contact with the substrate board, and exposed to light at 3000 mJ/cm$^2$ with an ultrahigh-pressure mercury arc lamp, followed by spray-development with DMDG solution to provide via hole openings 2006 having a diameter of 100 μm. Then, the substrate board was heat-treated at 100° C. for 1 hour and 150° C. for 5 hours to provide a 50 μm-thick interlayer resin insulating layer 2002 comprising via hole openings 2006 having a good dimensional tolerance comparable to that of the photomask (FIG. 12(*c*)). It should be understood that, in the openings for via holes, the roughened layer was subjected to be partially exposed.

(8) The board formed with via hole openings 2006 was immersed in a chromic acid-containing solution for 2 minutes to dissolve and removed epoxy resin particles from the surface of the interlayer resin insulating layer 2002 to roughen (to a depth of 5 μm) the surface of the interlayer resin insulating layer 2009 and, then, immersed in a neutralizing solution (Shiplay) and rinsed (FIG. 12(*d*)).

Then, a palladium catalyst (Atotech) was applied to the roughened surface of the substrate board to let the catalyst nucleus be deposited on the surface of the interlayer resin insulating layer 2002 and the inner walls of the via hole openings 2006.

Figure 13:
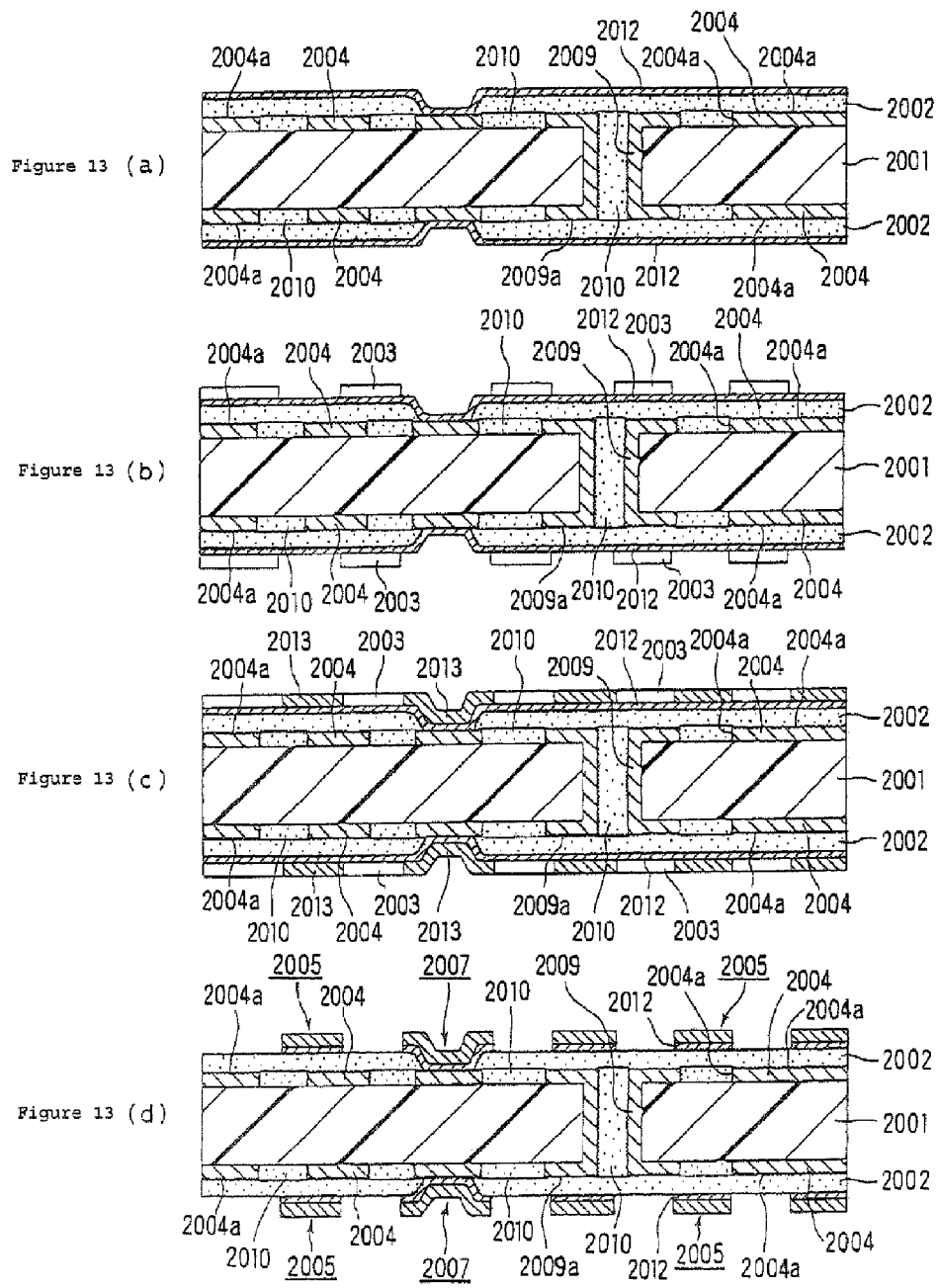
FIGS. 13(a) to (d) are sectional views showing a part of the process for manufacture of printed circuit boards according to the second group of the present invention.
Figure 14:
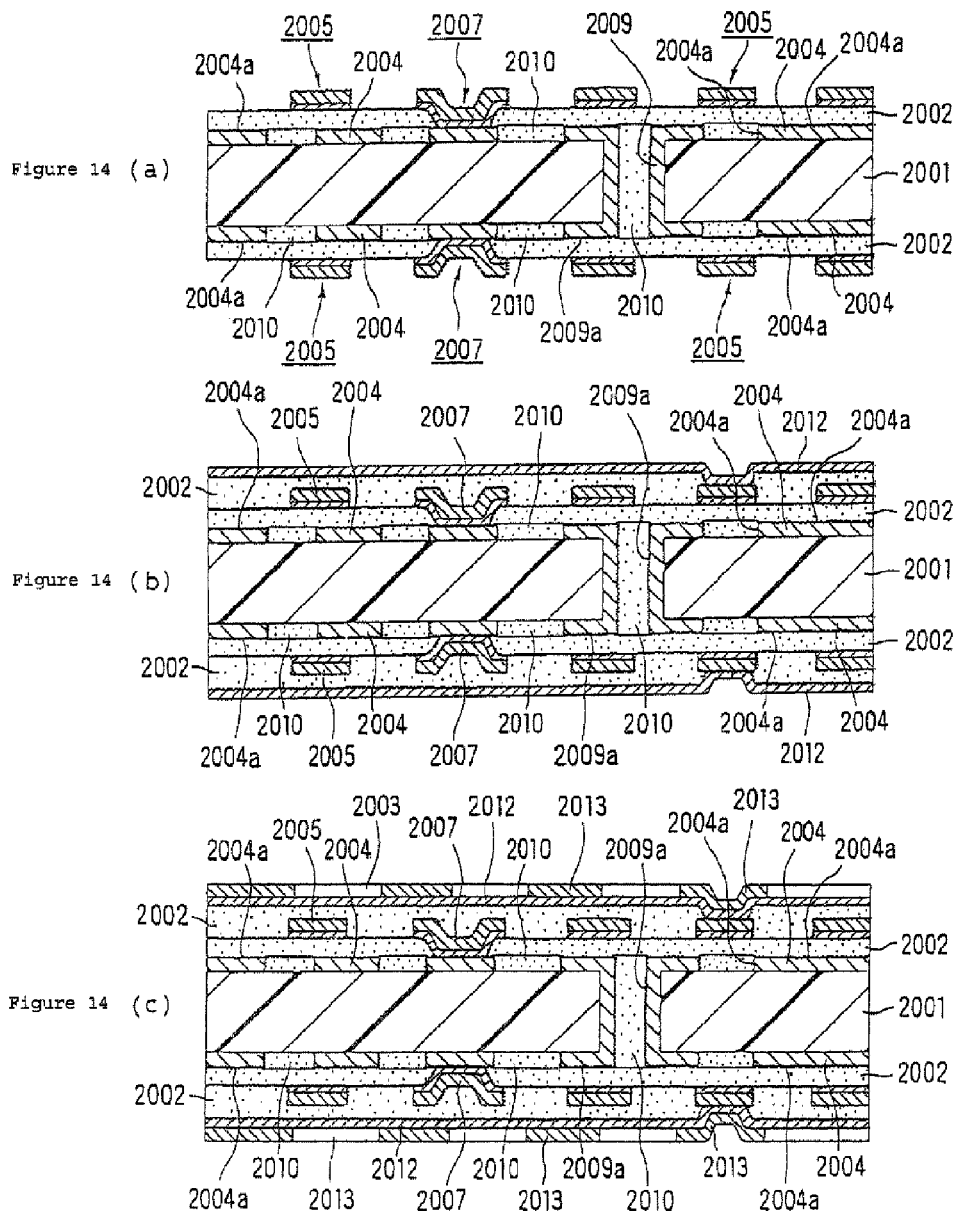
FIGS. 14(a) to (c) are sectional views showing a part of the process for manufacture of printed circuit boards according to the second group of the present invention.
Figure 15:
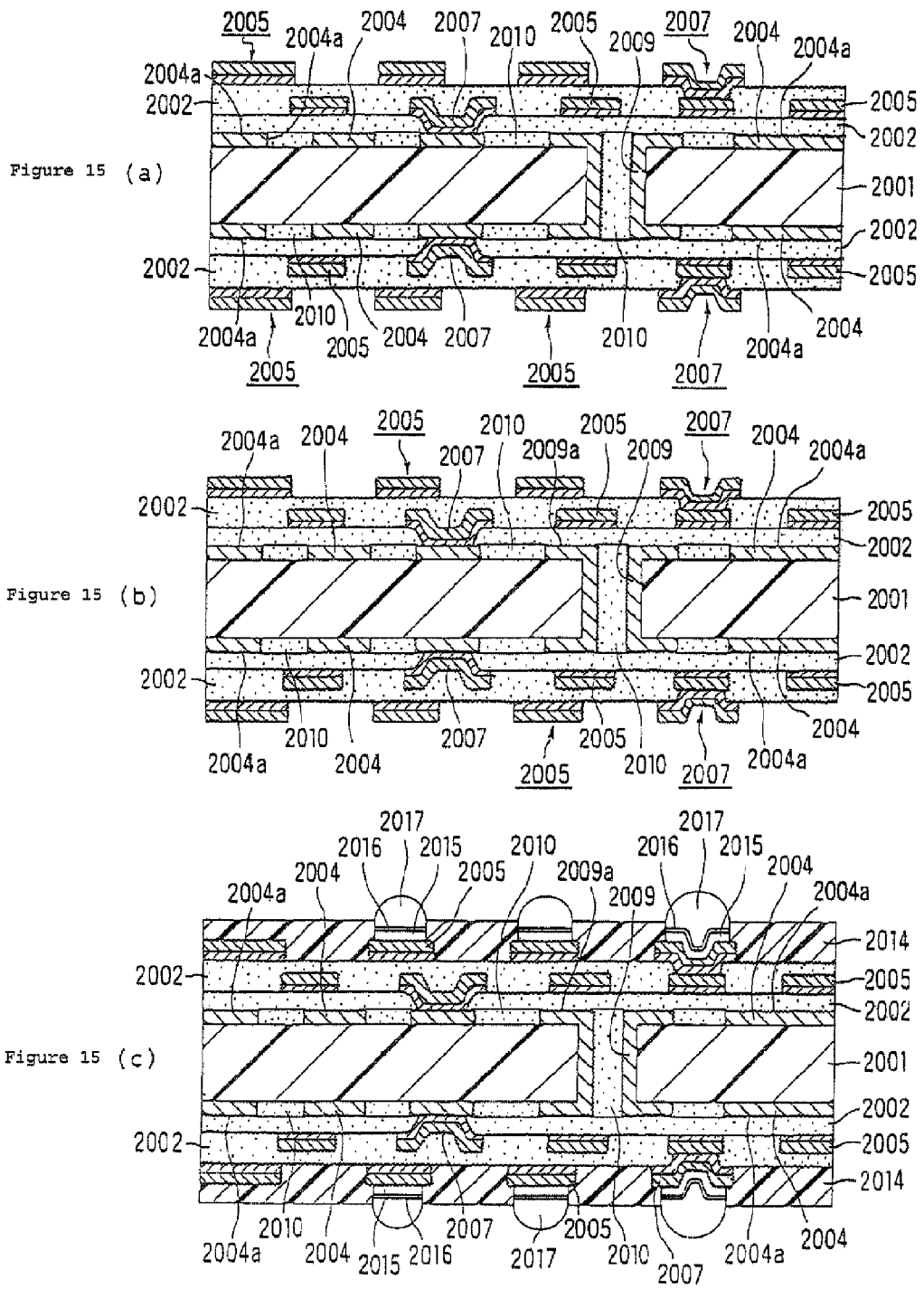
FIGS. 15(a) to (c) are sectional views showing a part of the process for manufacture of printed circuit boards according to the second group of the present invention.

(9) Then, the substrate board was immersed in an aqueous electroless copper plating solution of the following composition to provide a 3 μm-thick electroless plated copper film 2012 all over the roughened surface (FIG. 13(*a*)).

| [Aqueous electroless plating solution] | |
| --- | --- |
| NiSO$_4$ | 0.003 mol/L |
| Tartaric acid | 0.20 mol/L |
| Copper sulfate | 0.03 mol/L |
| HCHO | 0.05 mol/L |
| NaOH | 0.10 mol/L |
| α,α'-Bipyridyl | 40 mg/l |
| Polyethylene glycol (PEG) | 0.1 g/l |

[Electroless Plating Conditions]

Bath Temperature 33° C.

The board which had undergone the above process was cut longitudinally and the cross-section was examined under the microscope. FIG. 16 is a partially exaggerated schematic sectional view showing the thickness profile of the electroless plated copper film obtained.

As shown in FIG. 16, the electroless plated copper film 2012 formed in the recesses of the roughened layer of the interlayer resin insulating layer 2002 is comparatively less in thickness than the electroless plated copper film 2012 formed in the convex areas of the roughened surface. Therefore, the plated metal film in the concave areas can also be thoroughly removed in the etching stage described below.

(10) A commercial photosensitive dry film was bonded on the electroless plated copper film 2012 by hot-pressing, and a 5 mm-thick soda-lime glass substrate carrying a chromium layer in a mask pattern for non-plating resist-forming areas was placed on the photosensitive dry film with its side carrying said chromium layer in intimate contact with the film, followed by exposure at 100 mJ/cm$^2$ and development with 0.8% sodium carbonate to provide a 15 μm-thick plating resist 2003 (FIG. 13(b)).

(11) Then, copper electroplating was performed under the following conditions to provide a 15 μm-thick electroplated copper film 2013 (FIG. 13(c)).

| [Aqueous electroplating solution] | |
| --- | --- |
| Sulfuric acid | 180 g/L |
| Copper sulfate | 80 g/L |
| Additive | 1 ml/L |

(Atotech Japan, Caparacid GL)

| [Electroplating conditions] | |
| --- | --- |
| Current density | 1.2 A/dm$^2$ |
| Time | 30 min. |
| Temperature | Room temperature |

(12) After the plating resist 2003 was stripped with 5% KOH, the electroless plated film 2012 beneath the plating resist 2003 was etched off with a mixture of sulfuric acid and hydrogen peroxide to provide a 18 μm-thick conductor circuit (inclusive of via holes 2007) 2005 comprising electroless plated copper film 2012 and electroplated plated copper film 2013 (FIG. 13 (d)).

(13) The above sequence of steps (5) to (12) was repeated to further build up an interlayer resin insulating layer and a conductor circuit to provide a multilayer printed circuit board. However, no Sn substitution was performed (FIG. 14(a) to FIG. 15(b)).

(14) Then, 46.67 weight parts of a 60 wt. % DMDG solution of a photosensitized oligomer (mol. wt. 4000) obtained by acrylating 50% of the epoxy groups of cresol novolac epoxy resin (Nippon Kayaku), 6.67 weight parts of a 80 weight % solution of bisphenol A epoxy resin (Yuka Shell; trade mark, Epikote 101) in methyl ethyl ketone, 6.67 weight parts of a solution of bisphenol A epoxy resin (Yuka Shell; Epikote E-1001-B80) in the same solvent, 1.6 weight parts of imidazole series curing agent (Shikoku Kasei; product designation 2E4MZ-CN), 6 weight parts of photosensitive monomer (Nippon Kayaku; KAYAMER PM-21), 0.36 weight part of polyacrylate-type leveling agent (Kyoeisha Kagaku, trade mark, Polyflow No. 75) were taken in a vessel and stirred and mixed to prepare a mixed composition. To this mixed composition, 2.0 weight parts of the photopolymerization initiator Irgacure I-907 (Ciba-Geigey), 0.2 weight part of the photosensitizer DETX-S (Nippon Kayaku) and 0.6 weight part of DMDG were added to provide a solder resist composition adjusted to a viscosity of 1.4±0.3 Pa·s at 25° C.

Viscosity measurement was carried out using a Type B viscosimeter (Tokyo Keiki; DVL-B) using a rotor No. 4 for 60 rpm and a rotor No. 3 for 6 rpm.

(15) Then, both sides of the multilayered circuit board were coated with the above solder resist composition in a thickness of 20 μm and dried at 70° C. for 20 minutes and 70° C. for 30 minutes. Thereafter, a 5 mm-thick soda-lime glass substrate carrying a chromium layer in a mask pattern corresponding to solder resist openings was placed on the solder resist layer with its side carrying the chromium in intimate contact with the layer and UV light exposure at 1000 mJ/cm$^2$ and development with DMTS solution were carried out to provide openings having a diameter of 200 μm.

Then, the substrate board was further heat-treated at 80° C. for 1 hour, 100° C. for 1 hour, 120° C. for 1 hour and 150° C. for 3 hours to cure the solder resist to provide a 20 μm-thick solder resist layer 2014 having openings.

(16) Then, the substrate board formed with said solder resist layer 2014 was immersed in an electroless nickel plating solution (pH=5) containing nickel chloride (30 g/L), sodium hypophosphite (10 g/L) and sodium citrate (10 g/L) for 20 minutes to provide a 5 μm-thick plated nickel layer 1015 in the openings. This board was then immersed in an electroless plating solution containing potassium cyanide-gold (2 g/L), ammonium chloride (75 g/L), sodium citrate (50 g/L) and sodium hypophosphite (10 g/L) at 93° C. for 23 seconds to form a 0.03 μm-thick plated gold layer 2016 on the plated nickel layer 2015.

(17) Then, a solder paste was printed in the openings of the solder resist layer 2014 and caused to reflow at 200° C. to form solder bumps (solder masses) 2017 and, thus, provide a multilayer printed circuit board having solder bumps 2017 (FIG. 15(C)).

COMPARATIVE EXAMPLE 1

Using the following electroless plating solution, a multilayer printed circuit board was fabricated in otherwise the same manner as in Example 1.

| [Aqueous electroless plating solution] | |
| --- | --- |
| EDTA | 40 g/L |
| Copper sulfate | 10 g/L |
| HCHO | 6 ml/L |
| NaOH | 6 g/L |
| α,α'-Bipyridyl | 40 mg/L |
| Polyethylene glycol (PEG) | 10 g/L |

The printed circuit boards thus fabricated in Example 1 and Comparative Example 1 were respectively allowed to sit in an environment of 121° C. 100% R.H., and 2 atmospheres for 168 hours to see whether the power source plain conductor layer (other than the mesh pattern) would develop blistering.

As regards the residual conductor between wirings, the surface was microscopically examined after completion of step (12) and evaluated. In addition, the printed circuit board was cut along the via hole to evaluate the throwing power in the via hole region. The chromic acid removal of the resin surface layer between the conductor circuit was not performed.

The results of evaluation are shown below in Table 3.

TABLE 3

| | Incidence of blistering | Throwing power in via hole openings | Residual metal deposit between conductor wirings |
| --- | --- | --- | --- |
| Example 3 | No blisters | Good | No residue |
| Comparative Example 1 | Blisters found | Good | Residues found |

It will be apparent from Table 3 that the printed circuit board according to Example 3 shows neither blistering nor conductor residues and indicates a satisfactory throwing power.

EXAMPLE 4

Figure 23:
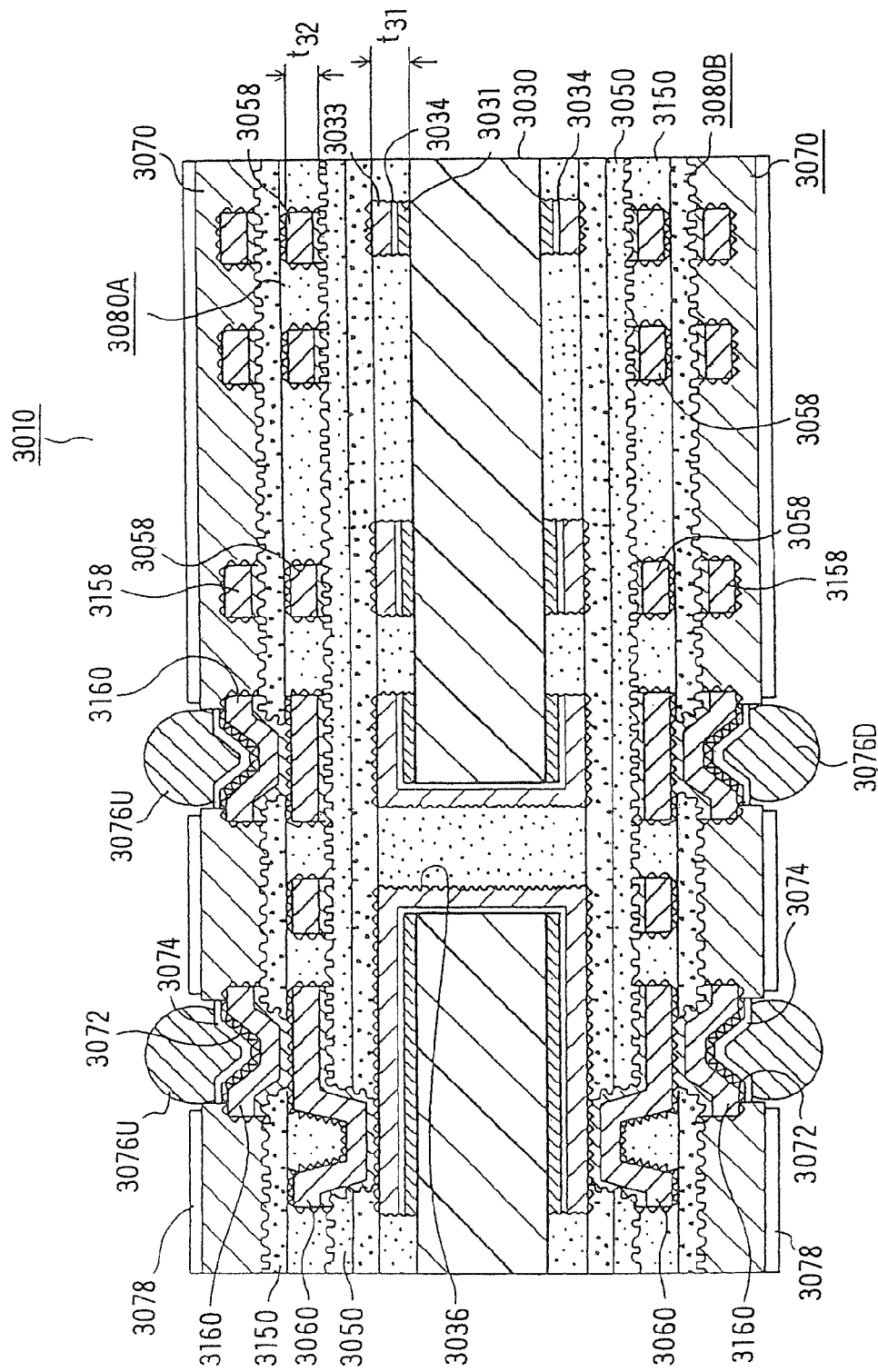
FIG. 23 is a cross-section view showing a multi-layer printed circuit board according to this invention.

The architecture of the multilayer printed circuit board 3010 according to the examples is now described with reference to FIG. 23. The multilayer printed circuit board 3010 comprises a core board 3030, conductor circuits 3034 and 3034 formed on its face and reverse sides, respectively, and buildup circuit strata 3080A and 3080B formed over said conductor circuits 3034 and 3034. The buildup strata 3080A and 3080B comprise an interlayer resin insulating layer 3050 formed with via holes 3060 and a conductor circuit 3058 and an interlayer resin insulating layer 3150 formed with via holes 3160 and a conductor circuit 3158, respectively.

Disposed on the top surface of the multilayer printed circuit board 3010 are solder bumps 3076U for connection to the lands of IC chips (not shown). Each solder bump 3076U is connected to plated-through hole 3036 through via hole 3160 and via hole 3060.

On the other hand, the underside of the printed circuit board 3010 is provided with solder bumps 3076D for connection to the lands of daughter boards (not shown). The solder bump 3076D is connected to plated-through hole 3036 through via hole 3160 and via hole 3060.

In the multilayer printed circuit board 3010 according to Example 4, the conductor circuit 3034 on the core board 3030 is formed in a thickness ($t_{31}$) of 18 μm and the conductor layers 3058 and 3158 on the interlayer resin insulating layers 3050 and 3150 are formed in a thickness ($t_{32}$) of 18 μm. Thus, the thickness of conductor circuit 3034 is virtually not different from the thickness of conductor layers 3058 and 3158, so that an impedance alignment is insured between the conductor circuit 3034 on said core board 3030 and the conductor layer 3058 or 3158 on the interlayer resin insulating layer, thus contributing to a satisfactory high-frequency characteristic.

In the following, a process for the multilayer printed circuit board 3010 is explained. First, the recipes for preparation of A. electroless plating adhesive, B. interlayer resin insulating agent, C. resin filler, and D. solder resist are explained.

A. Production of Starting Compositions for the Preparation of an Electroless Plating Adhesive (Upper-Layer Adhesive)

(1) Resin composition ① was prepared by mixing and stirring 35 weight parts of resin solution dissolving a 80 wt. % solution of 25% acrylate of cresol novolac epoxy resin (Nippon Kayaku; mol. wt. 2500) in DMDG, 3.15 weight parts of photosensitive monomer (Toa Gosei; Aronix M315), 0.5 weight part of antifoam (Sun Nopco; S-65) and 3.6 weight parts of NMP.

(2) Resin composition ② was prepared by mixing 12 weight parts of polyethersulfone (PES) with epoxy resin powders (Sanyo Kasei; Polymerpol) (7.2 weight parts of a powder having an average particle diameter of 1.0 μm, and 3.09 weight parts of a powder having an average particle diameter of 0.5 μm), adding 30 weight parts of NMP to the mixture and agitating the whole mixture to mix in a bead mill.

(3) Curing agent composition ③ was prepared by mixing and stirring 2 weight parts of imidazole series curing agent (Shikoku Kasei; 2E4MZ-CN), 2 weight parts of photopolymerization initiator (Ciba-Beigy; Irgacure I-907), 0.2 weight part of photosensitizer (Nippon Kayaku; DETX-S) and 1.5 weight parts of NMP.

B. Starting Compositions for Preparation of an Interlayer Resin Insulating Agent (Adhesive for Lower Layer)

(1) Resin composition ① was prepared by mixing and stirring 35 weight parts of resin solution dissolving a 80 wt. % solution of 25% acrylate of cresol novolac epoxy resin (Nippon Kayaku; mol. et. 2500) in DMDG, 4 weight parts of photosensitive monomer (Toa Gosei; Aronix M315), 0.5 weight part of antifoam (Sun Nopco; S-65) and 3.6 weight parts of NMP.

(2) Resin composition ② was prepared by mixing 12 weight parts of polyethersulfone (PES) with 14.49 weight parts of an epoxy resin powder having an average particle diameter of 0.5 μm (Sanyo Kasei; Folymerpole) and adding 30 weight parts of NMP to the mixture, and agitating the whole mixture to mix in a bead mill.

(3) Curing composition ③ was prepared by mixing and stirring 2 weight parts of imidazole series curing agent (Shikoku Kasei; 2E4MZ-CN), 2 weight parts of photopolymerization initiator (Ciba-Geigy; Irgacure I-907), 0.2 weight part of photosensitizer (Nippon Kayaku, DETX-S) and 1.5 weight parts of NMP.

C. Production of Starting Compositions for Preparation of a Resin Filler (1) A resin composition was prepared by mixing and stirring 100 weight parts of bisphenol F epoxy monomer (Yuka Shell; mol. wet. 310, YL983U), 170 weight parts of surface-silanated $SiO_2$ beads with an average diameter of 1.6 μm (Adomatic; CRS 1101-CE; the maximum particle size controlled below the thickness (15 μm) of the inner-layer copper pattern to be described below) and 1.5 weight parts of leveling agent (San Nopco; Levenol S4) and adjusting the viscosity of the mixture to 45,000 to 49,000 cps at 23±1° C.

(2) Imidazole series curing agent (Shikoku Kasei; 2E4MZ-CN) 6.5 weight parts.

(3) A resin filler was prepared by mixing mixtures (1) and (2).

D. Preparation of a Solder Resist Composition

A solder resist composition was prepared by mixing 46.67 g of a 60 wt. % solution of a photosensitized oligomer (mol. wt. 4000) prepared by acrylating 50% of the epoxy groups of cresol novolac epoxy resin (Nippon Kayaku) in DMDG, 15.0 g of a 80 wt. % solution of bisphenol A epoxy resin (Yuka Shell; Epikote 1001) in methyl ethyl ketone, 1.6 g of imidazole series curing agent (Shikoku Kasei; 2E4MZ-CN), 3 g of photosensitive polyfunctional acrylic monomer (Nippon Kayaku, R604), 1.5 g of photosensitive polyfunctional acrylic monomer (Kyoeisha Chemical; DPE6A) and 0.71 g of dispersion antifoam (San Nopco; S-65), followed by addition of 2 g of photopolymerization initiator benzophenone (Kanto Chemical) and 0.2 g of photosensitizer Michler's ketone (Kanto Chemical). The viscosity of the resulting mixture was adjusted to 2.0 Pa·s at 25° C.

Figure 17:
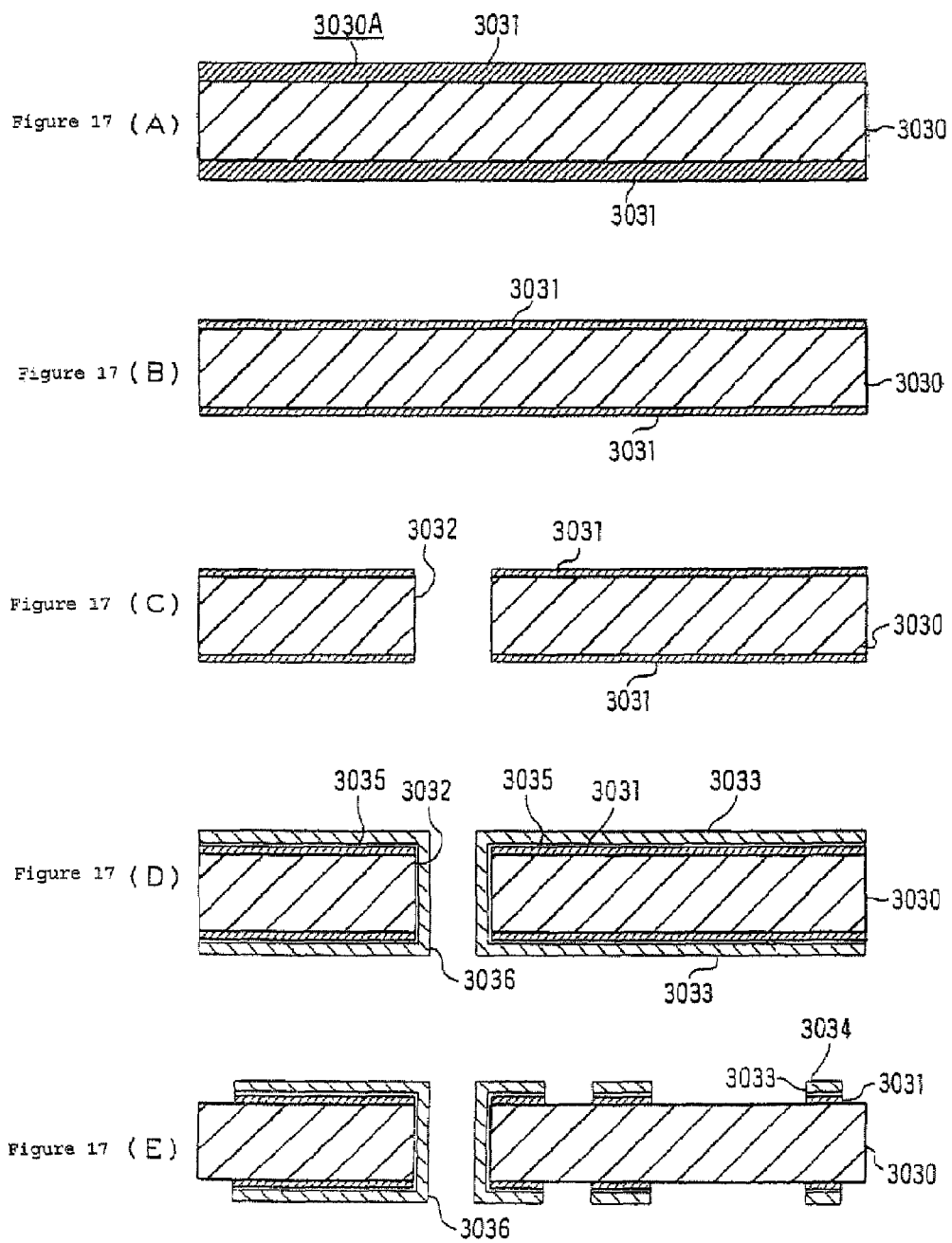
FIGS. 17(A) to (E) are sectional views showing a part of the process for manufacture of multilayer printed circuit boards according to the third group of the present invention.

The process for manufacturing a multilayer printed circuit board is described in the following (1) As the starting material, a copper-clad laminate 3030A (Mitsubishi gas, HL830) laminating a 12 μm-thick copper foil 3031 to both sides of a 0.8 mm-thick substrate 3030 having glass-epoxy resin as shown in FIG. 17(A) was used. Both sides of copper foil 3031 were adjusted to 3 μm of thickness by using etching solution (Mitsubishi gas, SE-07) (FIG. 17(B)).

(2) Through holes 3030 were pierced in the substrate 3030 by using a drill having φ=0.3 mm. (FIG. 17(C)). Then, the desmear treatment was carried out in the inner surface of the substrate 3032 by using potassium permanganate.

(3) The whole substrate board 3030 was treated with acid catalyst, then 0.1 μm of electroless plating layer 3035 was formed. Then, the copper-electroplating is carried out in the current of 1 A/dm$^2$ via said electroless plated layer 3035 to prepare the plated layer 3033 of the thickness in 15 μm (FIG. 17 (D)). As a result, plated-through holes 3036 were formed in the through holes 3032.

(4) The conductor circuit 3034 was formed by attaching the dry film resist (ASAHI chemical, Co., AQ4059: not shown) to the surface of copper-foil 3031 in the plated film 3033 to form the pattern in L/S=50/50 μm, etching with cupric chloride.

Figure 18:
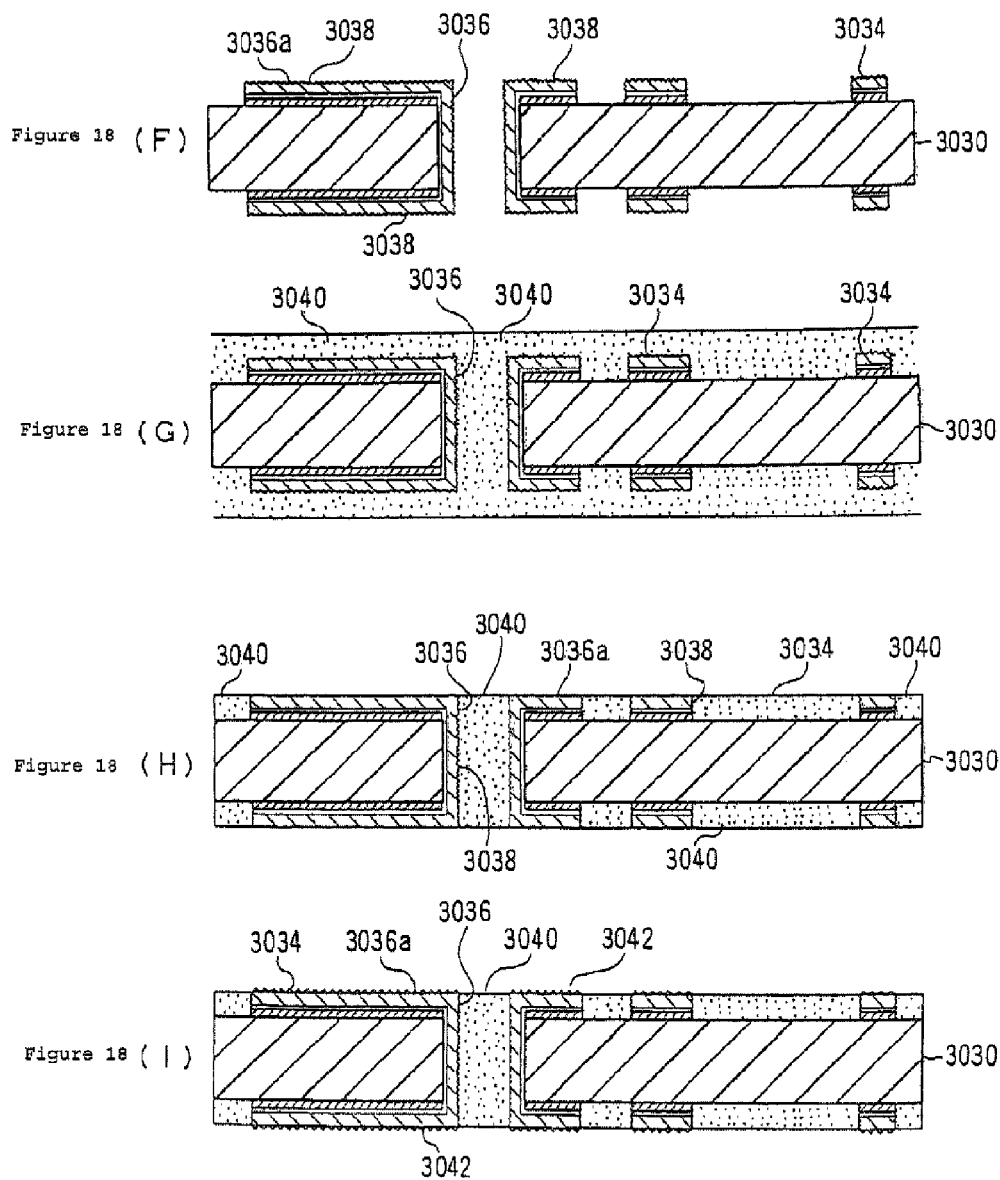
FIGS. 18(F) to (I) are sectional views showing a part of the process for manufacture of multilayer printed circuit boards according to the third group of the present invention.

Then, the roughened layers 3038 was formed in the surface of the conductor circuit (inner layer copper pattern) 3034 and the surface and lateral sides of land 3036a of plated-through holes 3036 (FIG. 18(F)). The roughened layers 3038 were formed by washing the above-mentioned substrate 3030 with water and dried, sprayed with an etching solution to both sides thereof, etching the surface of the conductor circuit 3034 and the surface and lateral sides of land 3036a of plated-through holes 3036. The etching solution used was a mixture of 10 weight parts of imidazole copper (II) complex, 7 weight parts of glycolic acid, 5 weight parts of potassium chloride and 78 weight parts of deionized water.

(5) The resin layer 3040 is formed between conductor circuits 3034 of the circuit substrate and in the plated-through holes 3036 (FIG. 18(G)). The resin filler C prepared in advance was applied to both sides of circuit substrate by roll coater to filled with the filler between conductor circuits and in the plated-through holes. The substrate was then subjected to heat treatment at 100° C. for 1 hour, 120° C. for 3 hours, 150° C. for 1 hour and 180° C. for 7 hours to cure the resin filler.

(6) One side of the substrate board 3030 which had undergone the above treatment (5) was abraded with a belt sander using a #600 belt sanding paper (Sankyo Rikagaku) to thoroughly remove any residue of resin filler 3040 from the surface of the conductor circuit 3034 and the surface of land 3036a of plated-through holes 3036 and, thereafter, buffed to get rid of flaws produced in the belt sanding operation. The above series of operations was similarly performed on the other side of the substrate board.

The circuit substrate 3030 thus obtained comprises resin layer 3040 between conductor circuits 3034 and the resin layer 3040 is formed in the plated through-holes. The surface of the conductor circuit 3034 and the surface and lateral sides of land 3036a of plated-through holes 3036 are thus removed to make both sides of the substrate board flat and smooth. The resulting circuit board features a firm bond between the resin filler 3040 and roughened surface 3038 in the lateral sides of the inner-layer conductor circuit 3034 or roughened surface 3038 lateral sides of land 3036a of plated-through holes 3036 and between the resin filler 3040 and the lateral sides of plated-through holes.

(7) A roughened layer 3042 on the surfaces of the conductor circuit 3034 having a thickness of 3 μm was formed by roughing the surfaces of the conductor circuit 3034 and the surface and lateral sides of land 3036a of plated-through holes 3036 (FIG. 18(I)).

Sn substitution plating carried out on the roughened layer 3042 to form the 0.3 μm-thick Sn layer (not shown). Said substitution plating was Cu—Sn substitution plating carried out by using 0.1 mol/L of tin borofluoride and 1.0 mol/L of thiourea at 50° C. and pH=1.2.

Figure 19:
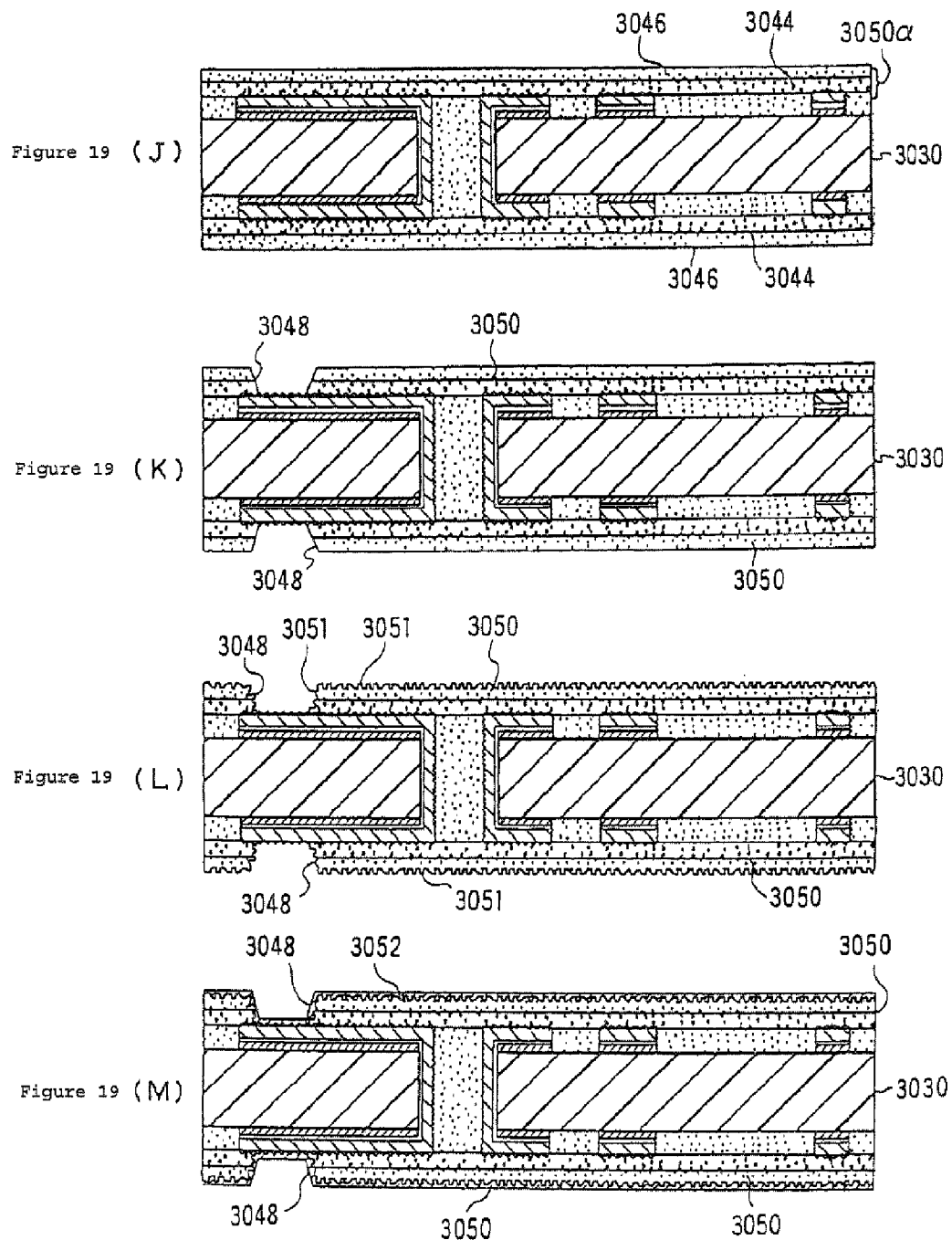
FIGS. 19(J) to (M) are sectional views showing a part of the process for manufacture of multilayer printed circuit boards according to the third group of the present invention.

(8) Using a roll coater, the interlayer resin insulating layer (for the lower layer) 3044 with a viscosity of 1.5 Pa·s as obtained in (9) above was coated on both sides of the substrate 3030 obtained above within 24 hours of preparation and the substrate board was allowed to sit in the horizontal position for 20 minutes and dried at 60° C. for 30 minutes (prebake) Then, the photosensitive adhesive solution (for the upper layer) 3046 with a viscosity adjusted to 7 Pa·s as prepared in A mentioned above was coated within 24 hours of preparation and the substrate board was allowed to sit in the horizontal position for 20 minutes and, then, dried (prebaked) at 60° C. for 30 minutes to provide a 35 μm-thick adhesive layer 3050α (FIG. 19 (J)

(9) A photomask film (not shown) printed with black dots having φ=85 μm r(not shown) was superimposed on both sides of the substrate board 3030 formed with an adhesive layer in (8) above and exposed to light at 50 mJ/cm$^2$ using an ultrahigh-pressure mercury arc lamp. After spray-development with DMTG solution, the substrate 3030 was further exposed to light at 3000 mJ/cm$^2$ with the ultrahigh-pressure mercury arc lamp and heat-treated (postbaked) at 100° C. for 1 hour, at 120° C. for 1 hour and further at 150° C. for 3 hours, whereby a 35 μm-thick interlayer resin insulating layer (binary structure) 3050 having 85 μm φ openings (openings for via holes) 3048 with a good dimensional tolerance corresponding to that of the photomask film (FIG. 19(K)) was obtained. In the openings 3048 for via holes, the plated tin layer (not shown) was caused to be partially exposed.

(10) The substrate board 3030 was immersed in chromic acid for 1 minutes to dissolve and removed the epoxy resin particles from the surface of the adhesive layer 3050 to roughen the surface of said adhesive layer 3050 (FIG. 19(L)), then immersed in a neutralizing solution (Shipley) and rinsed with water.

Then, a palladium catalyst (Atotech) was applied to the surface of the substrate board 3030 which had been subjected to surface roughening in the above step to deposit the catalyst nucleus on the roughened layer of the surface of the electroless-plating layer 3044 and the openings for via holes 3048.

(11) The board 3030 was immersed in an aqueous electroless copper plating solution of the following formulation to provide a 1.6 μm-thick electroless plated copper film 3052 all over the surface (FIG. 19(M)).

| [Aqueous electroless plating solution] | |
|---|---|
| EDTA | 150 g/L |
| Copper sulfate | 820 g/L |
| HCHO | 30 ml/L |
| NaOH | 40 g/L |
| α,α'-Bipyridyl | 80 mg/L |
| PEG | 0.1 g/L |

[Electroless Plating Conditions]
Bath temperature 70° C., for 30 min.

(12) A commercial photosensitive dry film (not shown) was pasted on the electroless plated copper film 3052 and a mask (not shown) was placed in position. Then, the exposure at 100 mJ/cm$^2$ and development with 0.8% sodium carbonate were carried out to provide a 15 μm-thick plating photoresist 3054 (FIG. 20(N)).

Figure 20:
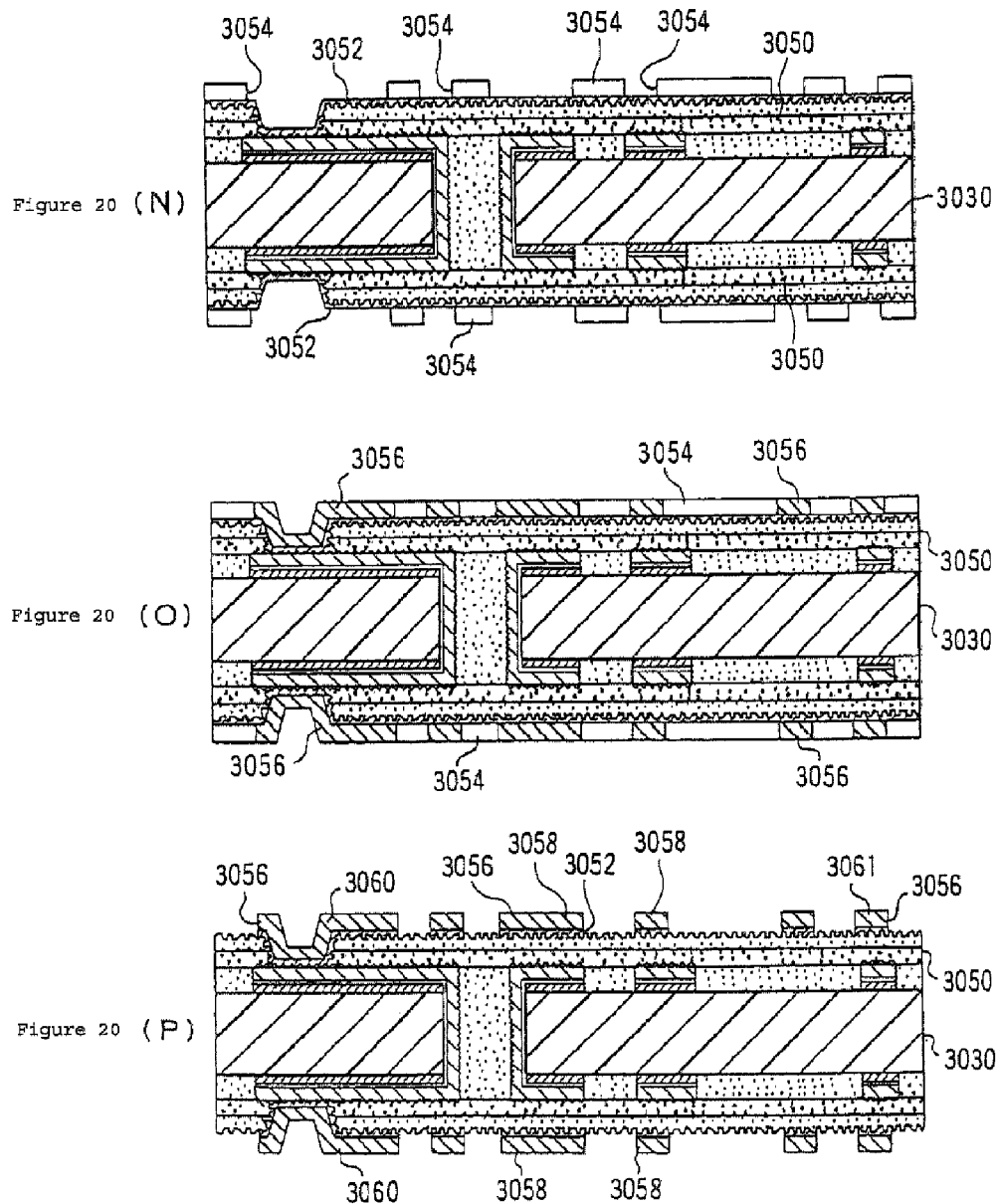
FIGS. 20(N) to (P) are sectional views showing a part of the process for manufacture of multilayer printed circuit boards according to the third group of the present invention.

(13) Then, the resist-free area was copper-electroplated under the following conditions to construct a 15 μm-thick copper layer 3056 (FIG. 20 (O)).

| [Aqueous electroplating solution] | |
|---|---|
| Sulfuric acid | 180 g/L |
| Copper sulfate | 80 g/L |
| Additive (Atotech Japan; Kaparacid GL) | 1 ml/L |

| [Electroplating conditions] | |
|---|---|
| Current density | 1 A/dm$^2$ |
| Time | 30 min. |
| Temperature | Room temp. |

(14) After the plating resist 3054 was stripped off with 5% KOH, the electroless plated metal film 3052 underneath the plating resist was dissolved and removed by etching with an etching solution comprising a mixture of sulfuric acid and hydrogen peroxide to provide an 18 μm (10 to 30μm)-thick conductor circuit 3058 and via holes 3060 comprising electroless plated copper film 3052 and electroplated copper film 3056 (FIG. 20(P)).

Figure 21:
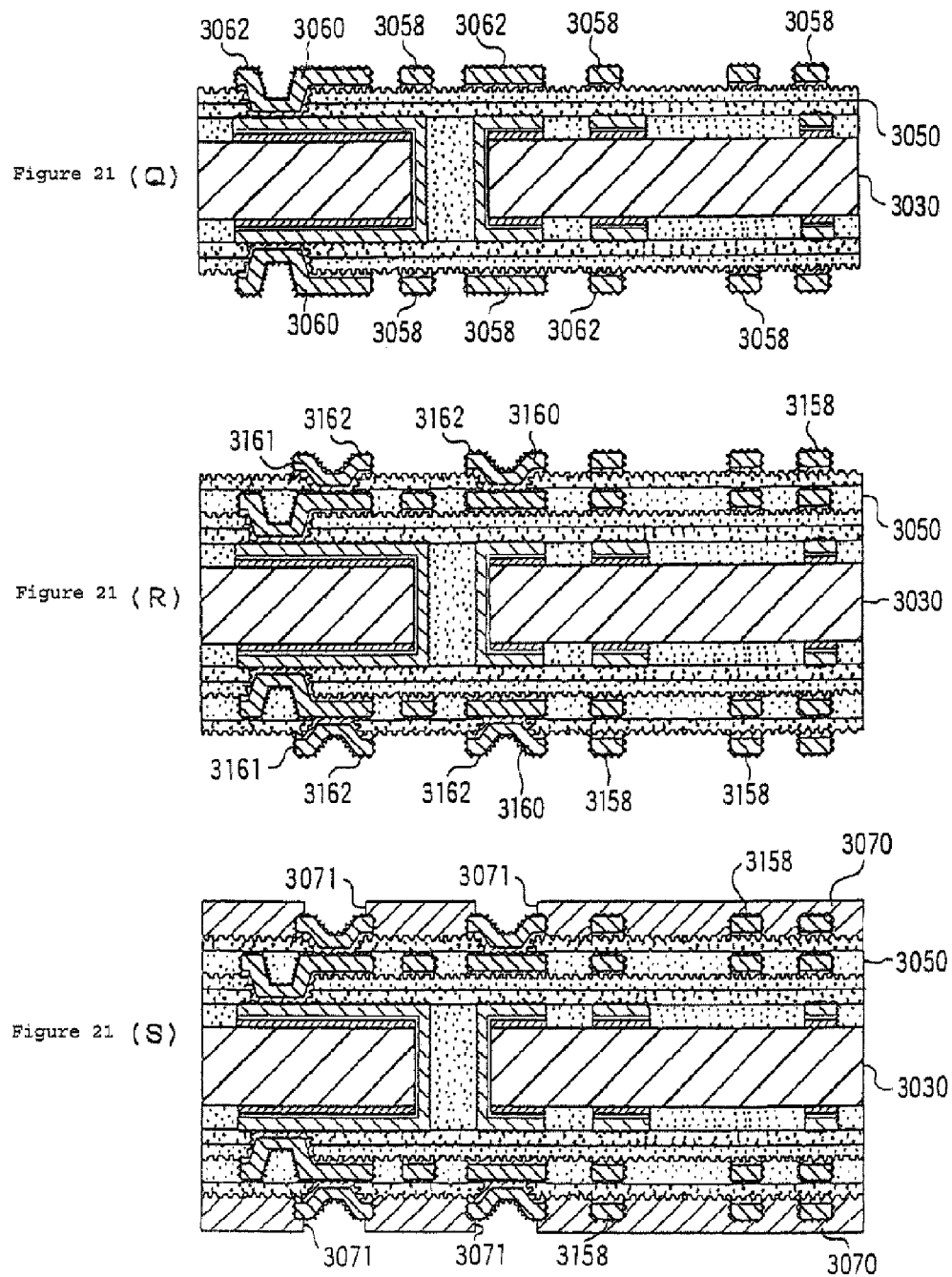
FIGS. 21(Q) to (S) are sectional views showing a part of the process for manufacture of multilayer printed circuit boards according to the third group of the present invention.

(15) Following the same procedure as described in (7), a roughened surface 3062 comprised of Cu—Ni—P alloy was formed on the surfaces of conductor circuit 3058 and via holes 3060 and a Sn substitution on the surface was carried out (FIG. 21 (Q)).

(16) The sequence of steps (8) to (14) was repeated to provide an additional upper-layer interlayer resin insulating layer 3160, via holes 3160 and conductor circuit 3158. Furthermore, the surface of the via holes 3160 and conductor circuit 3158 were provided with roughened layer 3162 to complete a multilayer buildup circuit board (FIG. 21(R)). In this process for formation of said additional upper-layer conductor circuit, no Sn substitution was carried out.

(17) Then, this multilayer buildup circuit board was provided with solder bumps. The solder resist composition described under D. was coated in a thickness of 45 μm on both sides of the substrate board 3030 obtained in (16) above. After the substrate board was dried at 70° C. for 20 minutes and further at 70° C. for 30 minutes, a 5 mm-thick photomask film (not shown) carrying a pattern of dots (mask pattern) was placed in intimate contact and exposure with ultraviolet light at 1000 mJ/cm$^2$ and development with DMTG were carried out. Then, the substrate board was further heat-treated at 80° C. for 1 hour, at 100° C. for 1 hour, at 120° C. for 1 hour and at 150° C. for 3 hours to provide a solder resist layer 3070 (thickness: 20 μm) having openings 3071 (opening dia. 200 μm) in the solder pad areas (inclusive of via holes and their lands) (FIG. 21(S)).

(18) Then, this substrate 3030 was immersed in an electroless nickel plating solution (pH=4.5) containing $2.31 \times 10^{-1}$ mol/L of nickel chloride, $2.8 \times 10^{-1}$ mol/L of sodium hypophosphite and $1.85 \times 10^{-1}$ mol/L of sodium citrate for 20 minutes to provide a 5 μm-thick plated nickel layer 3072 in the openings 3071. Furthermore, this board was immersed in an electroless gold plating solution containing $4.1 \times 10^{-2}$ mol/L of potassium cyanide-gold, $1.87 \times 10^{-1}$ mol/L of ammonium chloride, $1.16 \times 10^{-1}$ mol/L of sodium citrate and $1.7 \times 10^{-1}$ mol/L of sodium hypophosphite at 80% for 7 minutes and 20 seconds to provide a 0.03 μm plated gold layer 3074 on the plated nickel layer, whereby the via holes 3160 and conductor circuit 3158 were provided with solder pads 3075 (FIG. 22(T)).

(19) Then, the openings 3071 of the solder resist layer 3070 were printed with a solder paste followed by reflowing at 200° C. to provide solder bumps (solder masses) 3076U, 3076D and thereby provide a multilayer printed circuit board 3010 (FIG. 22 (U)).

In this example, since the copper foil had thinned by etching in advance, the total thickness of copper foil 3031 and plated layer 3033 each constituting the conductor circuit 3034 becomes thinner so that the fine conductor circuit 3034 can be formed by patterned-etching mentioned above.

EXAMPLE 5

Figure 24:
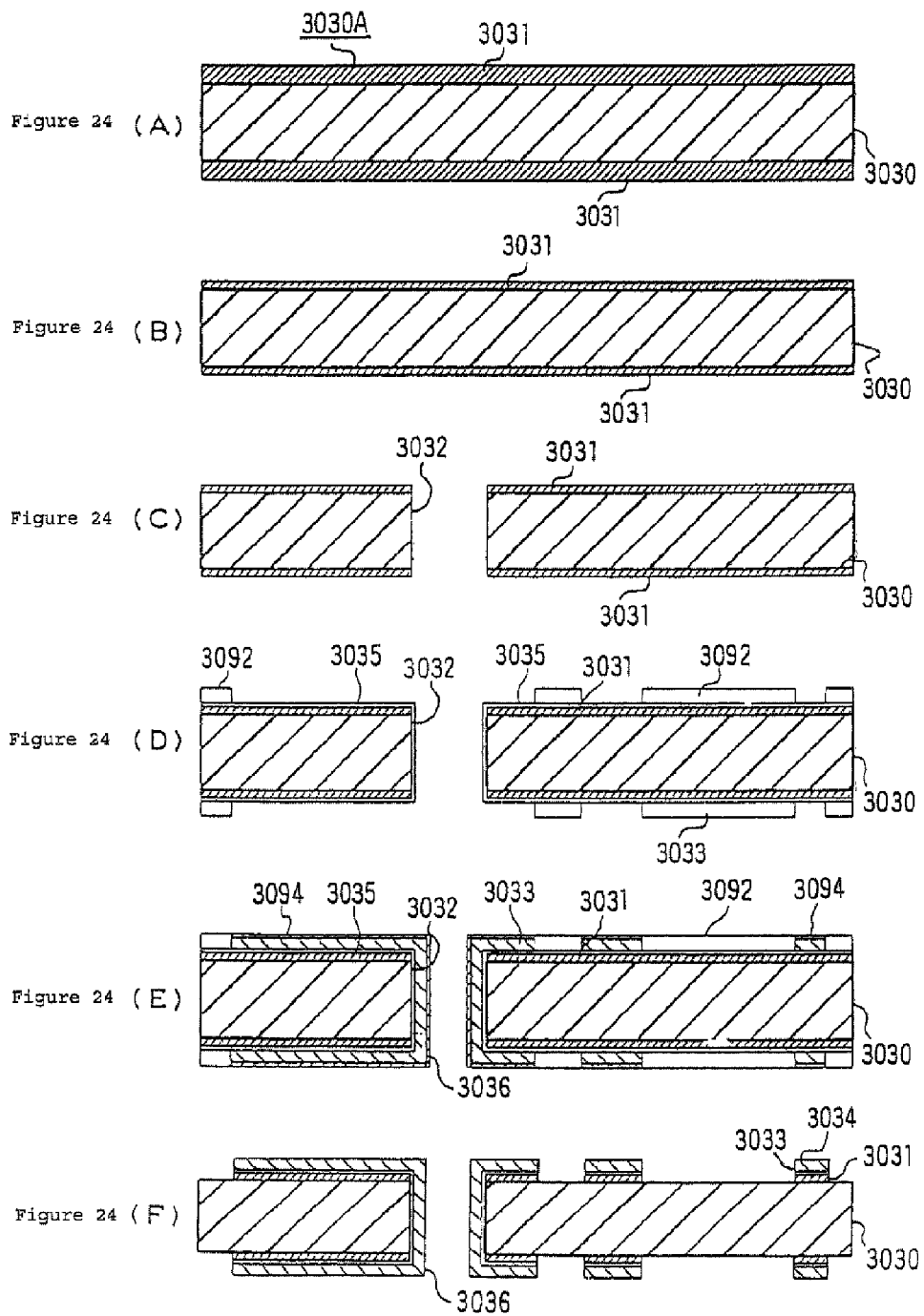
FIGS. 24(A) to (F) are sectional views showing a part of the process for manufacture of multilayer printed circuit boards according to the third group of the present invention.

The process for the multilayer printed circuit board 3010 according to Example 5 is now described with reference to FIG. 24.

(1) In this Example 5, FR-5 substrate (Matsushita Denko, R5715S) was used as both sides-copper clad laminate board 3030A (FIG. 24(A)). Both sides of copper foil 3031 were adjusted to 3 μm of thickness by using etching solution (Mitsubishi gas, SE-07) (FIG. 24(B)).

(2) Through holes 3032 were pierced in the substrate 3030 by using a drill having φ=0.3 mm. (FIG. 24(C)). Then, the desmear treatment was carried out in the inner surface of the through-holes 3032 by using potassium permanganate.

(3) The whole substrate board 3030 was treated with catalyst, then 0.1 μm of electroless plating layer 3035 was formed. Then, using the dry film resist made by Nichigo morton, Co., (NIT 225), the channel pattern (solder resist) 3092 in L/S=30/30 μm was provided (FIG. 24(D)).

(4) The electroplating layer 3033 in thickness of 15 μm and the solder resist layer 3094 in thickness of 3 μm were formed in resist-free parts by using the above-mentioned electroless plating layer 3035 as a power supply (FIG. 24(E)).

(5) After the plating resist 3092 was stripped off with 2% NaOH, the conductor circuit 3034 was formed by etching the electroless plated metal film 3035 and copper foil 3031 underneath the plating resist 3092. Then, the solder resist was removed using solder plate stripping solution (FIG. 24 (F)).

The following steps are omitted since those are the same as Example 4 mentioned above in reference with FIG. 18 to FIG. 22.

In this Example 5, the copper foil 3031 of the both side copper clad laminate board had thinned by etching in advance.

Therefore, since the copper foil 3031 had thinned in advance when the plated layer (electroless plating layer) 3035 under the resist 3031 and the copper foil 3031 removed by etching, the total thickness of copper foil 3031 and plated layer 3035 becomes thinner so that the fine conductor circuit can be formed by patterned-etching mentioned above.

EXAMPLE 6

Figure 25:
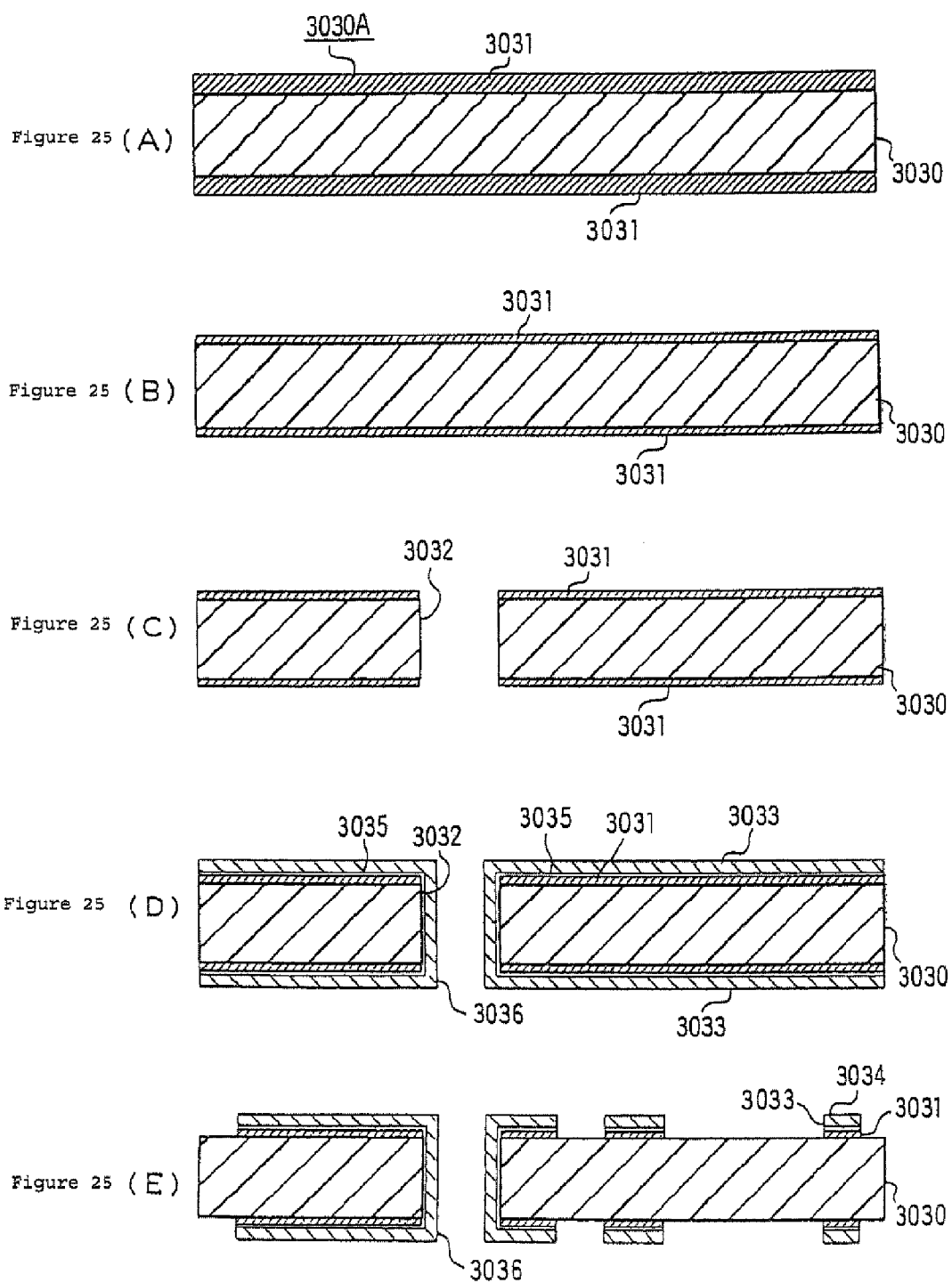
FIGS. 25(A) to (E) are sectional views showing a part of the process for manufacture of multilayer printed circuit boards according to the third group of the present invention.

The process for the multilayer printed circuit board according to Example 6 is now described with reference to FIG. 25.

(1) As the starting material, a copper-clad laminate 3030A (HITACHI Kasei Industries, EA697) laminating a 12 μm-thick copper foil 3031 to both sides of a 0.8 mm-thick substrate 3030 having glass-epoxy resin (FIG. 25(A)) was used. Both sides of copper foil 3031 were adjusted to 3 μm of thickness by using etching solution (Mitsubishi gas, SE-07) (FIG. 25(B)).

(2) Laser was irritated to the copper-clad laminate 3030A of the substrate board 3030 using carbon dioxide gas laser (Mitsubishi Denki, ML605GTL) with an output of 30 mJ, a pulse duration of $52 \times 10^{-6}$ seconds and 15 shots (FIG. 25(C)) to form the through-holes 3032 having φ=100 μm. Then, the desmear treatment was carried out in the lateral sides of the through-holes 3032 by potassium permanganate.

(3) The whole substrate board 3030 was treated with catalyst, then 0.1 μm of electroless plating layer was formed. Then, the copper-electroplating is carried out in the current of 1 A/dm$^2$ via said electroless plated layer to prepare the plated layer 3033 of the thickness in 15 μm (FIG. 25(D)). As a result, plated-through holes 3036 were formed in the through holes 3032.

(4) Then, the dry film resist (ASAHI chemical Co, AQ4059, not shown) was adhered to the surface of copper foil 3031 in the plated layer 3033 to form the pattern in L/S=50/50 μm. Then etching was curried out with copper chloride, and the resist was stripped off with 2% NaOH to form conductor circuit 3034 (FIG. 25(E)). The following steps are omitted since those are the same as Example 4 mentioned above in reference with FIG. 18 to FIG. 22.

In this Example 6, since the copper foil 3031 had thinned in, the total thickness of copper foil 3031 and plated layer 3033 constituting conductor circuit 3034 becomes thinner so that the fine conductor circuit 3034 can be formed by patterned-etching mentioned above.

Through holes can be pierced by a laser in the Example 6, though through holes were pierced by a drill in the Examples 4 and 5. Furthermore, while the surfaces of the substrate were flattened by applying the resin 3040 after the formation of conductor circuit 3034 on the core board 3030 in the above Examples, a flat multilayer printed board could be obtained without flattening treatment mentioned above since the conductor circuit 3034 had thinned in advance.

EXAMPLE 7

The process for the multilayer printed circuit board according to Example 7 is now described with reference to FIG. 26. Basically, the process is same as Example 4, however as shown in FIG. 26(A), conductor circuits 3034 and plated-through holes 3036 were formed in advance, and as shown in FIG. 26(B), the only plated-through holes 3036 were followed by being filled with the resin filler 3040. The printed mask (not shown) which has the openings in the parts corresponding to plated-through holes was used for filling plated-through holes 3036. Then the surface was abraded (FIG. 26(C)) to provide the roughened layer 3042 comprising Cu—Ni—P on the surface of the conductor circuit as shown in FIG. 26(D).

The roughened layer was provided by the following manner. Thus, the substrate board was alkali-degreased, soft-etched and further treated with a catalyst solution comprising palladium chloride and an organic acid to apply the Pd catalyst, and after activation of the catalyst, the substrate board was immersed in an electroless plating solution (pH=9) comprising copper sulfate ($3.2 \times 10^{-2}$ mol/L), nickel sulfate ($2.4 \times 10^{-3}$ mol/L), citric acid ($5.2 \times 10^{-2}$ mol/L), sodium hypophosphite ($2.7 \times 10^{-1}$ mol/L), boric acid ($5.0 \times 10^{-1}$ mol/L ) and surfactant (Nisshin Chemical, Surphile 465) (0.1 g/L). Two minute after dipping, the substrate board was vibrated lengthwise and crosswise every 1 seconds to thereby provide 5 μm-thick Cu—Ni—P acicular alloy roughened layer on the nickel layer on the surfaces of the conductor circuit 3034 and of lands of plated-through holes 3036.

Figure 26:
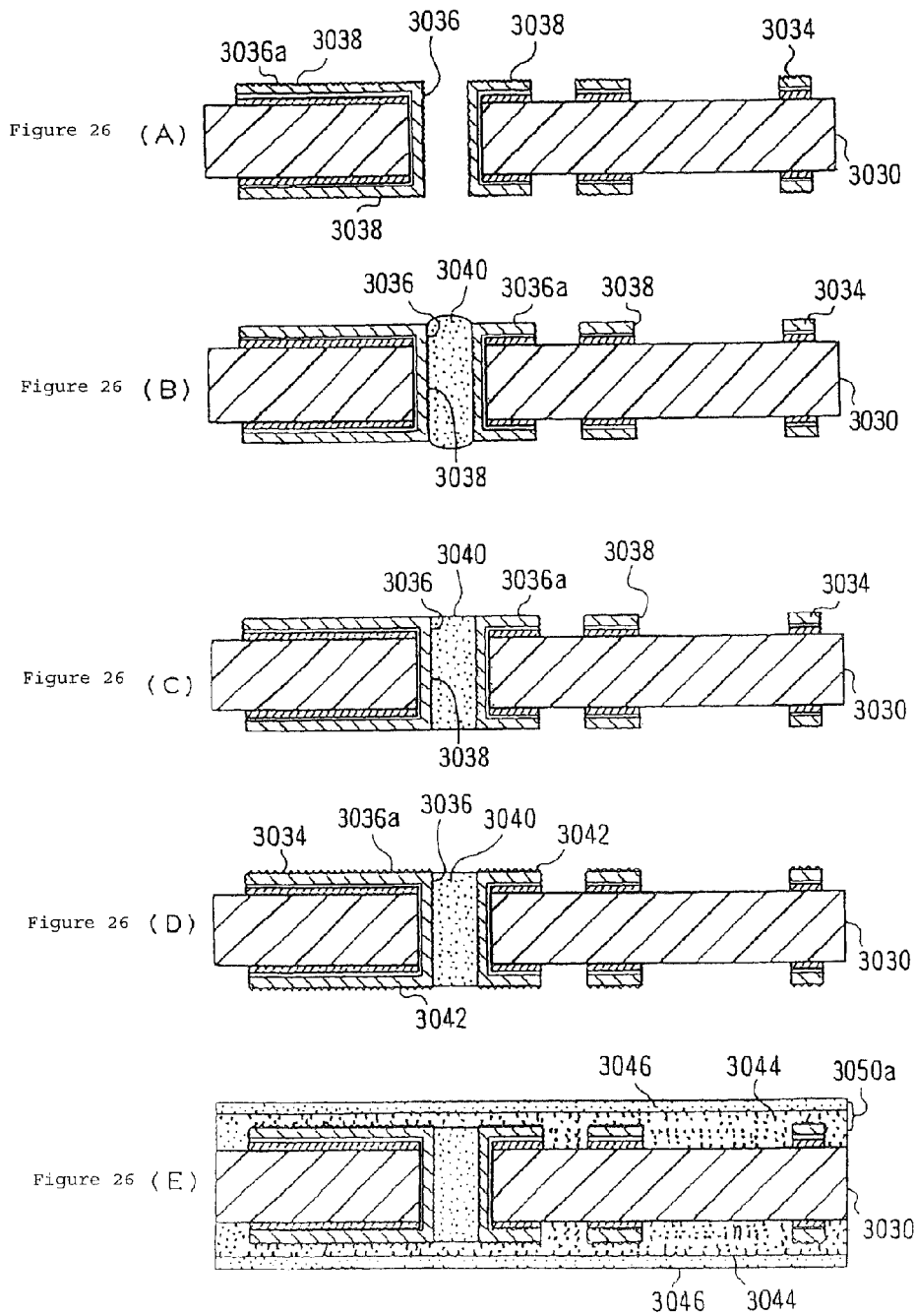
FIGS. 26(A) to (E) are sectional views showing a part of the process for manufacture of multilayer printed circuit boards according to the third group of the present invention.
Figure 27:
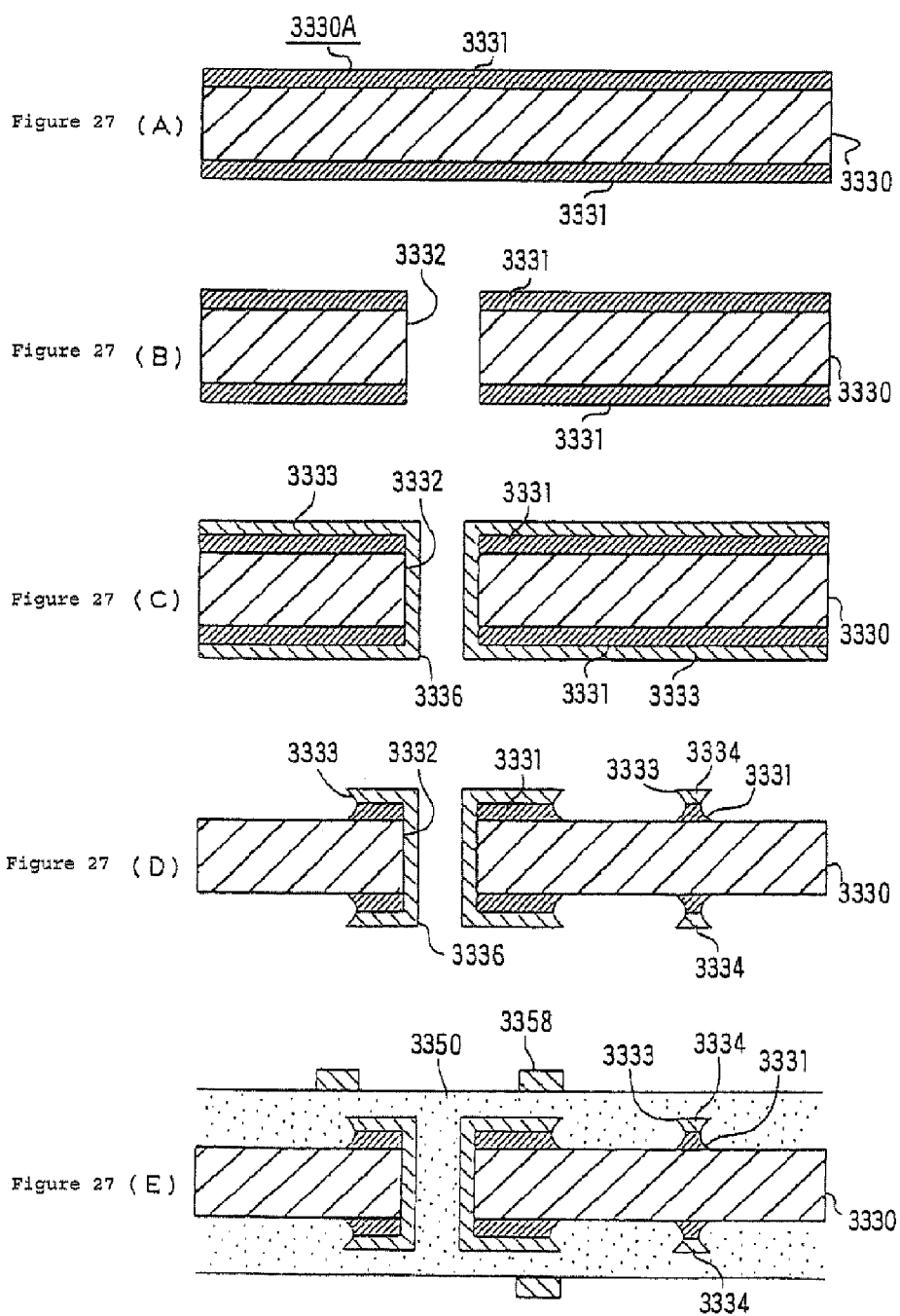
FIGS. 27(A) to (E) are cross-section views showing a part of the conventional process for manufacture of multilayer printed circuit boards.

Then, the interlayer resin insulating layers (for the lower layer) 3044 and 3046 were formed as shown in FIG. 26 (E). Since the conductor circuit 3034 of the core board 3034 is thin, the surface of the interlayer resin insulating layer can be flattened without filling the resin between the conductor circuits.

EXAMPLE 8

A. Production of an Electroless Plating Adhesive (1) A resin composition was prepared by mixing and stirring 35 weight parts of resin solution dissolving a 80 wt. % solution of 25% acrylate of cresol novolac epoxy resin (Nippon Kayaku; mol. wt. 2500) in DMDG, 3.15 weight parts of photosensitive monomer (Toa Gosei; Aronix M315), 0.5 weight part of antifoam and 3.6 weight parts of N-methyl pyrrolidone (NMP).

(2) Other resin composition was prepared by mixing 12 weight parts of polyethersulfone (PES) with epoxy resin powders (Sanyo Kasei; Polymerpol) (7.2 weight parts of a powder having an average particle diameter of 1.0 μm, and 3.09 weight parts of a powder having an average particle diameter of 0.5 μm), adding 30 weight parts of NMP to the mixture and agitating the whole mixture to mix in a bead mill.

(3) Another resin composition was prepared by mixing and stirring 2 weight parts of imidazole series curing agent (Shikoku Kasei; 2E4MZ-CN), 2 weight parts of photopolymerization initiator (Ciba-Beigy; Irgacure I-907), 0.2 weight part of photosensitizer Michler's ketone (Nippon Kayaku; DETX-S) and 1.5 weight parts of NMP.

Then, the resin compositions prepared in (1), (2) and (3) were mixed to obtain the electroless plating adhesive.

B. Process for Production of the Multilayer Printed Circuit Board (1) As the starting material, a copper-clad laminate laminating a 18 μm-thick copper foil 4008 to both sides of a 1 mm-thick substrate 4001 having glass-epoxy resin or BT (bismaleimide-triazine) resin (FIG. 28(*a*)). First, this copper-clad laminate was pierced with a drill, then the plated resist was formed, and electroless copper plating treatment was curried out to form plated-through holes 4009. Further, the copper foil was pattern-etched to form the inner-layer copper pattern in each side of the substrate (lower conductor circuit) 4004.

The substrate thus formed with the inner-layer copper pattern 4004 was rinsed with water and dried. Then, it was subjected to an oxidation-reduction treatment using an oxidizing (blackening) solution containing NaOH (10 g/L), $NaClO_2$ (40 g/L) and $Na_3PO_4$ (6 g/L) to provide said the whole surface of the inner-layer copper pattern 4004 with a roughened layer 4004*a* and 4009*a* (FIG. 28(*b*)).

(2) Using a printer, the resin filler 4010 containing epoxy resin mainly was coated on both sides of the substrate board to fill up the clearance between the lower conductor circuits (inner-layer copper pattern) 4004 or in plated-through holes 4009 and oven-dried. Thus, by this process, the resin filler 4010 was filled up the clearance between the conductor circuits (inner-layer copper pattern) 4004 or plated-through hole 4009 (FIG. 28(C)).

(3) One side of the substrate which had undergone the above treatment (2) was abraded with a belt sander using a belt sanding paper (Sankyo Rikagaku) to thoroughly remove any residue of resin filler 4010 from the surface of the lower conductor circuit 4004 and the surface of the land of the plated-through hole 4009 and, thereafter, buffed to get rid of flaws produced in the belt sanding operation. The above series of operations was similarly performed on the other side of the substrate board, then the resin filler 4010 was oven-dried (FIG. 28(*d*)).

As the mentioned above, the surface of resin filler 4010 filled in the plated-through holes 4009 and the roughened layer 4004*a* on the lower conductor circuit 4004 were removed and both sides of the substrate board were flattened so that the wiring substrate was obtained, in which the resin filler 4010 and the lateral side of the plated-through holes 4009 were adheres intimately via the roughened layer 4004*a* and the inner wall of the plated-through holes and the resin filler 4010 were adheres intimately via the roughened layer 4009*a*.

(4) The substrate board completing the above-mentioned steps was immersed in an electroless nickel plating solution at 90° C. comprising nickel chloride (30 mol/L), sodium hypophosphite (10 mol/L), and sodium citrate (0.1 g/L) to provide 1.2 μm-thick nickel plated layer 4011*a* on the surface of the conductor circuit 4004 and the surface of the land of the plated-through hole 4009.

Figure 29:
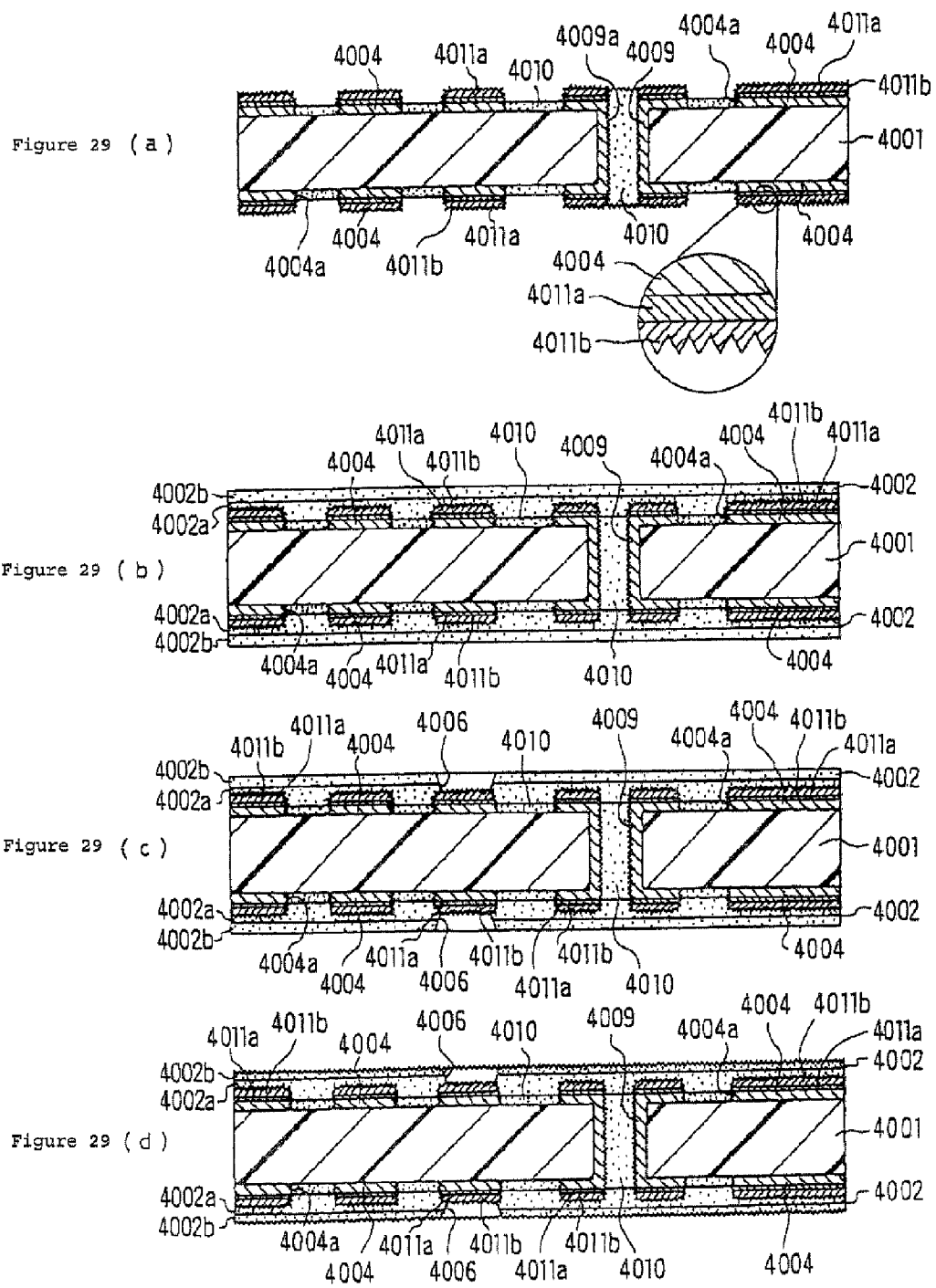
FIGS. 29(a) to (d) are sectional views showing a part of the process for manufacture of multilayer printed circuit boards according to the fourth group of the present invention.

(5) Further, 2 μm-thick Cu—Ni—P acicular alloy roughened layer 4011*b* was formed on the surfaces of the conductor circuit 4004 and lands of plated-through holes 4009 formed nickel plated layer 4011*a* thereon, furthermore 0.3 μm-thick Sn layer was formed (FIG. 29(*a*)). However, Sn layer is not shown.

The roughened layer 4011*b* was formed by the following manner. Thus, the substrate board was alkali-degreased, soft-etched and further treated with a catalyst solution comprising palladium chloride and an organic acid to apply the Pd catalyst, and after activation of the catalyst, the substrate board was immersed in an electroless plating solution (pH=9) comprising copper sulfate ($3.2 \times 10^{-2}$ mol/L), nickel sulfate ($2.4 \times 10^{-3}$ mol/L), citric acid ($5.2 \times 10^{-2}$ mol/L), sodium hypophosphite ($2.7 \times 10^{-1}$ mol/L), boric acid ($5.0 \times 10^{-1}$ mol/L) and surfactant (Nisshin Chemical, Surphile 465) (0.1 g/L). Two minute after dipping, the substrate board was vibrated lengthwise and crosswise every 1 seconds to thereby provide the Cu—Ni—P acicular alloy roughened layer 4011*b* on nickel layer 4011*a* on the surfaces of the conductor circuit 4004 and lands of plated-through holes 4009.

(6) Using a roll coater, the an electroless plating adhesive as obtained in A. mentioned above was coated on both sides of the substrate board twice, and the substrate board was allowed to sit in the horizontal position for 20 minutes and dried at 60° C. for 30 minutes. (FIG. 29(*b*)).

(7) A photomask film printed with black dots having $\phi=200$ μm was superimposed on both sides of the substrate board formed with an adhesive layer in (6) above and exposed to light at 500 mJ/cm² using an ultrahigh-pressure mercury arc lamp and spray-development with dimethylene grycol dimethyl ether (DMTG) solution to provide openings for via hole 4006 having $\phi=85$ μm on the adhesive layer. Then, the substrate was further exposed to light at 3000 mJ/cm² with the ultrahigh-pressure mercury arc lamp and heat-treated (postbaked) at 100° C. for 1 hour, and further at 150° C. for 5 hours, whereby a 35 μm-thick interlayer resin insulating layer 4002 having $\phi=35$ μm openings (openings for via holes 4006) with a good dimensional tolerance corresponding to that of the photomask film (FIG. 29(*c*))) was obtained. The aspect ratio of said openings for via holes is 0.41.

(8) The substrate formed with openings for via holes 4006 was immersed in chromic acid (750 g/l) at 73° C. for 20 minutes to dissolve and removed the epoxy resin particles from the surface of the interlayer resin insulating layer 4002 to roughen the surface, then immersed in a neutralizing solution (Shipley) and rinsed with water (FIG. 29(*d*)).

Then, a palladium catalyst (Atotech) was applied to the surface of the substrate board which had been subjected to surface roughening in the above step to deposit the catalyst nucleus on the surface of the interlayer resin insulating layer 4002 and inner side of openings for via moles 4006.

Figure 30:
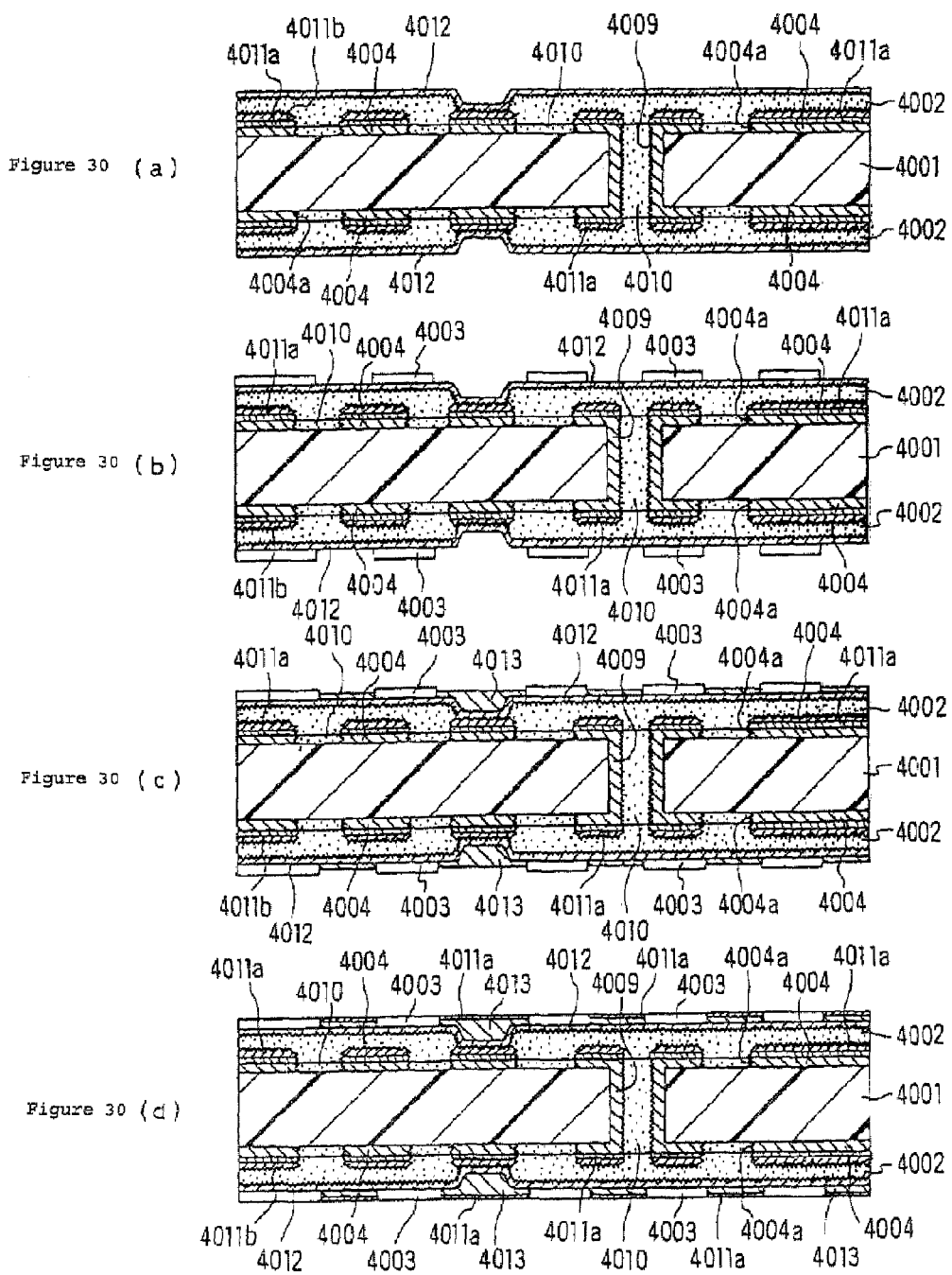
FIGS. 30(a) to (d) are sectional views showing a part of the process for manufacture of multilayer printed circuit boards according to the fourth group of the present invention.

(9) Thereafter, the substrate board was immersed in an aqueous electroless copper plating solution of the following formulation to provide a 0.8 μm-thick electroless plated copper film 4012 all over the surface (FIG. 30(*a*)).

| [Aqueous electroless plating solution] | |
|---|---|
| EDTA | 150 g/L |
| Copper sulfate | 20 g/L |
| HCHO | 30 ml/L |
| NaOH | 40 g/L |
| α,α'-Bipyridyl | 80 mg/L |
| PEG | 0.1 g/L |

[Electroless Plating Conditions]

Bath temperature 70° C., for 30 min.

(10) A commercial photosensitive dry film was pasted on the electroless plated copper film 4012 and with a mask placed in position, exposure at 100 mJ/cm² and development with 0.8% sodium carbonate were carried out to provide a plating photoresist 4003 (FIG. 30(*b*)).

(11) Then, electroplating was curried out in the following condition to form 16 μm-thick copper electroplating layer 4013 (FIG. 30(*c*)).

a) The substrate board was immersed in the mixture containing cleaner conditioner aqueous solution (Atotech Japan, FR, 100 g/l) and sulfuric acid at 50° C., for 5 min.
b) Washing twice with water at 50° C.
c) Immersed and mixed in the 10 v/v % of aqueous solution of sulfuric acid for 1 min.
d) Washing with water twice.
e) Immersed in an aqueous electroplating solution and the direct current plating was curried out. Thereafter, conductor circuit 4005 and via holes 4007 having a flat upper surface (16 μm thick, L/S=37/37 μm) comprising electroless plated copper film 4012 and copper electroplating layer 4013 were formed.

| [Aqueous electroless plating solution] | |
|---|---|
| Sulfuric acid | 220 g/L |
| Copper sulfate | 65 g/L |
| Chloride ion | 40 ppm |
| Thiourea | 0.4 mmol/L |

| [Electroless plating conditions] | |
|---|---|
| Current density | 1.5 A/dm$^2$ |
| Time | 48.5 min. |
| Temperature | 20° C. |
| Cathode | Copper-containing phosphorus |

Figure 31:
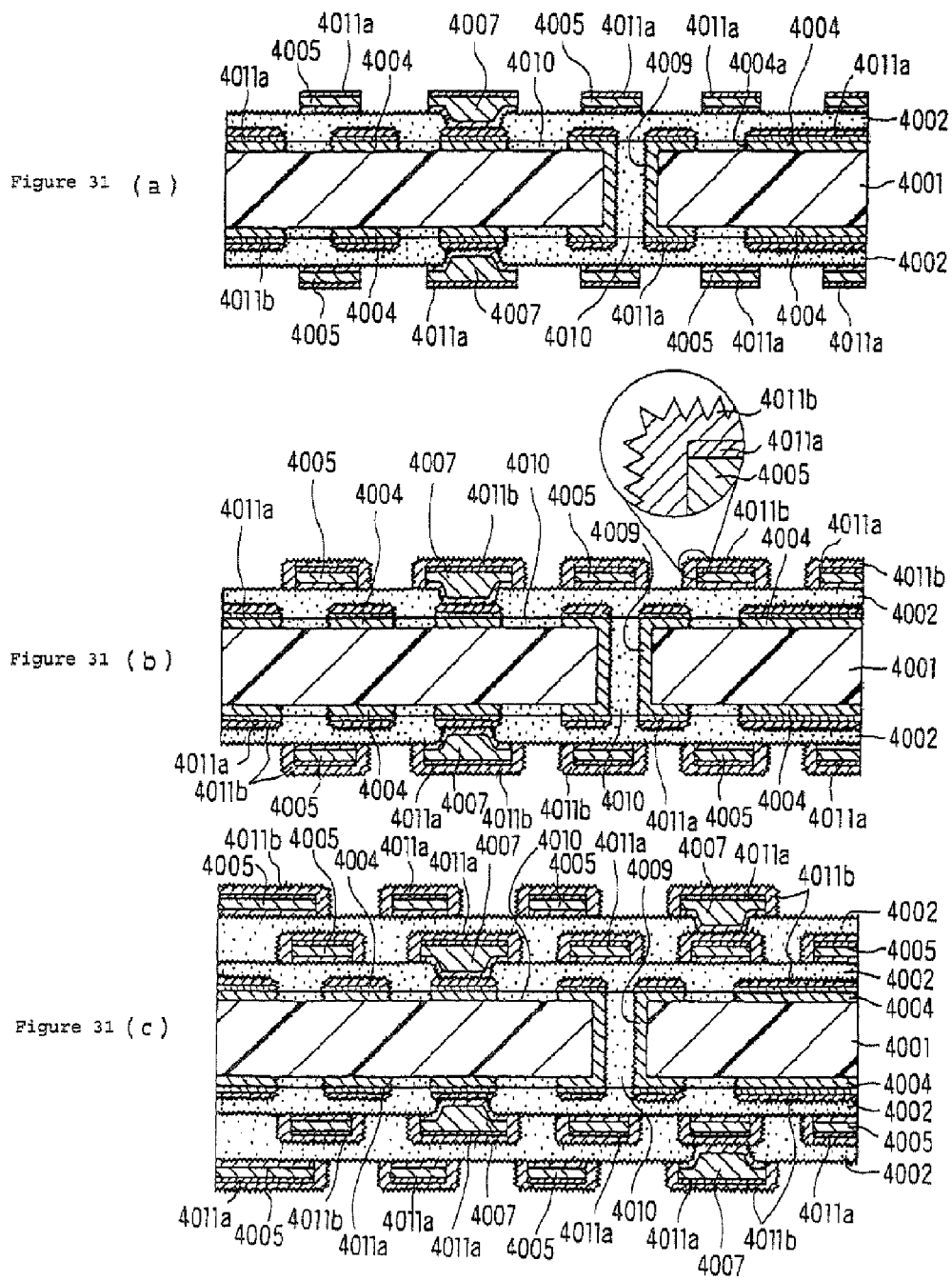
FIGS. 31(a) to (c) are sectional views showing a part of the process for manufacture of multilayer printed circuit boards according to the fourth group of the present invention.

(12) Then, the substrate board was immersed in an electroless nickel plating solution containing nickel chloride (30 g/L), sodium hypophosphite (10 g/L) and sodium citrate (10 g/L) for 20 minutes to provide a 1.2 μm-thick plated nickel layer 4011a on the conductor circuit and the land 4007 of the plated-through holes (FIG. 31(*d*)).

After the plating resist 4003 was stripped off with 5% KOH, the electroless plated metal film 4012 underneath the plating resist 4003 was dissolved and removed by etching with an mixture solution of sulfuric acid and hydrogen peroxide (FIG. 31(*a*)).

(13) Following the same procedure as described in (5), a roughened surface 4011b comprised of Cu—Ni—P alloy was formed on the surfaces of conductor circuit 4005 (FIG. 31(*b*)).

(14) The sequence of steps (6) to (13) was repeated to provide an additional upper-layer conductor circuit (FIG. 31(*c*)), and then the multilayer printed circuit board was provided by forming solder resist layers and solder bumps.

EXAMPLE 9

The multilayer printed circuit board was obtained as the same procedure as Example S except the concentration of thiourea 0.3 mmol/L.

EXAMPLE 10

The multilayer printed circuit board was obtained as the same procedure as Example S except the concentration of thiourea 0.5 mmol/L.

EXAMPLE 11

The multilayer printed circuit board was obtained as the same procedure as Example 8 except the concentration of thiourea 0.15 mmol/L.

EXAMPLE 12

The multilayer printed circuit board was obtained as the same procedure as Example 8 except the concentration of thiourea 1.30 mmol/L.

EXAMPLE 13

The multilayer printed circuit board was obtained as the same procedure as Example 8 except 0.4 mmol/L of polyethylene grycol aqueous solution was used instead of thiourea.

EXAMPLE 14

The multilayer printed circuit board was obtained as the same procedure as Example 8 except 0.4 mmol/L of sodium cyanide aqueous solution was used instead of thiourea.

COMPARATIVE EXAMPLE 2

The multilayer printed circuit board was obtained as the same procedure as Example 8 except the concentration of thiourea 0.08 mmol/L.

COMPARATIVE EXAMPLE 3

The multilayer printed circuit board was obtained as the same procedure as Example 8 except the concentration of thiourea 1.55 mmol/L.

The cross sections of the multilayer printed circuit boards obtained by Examples 8 to 14 and Comparative Examples 2 to 3 were observed by light microscope, and the degree of packing, thickness of the conductor circuit, and flatness on the via holes were observed. The results were shown in Table 4.

TABLE 4

| | Degree of the filling in the openings | Flatness of the surface of via holes | Thickness of the conductor circuits (μm) |
|---|---|---|---|
| Example 8 | Complete filled | Flat | 16.5 |
| Example 9 | Complete filled | Flat | 16.5 |
| Example 10 | Complete filled | Flat | 16.5 |
| Example 11 | Complete filled | Slight convexing at the center | 16.5 |
| Example 12 | Complete filled | Slight concaving at the center | 16.5 |
| Example 13 | Complete filled | Flat | 16.5 |
| Example 14 | Complete filled | Flat | 16.5 |
| Compar. Ex. 2 | Complete filled | Convexing | Not formed |
| Compar. Ex. 3 | Not filled | Large concaving | 16.5 |

As obvious from the above-mentioned Table 4, the complete packing and the formation of the conductor circuit were accomplished at the same time by using aqueous solution containing 0.1 to 1.5 mmol/L of additives as a plating solution at currying out an electroplating.

Further, a flat upper surface of the via holes could be obtained by setting the concentration of thiourea at 0.3 to 0.5 mmol/L.

EXAMPLE 15

The process for manufacturing a multilayer printed board according to Example 15 is now described with reference to the drawings.

First, the recipes for preparation of A. electroless plating adhesive, B. interlayer resin insulating material, C. resin filler, and D. solder resist for use in this process for manufacturing a multilayer printed circuit board in accordance with Example 15 are explained below.

A. Production of Starting Compositions for the Preparation of an Electroless Plating Adhesive (Upper-Layer Adhesive)

[Resin Composition ①]

A resin composition was prepared by mixing and stirring 35 weight parts of resin solution dissolving a 80 wt. % solution of 25% acrylate of cresol novolac. epoxy resin (Nippon Kayaku; mol. wt. 2500) in DMDG, 3.15 weight parts of photosensitive monomer (Toa Gosei; Aronix M315), 0.5 weight part of antifoam (Sun Nopco; S-65) and 3.6 weight parts of NMP.

[Resin Composition ②]

A resin composition was prepared by mixing 12 weight parts of polyethersulfone (PES) with epoxy resin powders (Sanyo Kasei; Polymerpol) (7.2 weight parts of a powder having an average particle diameter of 1.0 μm, and μm 3.09 weight parts of a powder having an average particle diameter of 0.5), adding 30 weight parts of NMP to the mixture and agitating the whole mixture to mix in a bead mill.

[Curing Agent Composition ③]

A curing composition was prepared by mixing and stirring 2 weight parts of imidazole series curing agent (Shikoku Kasei; 2E4MZ-CN), 2 weight parts of photopolymerization initiator (Ciba-Beigy; Irgacure I-907), 0.2 weight part of photosensitizer (Nippon Kayaku; DETX-S) and 1.5 weight parts of NMP.

B. Starting Compositions for Preparation of an Interlayer Resin Insulating Agent (Adhesive for Lower Layer)

[Resin Composition ①]

A resin composition was prepared by mixing and stirring 35 weight parts of resin solution dissolving a 80 wt. % solution of 25% acrylate of cresol novolac epoxy resin (Nippon Kayaku; mol. et. 2500) in DMDG, 4 weight parts of photosensitive monomer (Toa Gosei; Aronix M315), 0.5 weight part of antifoam (Sun Nopco; S-65) and 3.6 weight parts of NMP.

[Resin Composition ②]

A resin composition was prepared by mixing 12 weight parts of polyethersulfone (PES) with 14.49 weight parts of an epoxy resin powder having an average particle diameter of 0.5 μm (Sanyo Kasei; Polymerpole) and adding 30 weight parts of NMP to the mixture, and agitating the whole mixture to mix in a bead mill.

[Curing Composition ③]

A curing composition was prepared by mixing and stirring 2 weight parts of imidazole series curing agent (Shikoku Kasei; 2E4MZ-CN), 2 weight parts of photopolymerization initiator (Ciba-Geigy; Irgacure I-907), 0.2 weight part of photosensitizer (Nippon Kayaku, DETX-S) and 1.5 weight parts of NMP.

C. Production of Starting Compositions for Preparation of a Resin Filler

[Resin Composition ①]

A resin composition was prepared by mixing and stirring 100 weight parts of bisphenol F epoxy monomer (Yuka Shell; mol. wet. 310, YL983U), 170 weight parts of surface-silanated $SiO_2$ beads with an average diameter of 1.6 μm (Adomatic; CRS 1101-CE; the maximum particle size controlled below the thickness (15 μm) of the inner-layer copper pattern to be described below) and 1.5 weight parts of leveling agent (San Nopco; Levenol S4) and adjusting the viscosity of the mixture to 45,000 to 49,000 cps at 23±1° C.

[Curing Composition ②]

Imidazole series curing agent (Shikoku Kasei; 2E4MZ-CN), 6.5 weight parts.

D. Preparation of a Solder Resist Composition

A solder resist composition was prepared by mixing 46.67 g of a 60 wt. % solution of a photosensitized oligomer (mol. wt. 4000) prepared by acrylating 50% of the epoxy groups of cresol novolac epoxy resin (Nippon Kayaku) in :DMDG, 15.0 g of a 80 wt. % solution of bisphenol A epoxy resin (Yuka Shell; Epikote 1001) in methyl ethyl ketone, 1.6 g of imidazole series curing :agent (.Shikoku Kasei; 2E4MZ-CN), 3 g of photosensitive polyfunctional acrylic monomer (Nippon Kayaku, R604), 1.5 g of photosensitive polyfunctional acrylic monomer (Kyoeisha Chemical; DPE6A) and 0.71 g of dispersion antifoam (San Nopco; S-65), followed by addition of 2 g of photopolymerization initiator benzophenone (Kanto Chemical) and 0.2 g of photosensitizer Michler's ketone (Kanto Chemical). The viscosity of the resulting mixture was adjusted to 2.0 Pa·s at 25° C.

Viscosity measurement was carried out with a Type B viscometer (Tokyo Keiki, DVL-B) using a rotor No. 4 for 60 rpm and a rotor No. 3 for 6 rpm.

The process for manufacturing a multilayer printed circuit board according to Example 15 is now described with reference to FIGS. 32 to 37. In Example 15, the multilayer printed circuit board was fabricated by the semi-additive process.

Figure 32:
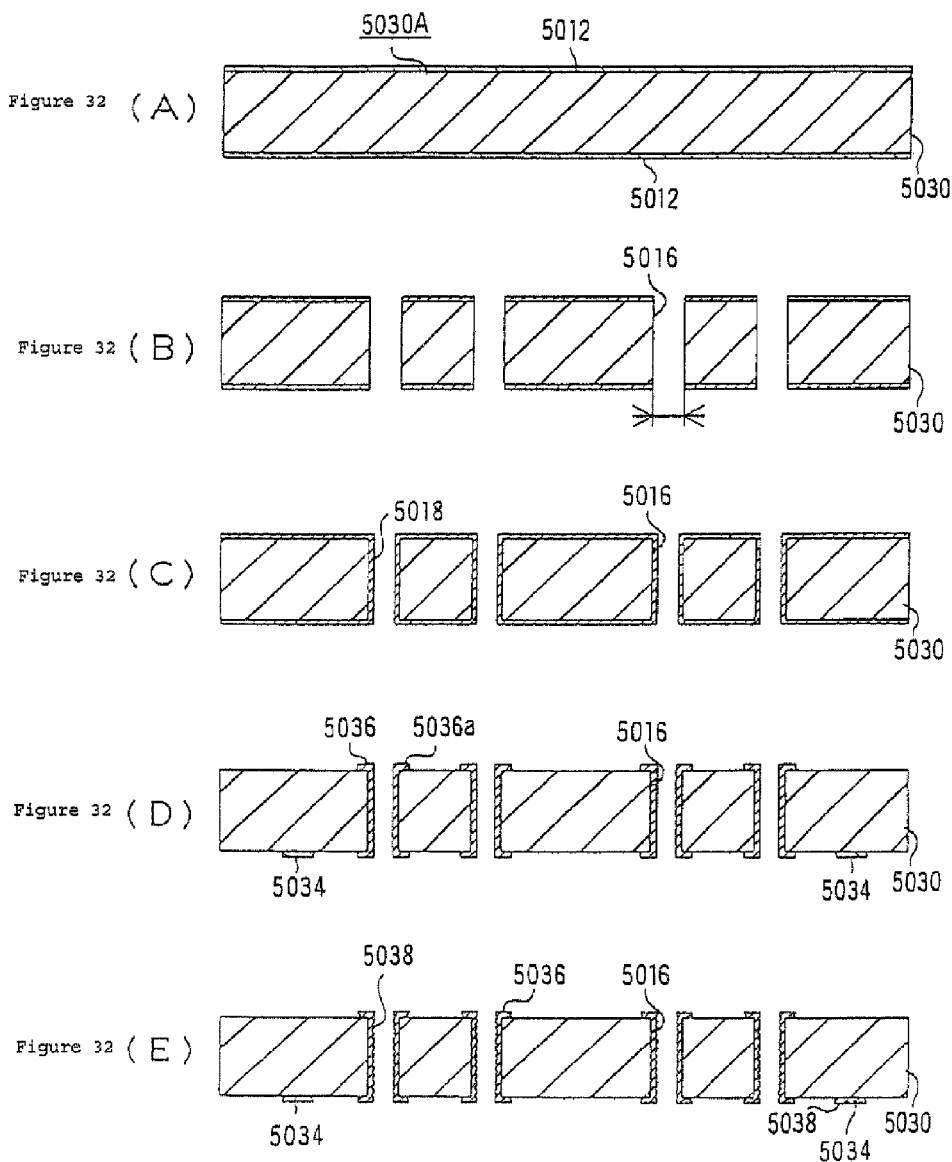
FIGS. 32(A) to (E) are cross-section views illustrating a part of the production process for multilayer printed circuit boards according to a fifth group of the present invention.
Figure 33:
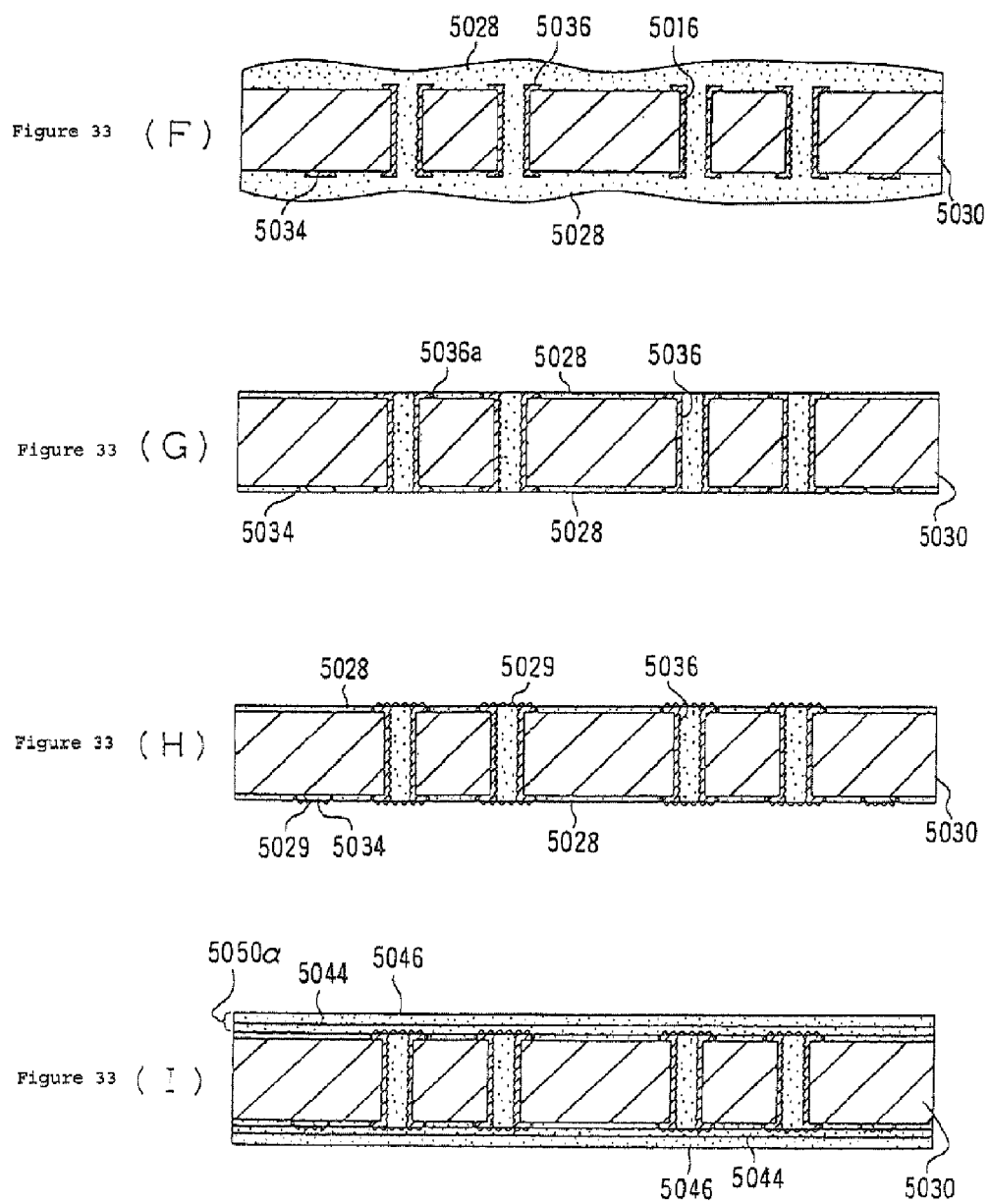
FIGS. 33(F) to (I) are cross-section view showing a part of the production process for the multilayer printed circuit board according to a fifth group of the present invention.

(1) As the starting material, a copper-clad laminate 5030A laminating a 18 μm-thick copper foil 5012 to both sides of a 1 mm-thick substrate 5030 having glass-epoxy resin or BT (bismaleimide-triazine) resin as shown in FIG. 32(A). First, using a laser processor, through holes 5016 for plated-through holes were pierced in this copper-clad laminate 5030A (FIG. 32 (B)).

The laser processing equipment which can be used in this step includes a carbon dioxide gas laser equipment, a UV laser equipment and an eximer laser equipment. The preferred diameter D of the through holes 5016 is 100 to 200 μm. Among said machines, the carbon dioxide gas laser equipment, which features a high processing speed and a low-cost operation and, hence, is most suited for industrial use, is the laser processor of choice for the practice of the invention of the fifth group.

Thus, when a drill is used for piercing through holes, even the smallest diameter D of the holes is 300 μm so that when via holes 5060 are formed in the manner of covering plated-through holes 5016 as in the example described above with reference to FIG. 36(S), the diameter of the via hole 5060 becomes large, making it mandatory to reduce the density of via holes 5060 in the interlayer resin insulating layer 5050 and the wiring density of the conductor circuit 5058. In this example, therefore, the reduction in wiring density on the side of the interlayer resin insulating layer 5050 is obviated by delimiting the diameter of through holes 5016 to not greater than 200 µm by using a laser. The lower limit to hole diameter of 100 µm is set only because through holes not greater than 100 µm in diameter can hardly be pierced even with a laser beam. While, in this example, through holes not greater than 200 µm in diameter are formed with a laser equipment, it is permissible to pierce through holes as large as 300 µm in diameter by means of a drilling machine as in the prior art and form via holes so as to cover the through holes for reducing the wiring length.

(2) Then, the core board 5030 was electroless plated to form a plated metal film 5018 on the inner walls of through holes 5016 (FIG. 32(C)).

(3) The copper foil 5012 of the core board 5030 was then pattern-etched to provide plated-through holes 5036 and a conductor circuit (an inner-layer copper pattern) 5034 (FIG. 32(D)).

(4) The substrate board 5030 thus formed with the inner-layer copper pattern 5034 and plated-through holes 5036 was rinsed with water and dried. Then, it was subjected to an oxidation-reduction treatment using an oxidizing (blackening) solution containing NaOH (10 g/L), NaClO$_2$ (40 g/L) and Na$_3$PO$_4$ (6 g/L) and a reducing solution containing NaOH (10 g/L) and NaBH$_4$ (6 g/L) to provide said inner-layer copper pattern 5034 and plated-through holes 5036 with a roughened layer 5038 (FIG. 32(E)).

(5) The starting compositions mentioned under (C) for preparation of a resin filler were mixed and compounded to prepare a resin filler.

(6) Using a roll coater, the resin filler 5028 obtained in (5) above was coated on both sides of the substrate board 5030 within 24 hours of preparation to fill up the clearance between the conductor circuits (inner-layer copper pattern) 5034 and conductor circuit 5034 and within the plated-through holes 5036 and dried at 70° C. for 20 minutes. The other side of the substrate was also treated with resin filler 5028 to fill up the clearance between the conductor circuits 5034 and in the plated-through holes 5036, followed by oven-drying at 70° C. for 20 minutes (FIG. 33(F)).

(7) One side of the substrate board 5030 which had undergone the above treatment (6) was abraded with a belt sander using a #600 belt sanding paper (Sankyo Rikagaku) to thoroughly remove any residue of resin filler 5028 from the surface of the inner-layer copper pattern 5034 and the surface of the land 5036a of the plated-through hole 5036 and, thereafter, buffed to get rid of flaws produced in the belt sanding operation. The above series of operations was similarly performed on the other side of the substrate board (FIG. 33(G)).

The board was then subjected to heat treatment at 100° C. for 1 hour, 120° C. for 3 hours, 150° C. for 1 hour and 180° C. for 7 hours to cure the resin filler 5028.

The surface layer of the resin filler 5028 in plated-through holes 5036 and the roughened layer 508 on the inner-layer conductor circuit 5034 through the roughened layer 5038 are thus removed to make both sides of the substrate board 5030 flat and smooth. The resulting circuit board features a firm bond between the resin filler 5028 and the lateral sides of the inner-layer conductor circuit 5034 and between the resin filler 5028 and the inner walls of plated-through holes 5036 through said roughened layer 5038.

Thus, in this step, the surface of the resin filler 5028 and the surface of the inner-layer copper pattern 5034 were made flush.

(8) The substrate board 5030 formed with the conductor circuit 5034 was alkali-degreased, soft-etched and further treated with a catalyst solution comprising palladium chloride and an organic acid to apply the Pd catalyst, and after activation of the catalyst, the substrate board was immersed in an electroless plating solution (pH=9) comprising 3.2× 10$^{-2}$ mol/L of copper sulfate, 3.9×10$^{-3}$ mol/L of nickel sulfate, 5.4×10$^{-2}$ mol/L of complexing agent, 3.3×10$^{-1}$ mol/L of sodium hypophosphite, 5.0×10$^{-1}$ mol/L of boric acid and 0.1 g/L of surfactant (Nisshin Chemical, Surphile 465). One minute after dipping, the substrate board was vibrated lengthwise and crosswise every 4 seconds to thereby provide a Cu—Ni—P acicular alloy covering layer and a roughened layer 5029 on the surfaces of the conductor circuit 5034 and lands 5036a of plated-through holes 5036 (FIG. 33 (H)).

Then, a Cu—Sn substitution reaction was carried out using 0.1 mol/L of tin borofluoride and 1.0 mol/L of thiourea at 35° C. and pH=1.2 to provide a 0.3 µm-thick Sn layer (not shown) on the roughened layer.

(9) The starting compositions B. for preparation of an interlayer resin insulating layer were mixed under stirring and adjusted to a viscosity of 1.5 Pa·s to provide an interlayer resin insulating agent (for the lower layer).

(10) Then, the starting compositions A. for preparation of an electroless plating adhesive were mixed under stirring and adjusted to a viscosity of 7 Pa·s to provide an electroless plating adhesive solution (for the upper layer).

(11) Using a roll coater, the interlayer resin insulating agent (for the lower layer) 5044 with a viscosity of 1.5 Pa·s as obtained in (9) above was coated on both sides of the substrate obtained in (8) above within 24 hours of preparation and the substrate board was allowed to sit in the horizontal position for 20 minutes and dried at 60° C. for 30 minutes (prebake). Then, the photosensitive adhesive solution (for the upper layer) 5046 with a viscosity adjusted to 7 Pa·s as prepared in (10) above was coated within 24 hours of preparation and the substrate board was allowed to sit in the horizontal position for 20 minutes and, then, dried (prebaked) at 60° C. for 30 minutes to provide a 35 µm-thick adhesive layer 5050a (FIG. 33(I)).

(12) A photomask film (not shown) printed with black dots having φ=85 µm not shown was superimposed on both sides of the substrate board 5030 formed with an adhesive layer in (11) above and exposed to light at 500 mJ/cm$^2$ using an ultrahigh-pressure mercury arc lamp. After spray-development with DMTG solution, the substrate 5030 was further exposed to light at 3000 mJ/cm$^2$ with the ultrahigh-pressure mercury arc lamp and heat-treated (postbaked) at 100° C. for 1 hour, at 120° C. for 1 hour and further at 150° C. for 3 hours, whereby a 35 µm-thick interlayer resin insulating layer (binary structure) 5050 having 85 µm φ openings (openings for via holes) 5048 with a good dimensional tolerance corresponding to that of the photomask film (FIG. 34 (J)) was obtained. In the openings 5048 for via holes, the plated tin layer (not shown) was caused to be partially exposed.

(13) The substrate board 5030 formed with openings 5048 was immersed in chromic acid for 19 minutes to dissolve and removed the epoxy resin particles from the surface of the interlayer resin insulating layer 5050 to roughen the surface of said interlayer resin insulating layer 5050 (FIG. 34(K)), then immersed in a neutralizing solution (Shipley) and rinsed with water.

(14) Then, a palladium catalyst (Atotech) was applied to the surface of the substrate board 5030 which had been subjected to surface roughening in the above step (13) to deposit the catalyst nucleus on the surface of the interlayer resin insulating layer 5050. Thereafter, the substrate board 5030 was immersed in an aqueous electroless copper plating solution of the following formulation to provide a 0.6 µm-thick electroless plated copper film 5052 all over the surface (FIG. 34(L)).

[Aqueous electroless plating solution]

| EDTA | 150 g/L |
|---|---|
| Copper sulfate | 20 g/L |
| HCHO | 30 ml/L |
| NaOH | 40 g/L |
| α,α'-Bipyridyl | 80 mg/L |
| PEG | 0.1 g/L |

[Electroless Plating Conditions]
Bath temperature 70° C., for 30 min.

(15) A commercial photosensitive dry film was pasted on the electroless plated copper film 5054 formed in the above step (14) and with a mask placed in position, exposure at 100 mJ/cm$^2$ and development with 0.8% sodium carbonate were carried out to provide a 15 µm-thick plating photoresist 5054 (FIG. 34(M)).

Figure 34:
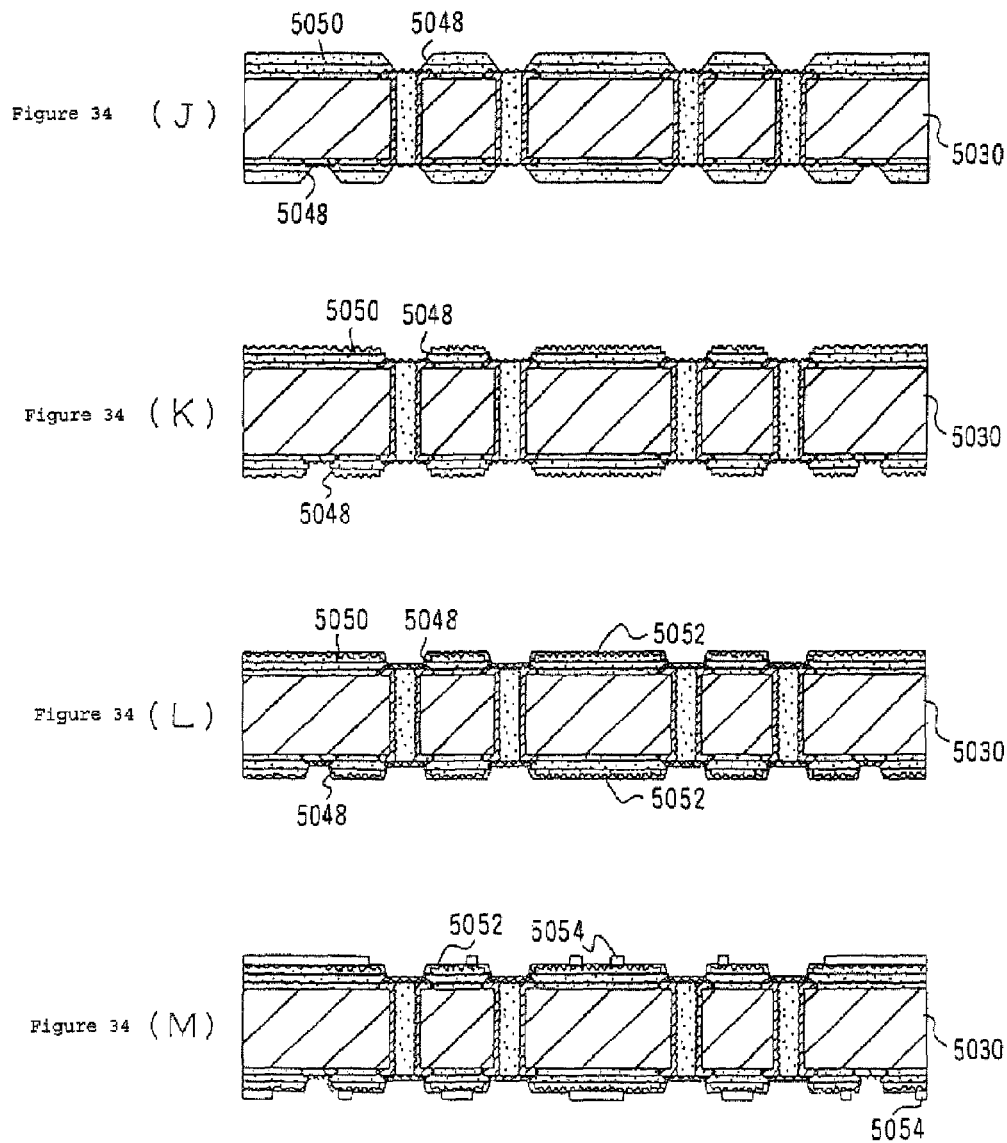
FIGS. 34(J) to (M) are cross-section view showing a part of the production process for the multilayer printed circuit board according to the fifth group of the present invention.

(16) Then, the resist-free area was copper-electroplated under the following conditions to construct a 15 µm-thick copper electroplating layer 5056 (FIG. 34 (N)).

[Aqueous electroplating solution]

| Sulfuric acid | 180 g/L |
|---|---|
| Copper sulfate | 80 g/L |
| Additive (Atotech Japan; Kaparacid GL) | 1 ml/L |

[Electroplating conditions]

| Current density | 1 A/dm$^2$ |
|---|---|
| Time | 30 min. |
| Temperature | Room temp. |

(17) After the plating resist 5054 was stripped off with 5% KOH, the electroless plated metal film 5052 underneath the plating resist was dissolved and removed by etching with an etching solution comprising a mixture of sulfuric acid and hydrogen peroxide to provide an 18 µm-thick conductor circuit 5058 and via holes 5060 comprising electroless plated copper film 5052 and electroplated copper film 5056 (FIG. 35(O)).

Figure 35:
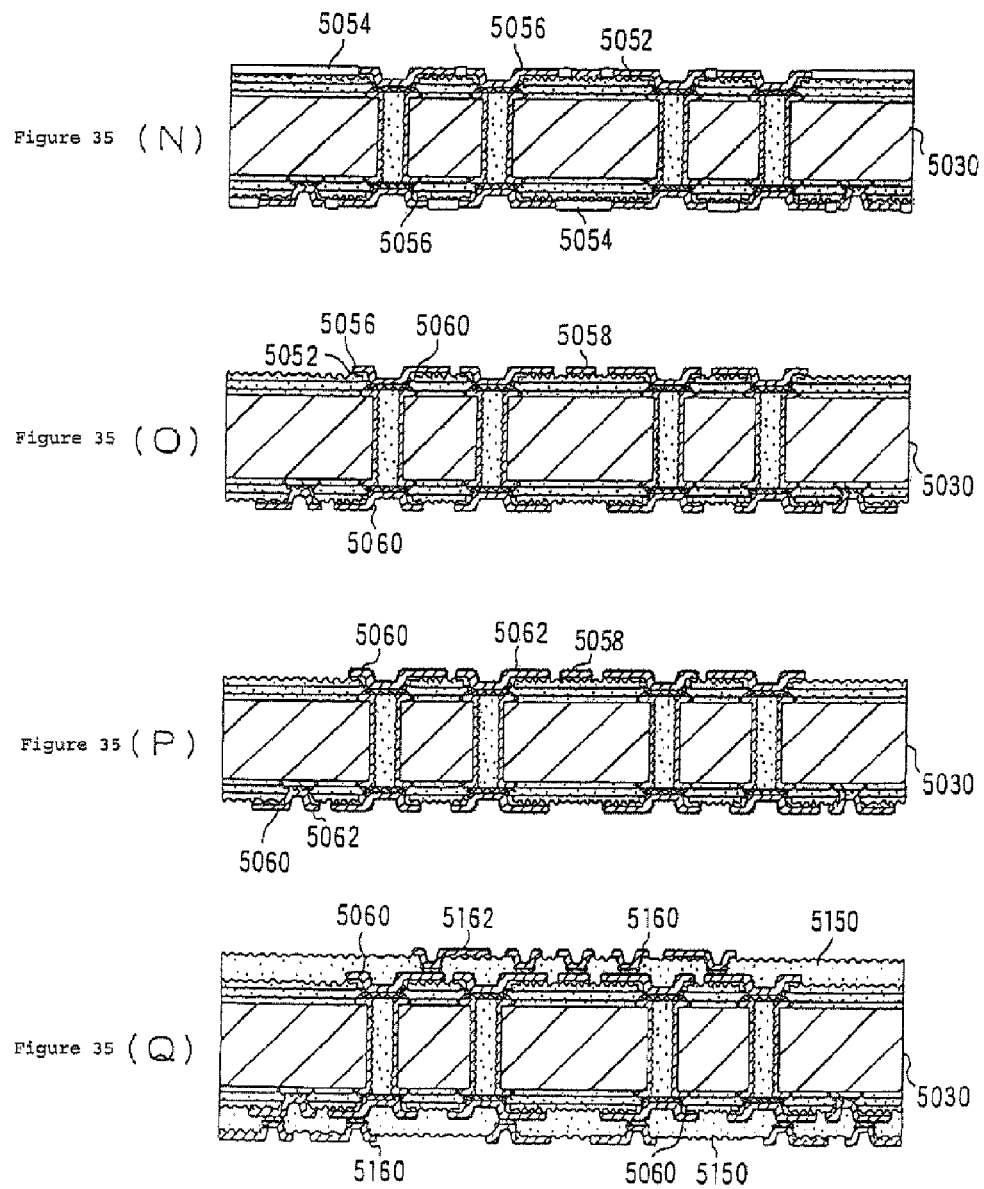
FIGS. 35(N) to (Q) are cross-section views showing a part of the production process for the multi-layer printed circuit board in accordance with the fifth group of the present invention.

(18) Following the same procedure as described in (8), a roughened surface 5062 comprised of Cu—Ni—P alloy was formed on the surfaces of conductor circuit 5058 and via holes 5060 and a Sn substitution on the surface was carried out (FIG. 35 (P)).

(19) The sequence of steps (9) to (17) was repeated to provide an additional upper-layer interlayer resin insulating layer 5160, via holes 5158 and conductor circuit 5158. Furthermore, the surface of the via holes 5160 and conductor circuit 5158 were provided with roughened layer 5162 to complete a multilayer buildup circuit board (FIG. 35(Q)). In this process for formation of said additional upper-layer conductor circuit, no Sn substitution was carried out.

(20) Then, this multilayer buildup circuit board was provided with solder bumps The solder resist composition described under (D) was coated in a thickness of 45 µm on both sides of the substrate board 5030 obtained in (19) above. After the substrate board was dried at 70° C. for 20 minutes and further at 70° C. for 30 minutes, a 5 mm-thick photomask film (not shown) carrying a pattern of dots (mask pattern) was placed in intimate contact and exposure with ultraviolet light at 1000 mJ/$^2$ and development with DMTG were carried out. Then, the substrate board was further heat-treated at 80+ C. for 1 hour, at 100° C. for 1 hour, at 120° C. for 1 hour and at 150° C. for 3 hours to provide a solder resist layer 5070 (thickness: 20 µm) having openings 5071 (opening dia. 200 µm) in the solder pad areas (inclusive of via holes and their lands) (FIG. 36).

(21) Then, this board 5030 was immersed in an electroless nickel plating solution (pH=4.5) containing 2.31×10$^{-1}$ mol/L of nickel chloride, 2.8×10$^{-1}$ mol/L of sodium hypophosphite and 1.85×10$^{-1}$ mol/L of sodium citrate for 20 minutes to provide a 5 µm-thick plated nickel layer 5072 in the openings 5071.

Figure 36:
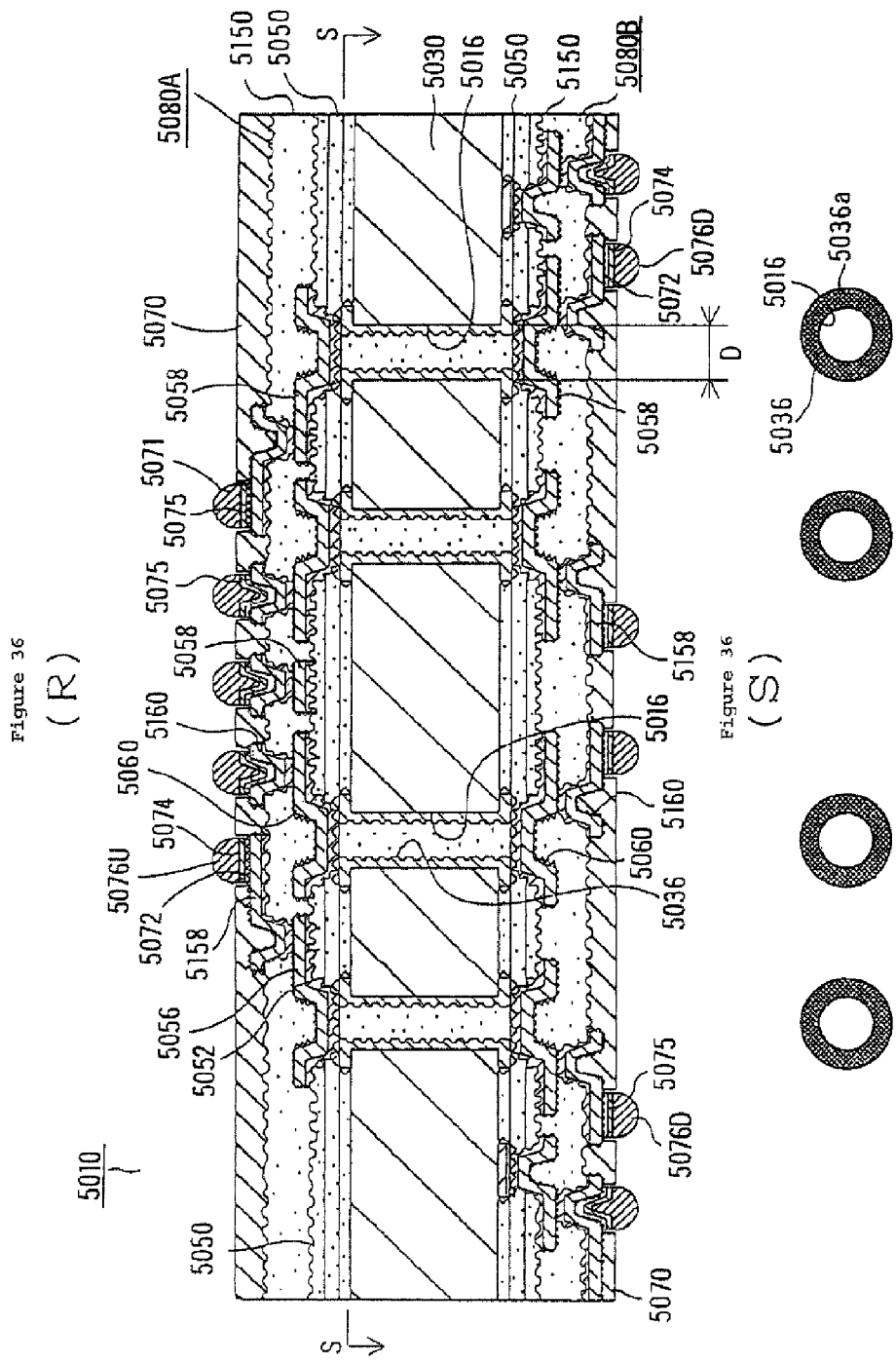
FIG. 36(R) is a cross-section view of the multi-layer printed circuit board according to the fifth group of the present invention and FIG. 36(S) is a sectional view taken along the line S-S of FIG. 36(R).

Furthermore, this board was immersed in an electroless gold plating solution containing 4.1×10$^{-2}$ mol/L of potassium cyanide-gold, 1.87×10$^{-1}$ mol/L of ammonium chloride, 1.16×10$^{-1}$ mol/L of sodium citrate and 1.7×10$^{-1}$ mol/L of sodium hypophosphite at 80% for 7 minutes and 20 seconds to provide a 0.03 µm plated gold layer 5074 on the plated nickel layer, whereby the via holes 5160 and conductor circuit 5158 were provided with solder pads 5075 (FIG. 36).

(22) Then, the openings 5071 of the solder resist layer 5070 were printed with a solder paste followed by reflowing at 200° C. to provide solder bumps (solder masses) 5076U, 5076D and thereby provide a multilayer printed circuit board 5010 (FIG. 36).

Figure 37:
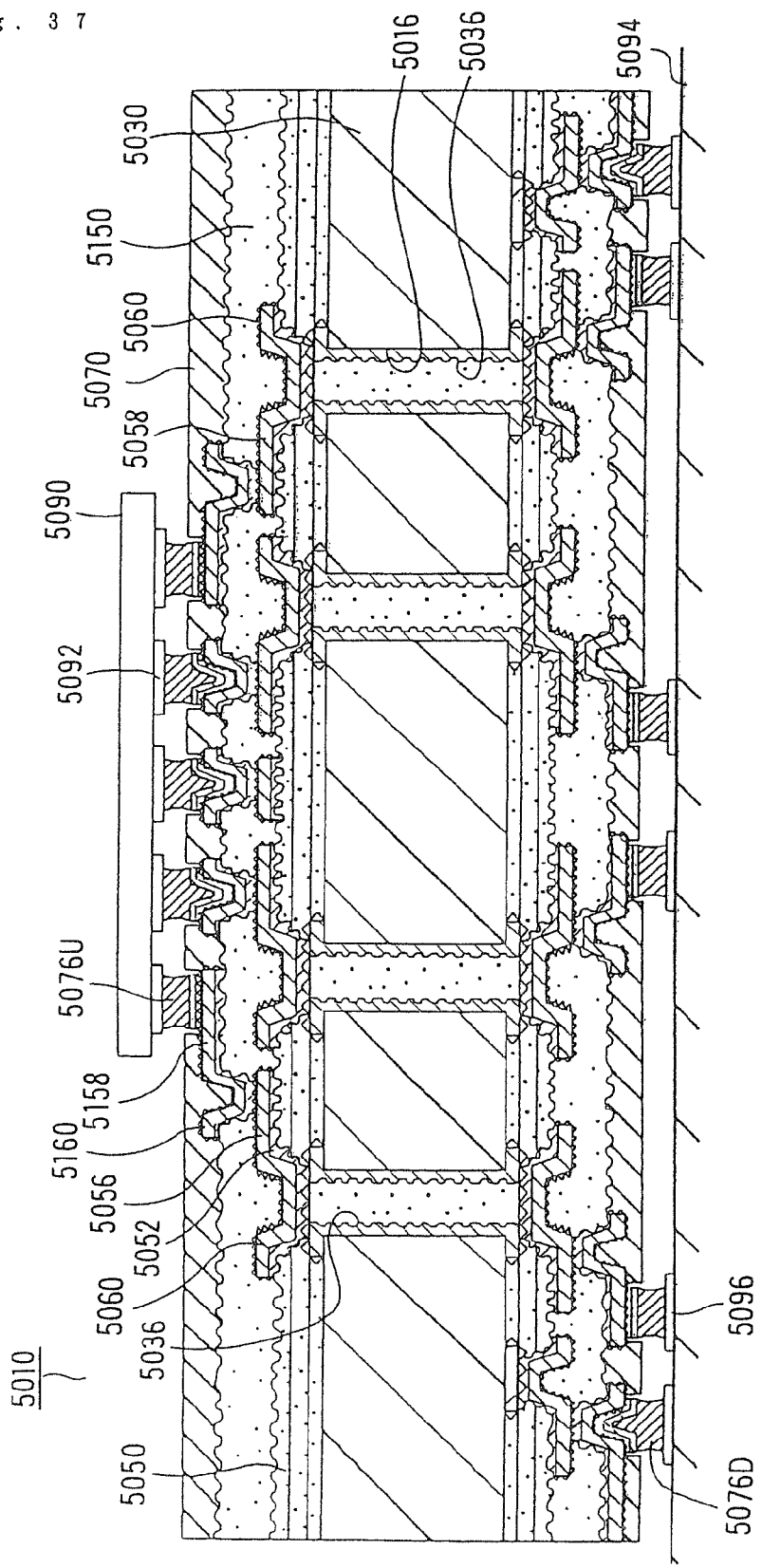
FIG. 37 is a cross-section view of the multi-layer printed circuit board according to the fifth group of the present invention.
Figure 38:
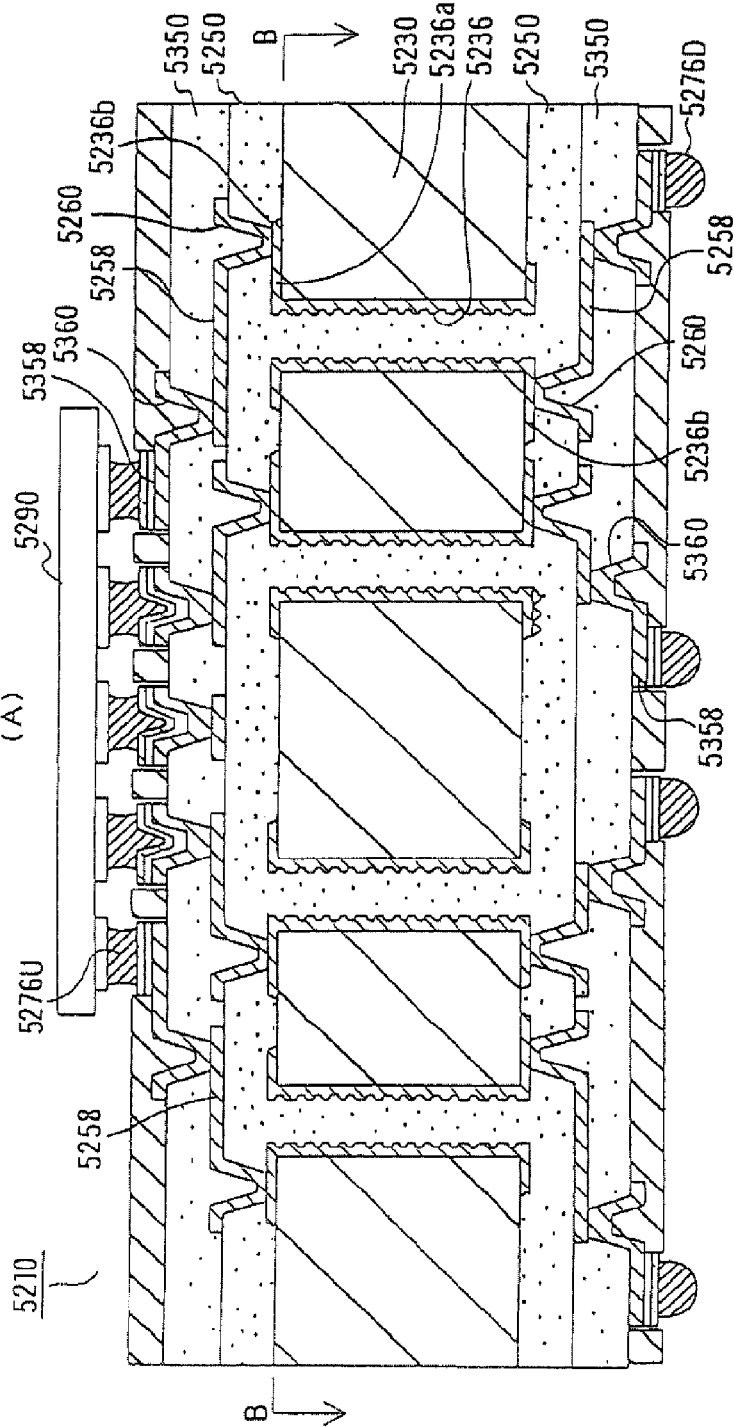
FIG. 38(A) is a cross-section view of the conventional multi-layer printed circuit board and FIG. 38(B) is a sectional view taken along the line B-B of FIG. 38(A).

Finally, as shown in FIG. 37, the bumps 5076U of the multilayer printed circuit board 5010 were set in registration with the pads 5092 of an IC chip and caused to reflow to mount the IC chip 5092 on the multilayer printed circuit board 5010. Furthermore, the multilayer printed circuit board 5010 was mounted on a daughter board 5094 by setting it in registration with its pads 5096 and reflowing.

In the above-mentioned example, the multilayer printed circuit board was fabricated by the semi-additive process, however the multilayer printed circuit board abricated by the full additive process can be said to belong to the fifth group of the invention.

EXAMPLE 16

In the following, the process for manufacturing a multilayer printed board according to Example 16 is now described with reference to the drawings.

A. Production of Starting Compositions for the Preparation of an Electroless Plating Adhesive (Upper-Layer Adhesive)
The objective compositions were obtained by the same method as Example 15.

B. Starting Compositions for Preparation of an Interlayer Resin Insulating Agent (Adhesive for Lower Layer)
The objective compositions were obtained by the same method as Example 15.

C. Production of Starting Compositions for Preparation of a Resin Filler
The objective compositions were obtained by the same method as Example 15.

D. Preparation of a Solder Resist Composition
The objective compositions were obtained by the same method as Example 15.

The process for manufacturing a multilayer printed circuit board according to Example 16 is :now described with reference to FIGS. 39 to 45. In Example 16, the multilayer printed circuit board was fabricated by the semi-additive process.

Figure 39:
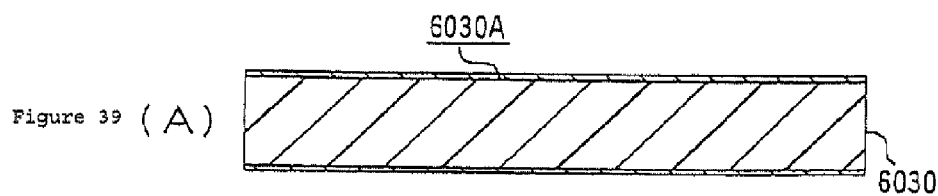
FIGS. 39(A) to (E) are cross-section views illustrating a part of the production process for multilayer printed circuit boards according to the sixth group of the present invention.
Figure 39:
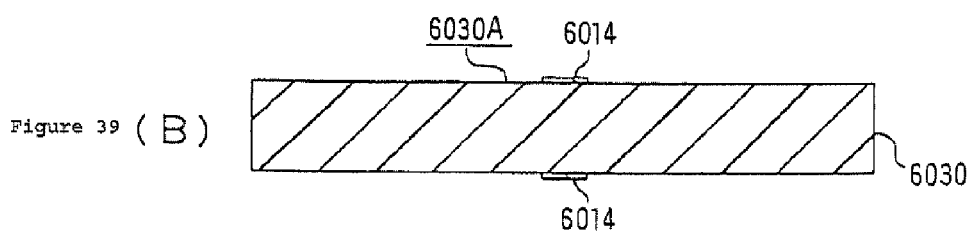
Figure 39:
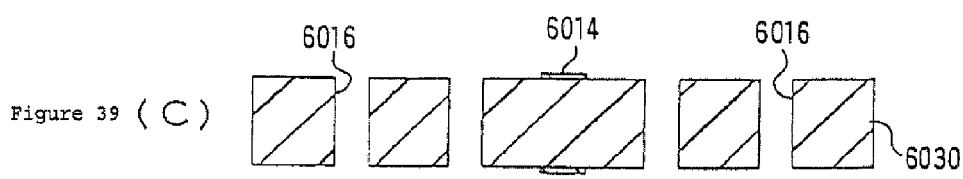
Figure 39:
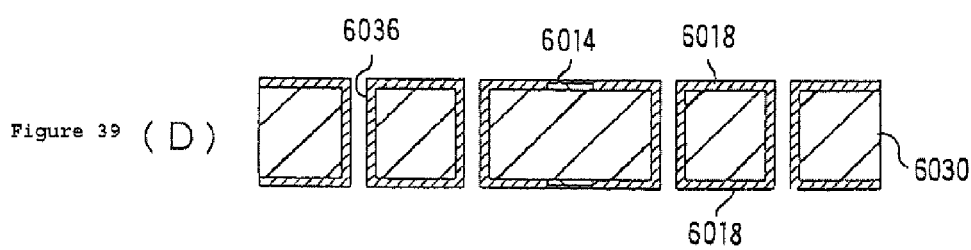
Figure 39:
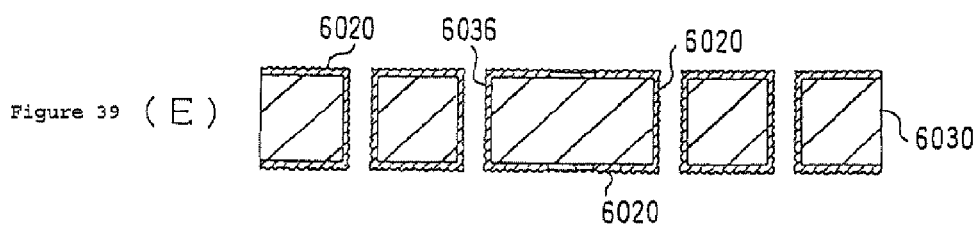

(1) As the starting material, a copper-clad laminate 6030A laminating a 18 μm-thick copper toil 6012 to both sides of a 0.5 mm-thick substrate 6030 having glass-epoxy resin or BT (bismaleimide-triazine) resin (FIG. 39 (A)). Etching resists were formed at the both sides thereof, etching treatment was curried out with an aqueous solution of sulfuric acid-hydrogen peroxide to provide the core board 6030 containing the conductor circuit 6014 (FIG. 39(B)).

The core board 6030 was prepared by laminating preparegs. For example, the prepregs at B stage prepared by immersing epoxy resin, polyimide resin, bismaleimide-triazine resin, fluorine resin (polytetrafluoroethylene, etc.) were laminated to the fibrous matrix sheet or non-woven fabrics of glass cloth or aramid cloth, and then hot-pressed to provide the core board.

As the circuit board on the core board, there can be mentioned not shown).

The fabricating method is described in the following. Thus, the substrate board 6030 was acid-degreased, soft-etched and further treated with a catalyst solution comprising palladium chloride and an organic acid to precipitate the Pd catalyst, and after activation of the catalyst, the substrate board was immersed in an electroless plating solution (pH=9) comprising copper sulfate (8 g/L), nickel sulfate (0.6 g/L), citric acid (15 g/L), sodium hypophosphite (29 g/L), boric acid (31 g/L) and surfactant (0.1 g/L) to thereby provide Cu—Ni—P acicular alloy covering layer and roughened layer 6027 on the surfaces of conductor layer 6026 covering the conductor circuit 6014a and the filler 6022.

Cu—Sn substitution plating was carried out by using 0.1 mol/L of tin borofluoride and 1.0 mol/L of thiourea at 50° C. and pH=1.2 to provide 0.3 μm-thick Sn layer (not shown) on the surface of the roughen layer 6010.

The roughen layer comprised of Cu—Ni—P alloy may be also formed by forming so-called blacken-reduction layer on the surface of the conductor layer 6026a covering the conductor circuit 6014a and the filler 6022, filling the resin such as bisphenol F type epoxy resin between the conductor circuits, abrading the surface, and plating of the above-mentioned (9).

(10) The above-mentioned resin filler C. for flattening the surface of the substrate was prepared.

(11) Using a roll coater, the resin composition 6028 prepared by the procedure described above in (10) was applied on both sides of the substrate board 6030 to fill the upper conductor layer 6026a, to fill the lower conductor layer 6026a or conductor circuit 6014a with the resin filler, and oven-dried at 70° C. for 20 minutes (FIG. 41(M)).

(12) One side of the substrate board which had undergone the above procedure (11) was abraded with a belt sander using #600 belt sanding paper (Sankyo Rikagaku) to thoroughly remove the resin filler 6028 from the surface of the conductor layer 6026a g/L) and NaBH$_4$ (6 g/L) to provide the roughened layer 6020 on the whole surface of the conductor 6018 containing the plated-through holes 6036 (FIG. 39(E)). Said roughened layer was formed by an oxidation-reduction treatment, however the spray treatment with a aqueous mixture solution containing a cupric complex compound and an organic acid and metal plating using Cu—Ni—P alloy can be also used.

(4) The plated-through holes 6036 were filled with the resin filler 6022 containing copper particle of average diameter=10 μm (Tatsuta Densen, non-conductive hole-plugging copper paste, trade name; DD paste) by screen printing, and then died and cured. (FIG. 39(E)). Thus, the resin filler was coated by printing method on the substrate board set the mask on the openings of the plated-through holes to fill the plated-through holes, and then dried and cured.

The resin filler filled in the plated-through holes comprises metal particle, thermosetting resin and curing agent, or preferably comprises metal particle and thermosetting resin and, where necessary, additional solvents. Since, if these filler contain metal particles, the metal particles are exposed when abrading those surface and the surface is unified with the conductor circuit formed thereon via the exposed metal particles, stripping between the conductor layer is hardly occurred even under the hard condition of high temperature and high humidity such as PCT (Pressure cocker test). These filler do not occur the migration of metal ion since those are filled in the plated-through holes having the wall side of metal layer.

As the metal particles, there can be used copper, gold, silver, aluminum, nickel, titanium, chromium, tin/lead, palladium, platinum and the like. The particle diameter of those metal particles is preferably 0.1 to 50 μm. This is because the surface of copper is oxidized to worsen wettability against the resin when the diameter is less than 0.1 μm, while the printing efficiency becomes worse when the diameter is over 50 μm. The addition amount of the metal particles is preferably 30 to 90 wt.%. This is because the adhesion of cover plating becomes worse when the amount is less than 30 wt.%, while the printing efficiency becomes worse when the amount is over 90 wt%.

As the resins which can be used, epoxy resin such as bisphenol A type and bisphenol F type, phenolic resin, polyimide resin, polytetrafluoroethylene (PTFE), bismaleimide-triazine (BT) resin, PFA, PPS, PEN, PES, nylon, alamide, PEEK, PEKK and PET can be used.

As the curing agents, imidazole type, phenol type, amine type can be used.

As the solvents, there can be mentioned NMP (normal methyl pyrrolidone) DMDG (diethylene glycol dimethyl ether), glycerin, water, 1-cicrohexanol, 2-cicrohexanol, 3-cicrohexanol, cicrohexanon, methyl cellsolve, methyl cellsolve acetate, methanol, ethanol, butanol, propanol.

The non-conductive filler is preferably used. This is because the shrinkage caused by curing becomes small and the stripping between the conductor layer and via holes is hardly occurred when using the non-conductive filler.

The metal surface-improving agents such as silane coupling agents may be used for improving the bond strength between the metal particle and resin. As other additives which can be used, antiforming agents such as acryl type antiforming agent and silicone type antiforming agent, inorganic fillers such as silica, alumina, talc may be added. Silane coupling agents may be also coated on the surface of the metal particle.

Such fillers are printed in the following condition, for example. Thus, using mask board of mesh board made of tetron and angle squeege with 45° of angle, the printing is curried out under the condition of a Cu paste viscosity of 120 Pa·s, squeege speed at 13 mm/sec., and squeege depression of 1 mm.

Then, the residue of resin filler 6022 was removed from the surface of the roughened layer 6020 on the conductor 6018 and the plated-through holes 6036 using a #600 belt sanding paper (Sankyo Rikagaku) and, thereafter, buffed to get rid of flaws produced in the belt sanding operation to make the surface of the substrate board 6030 flat (FIG. 40(G)). Thus, in this step, the substrate board 6030 which comprises being strongly interconnected between the inner-layer of the plated-through hole 6036 and the resin filler 6022 through the roughened layer 6020 was provided.

Figure 40:
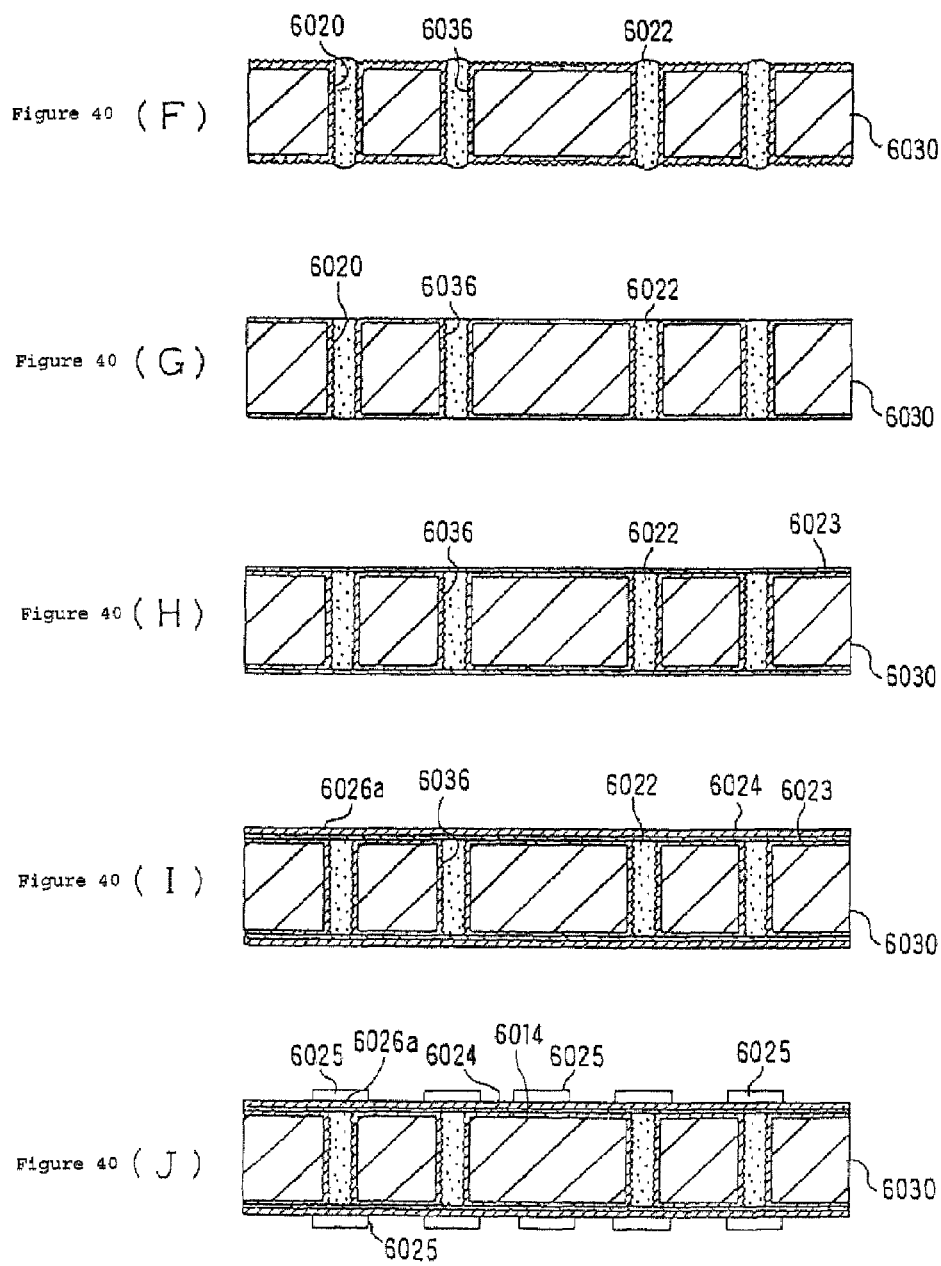
FIGS. 40(F) to (J) are cross-section view showing a part of the production process for the multilayer printed circuit board according to the sixth group of the present invention.
Figure 41:
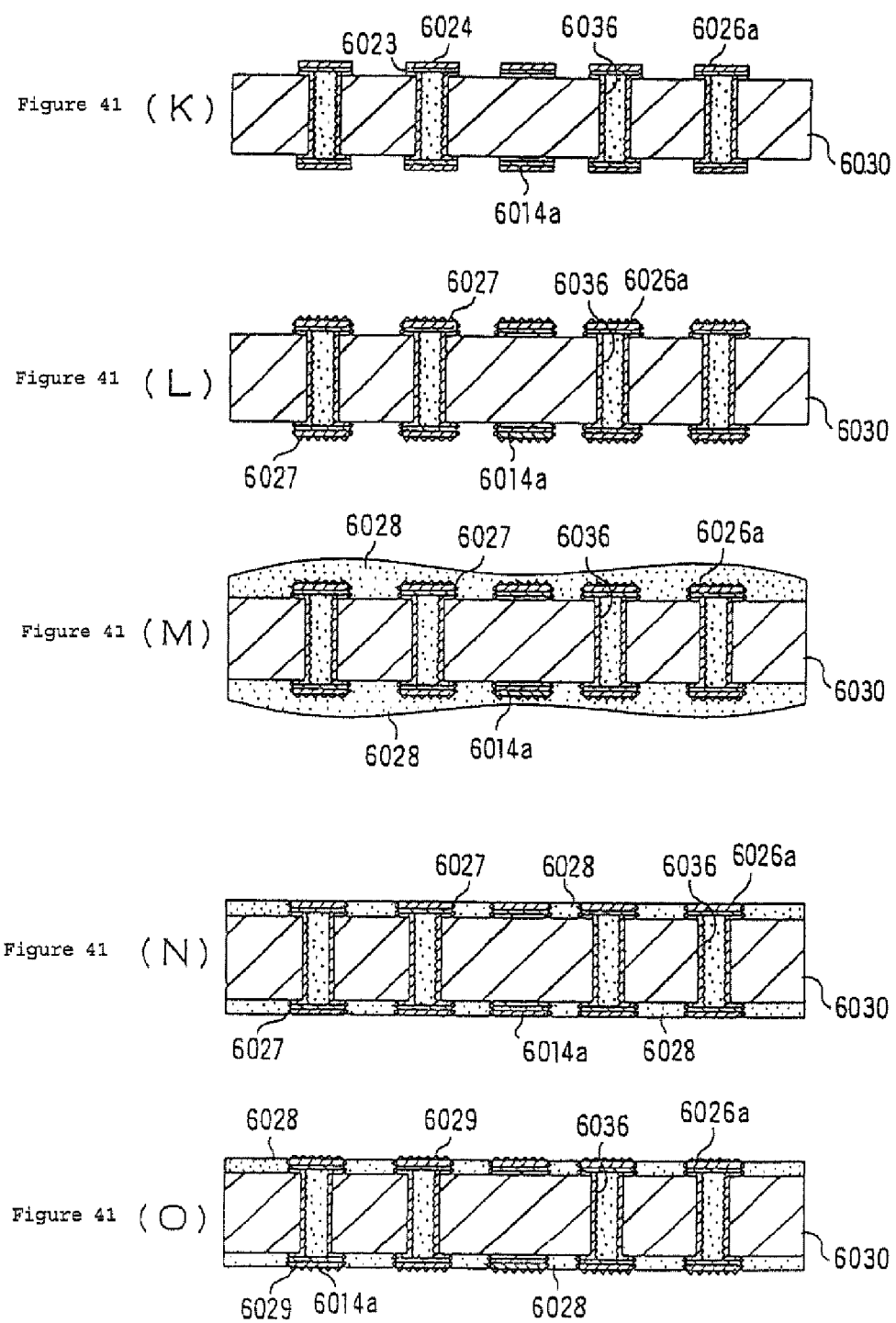
FIGS. 41(K) to (O) are cross-section view showing a part of the production process for the multilayer printed circuit board according to the sixth group of the present invention.
Figure 42:
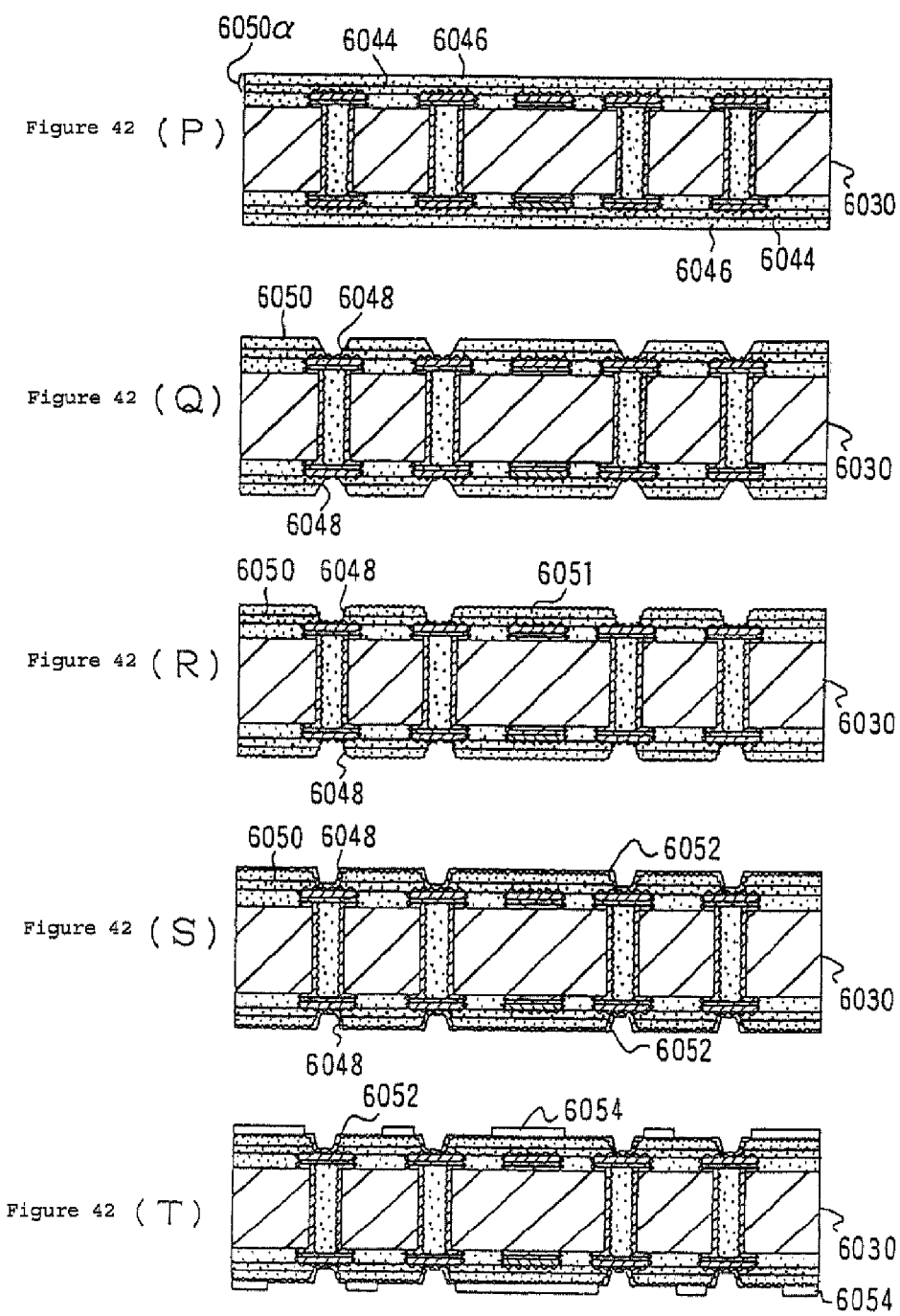
FIGS. 42(P) to (T) are cross-section views showing a part of the production process for the multi-layer printed circuit board according to the sixth group of the present invention.

(5) The Pd catalyst (Atotech) was applied to the surface of the substrate board 6030 made flattened in the above-mentioned (4), the electroless copper plating according to the above-mentioned (2) was curried out to provide 0.6 μm-thick electroles copper plating layer 6023 (FIG. 40 (H)).

(6) Then, the copper-electroplating under the following conditions was curried out to construct a 15 μm-thick copper layer 6024, thick plating of the conductor circuit 6014, and conductor layer 6026a covering the filler 6022 filled in the plated-through holes 6036 (round lands of plated-through holes) (FIG. 40(I)).

| [Aqueous electroplating solution] | |
| --- | --- |
| Sulfuric acid | 180 g/L |
| Copper sulfate | 80 g/L |
| Additive (Atotech Japan; Kaparacid GL) | 1 ml/L |

| [Electroplating conditions] | |
| --- | --- |
| Current density | 1 A/dm$^2$ |
| Time | 30 min. |
| Temperature | Room temp. |

(7) A commercial photosensitive dry film was pasted on the both sides of the substrate board 6030 forming the part of the conductor circuit 6014 and the conductor layer 6026a and with a mask placed in position, exposure at 100 mJ/cm$^2$ and development with 0.8% sodium carbonate were carried out to provide a 15 μm-thick etching resist 6025 (FIG. 40(J)).

(8) After the plating layers 6023, 6024 not having the etching resist 6025 were dissolved and removed by etching with mixture of sulfuric acid and hydrogen peroxide, and then the etching resist 6008 was stripped off with 5% KOH to provide the conductor layer 6026a covering the isolated conductor circuit 6014a and filler 6022 (FIGS. 41(K)).

(9) A 2.5 μm-thick roughened layer (unevenness layer) 6027 comprised of Cu—Ni—P alloy was formed on the surfaces of conductor circuit 6026a covering the isolated conductor circuit 6014a and filler 6022 and a 0.3 μm-thick Sn layer on the surface of the roughened layer was formed (FIG. 41(L), but Sn layer was not shown).

The fabricating method is described in the following. Thus, the substrate board 6030 was acid-degreased, soft-etched and further treated with a catalyst solution comprising palladium chloride and an organic acid to apply the Pd catalyst, and after activation of the catalyst, the substrate board was immersed in an electroless plating solution (pH=9) comprising copper sulfate (8 g/L), nickel sulfate (0.6 g/L), citric acid (15 g/L), sodium hypophosphite (29 g/L), boric acid (31 g/L) and surfactant (0.1 g/L) to thereby provide Cu—Ni—P acicular alloy covering layer and roughened layer 6027 on the surfaces of conductor layer 6026 covering the conductor circuit 6014a and the filler 6022.

Cu—Sn substitution plating was carried out by using 0.1 mol/L of tin borofluoride and 1.0 mol/L of thiourea at 50° C. and pH=1.2 to provide 0.3 μm-thick Sn layer (not shown) on the surface of the roughened layer 6010.

The roughened layer comprised of Cu—Ni—P alloy may be also formed by forming so-called blacken-reduction layer on the surface of the conductor layer 6026a covering the conductor circuit 6014a and the filler 6022, filling the resin such as bisphenol F type epoxy resin between the conductor circuits, abrading the surface, and plating of the above-mentioned (9).

(10) The above-mentioned resin filler C. for flattening the surface of the substrate was prepared.

(11) Using a roll coater, the resin composition 6028 prepared by the procedure described above in (10) was applied on both sides of the substrate board 6030 to fill the upper conductor layer 6026a, to fill the lower conductor layer 6026a or conductor circuit 6014a with the resin filler, and to be dried at 70° C. for 20 minutes (FIG. 41(M)).

(12) One side of the substrate board which had undergone the above procedure (11) was abraded with a belt sander using #600 belt sanding paper (Sankyo Rikagaku) to thoroughly remove the resin filler 6028 from the surface of the conductor layer 6026a and the conductor circuit 6014a. Then, buffing was carried out to remove the flaws produced by the above belt-sanding (FIG. 41 (N)).

Then, the substrate board was heat-treated at 100° C. for 1 hour, 120° C. for 3 hours, 150° C. for 1 hour and 180° C. for 7 hours to cure the resin filler 6028.

Since the roughened layer 6027 on the surface of the conductor layer 6026a and conductor circuit 6014a was removed and both sides of the surface was flattened, and then the resin filler 6028, the conductor layer 6026a and the lateral sides of the conductor circuit 6014a were firmly bonded via the roughened layer 5038.

(13) The substrate board 6030 formed with the conductor circuit 6026a and conductor circuit 6014a which were exposed by the treatment (12) mentioned above was alkali-degreased, soft-etched and further treated with a catalyst solution comprising palladium chloride and an organic acid to apply the Pd catalyst, and after activation of the catalyst, the substrate board was immersed in an electroless plating solution (pH=9) comprising $3.2 \times 10^{-2}$ mol/L of copper sulfate, $3.9 \times 10^{-3}$ mol/L of nickel sulfate, $5.4 \times 10^{-2}$ mol/L of complexing agent, $3.3 \times 10^{-1}$ mol/L of sodium hypophosphite, $5.0 \times 10^{-1}$ mol/L of boric acid and 0.1 g/L of surfactant (Nisshin Chemical, Surphile 465). One minute after dipping, the substrate board was vibrated lengthwise and crosswise every 4 seconds to thereby provide a Cu—Ni—P acicular alloy covering layer and a roughened layer 6029 on the surfaces of the conductor layer 6026a and the conductor circuit 6014a (FIG. 41(O)).

Then, a Cu—Sn substitution reaction was carried out using 0.1 mol/L of tin borofluoride and 1.0 mol/L of thiourea at 35° C. and pH=1.2 to provide a 0.3 μm-thick Sn layer (not shown) on the roughened layer.

(14) The interlayer resin insulating agent (adhesive for lower layer) was prepared by mixing and stirring the composition of the interlayer resin insulating agent B. and adjusting the viscosity of 1.5 Pa·s.

(15) The electroless plating adhesive (upper-layer adhesive) was prepared by mixing and stirring the composition of the electroless plating adhesive A. and adjusting the viscosity of 7 Pa·s.

(16) Using a roll coater, the interlayer resin insulating agent (for the lower layer) 6044 with a viscosity of 1.5 Pa·s as obtained in (14) above was coated on both sides of the substrate of the above-mentioned (13) obtained above within 24 hours of preparation and the substrate board was allowed to sit in the horizontal position for 20 minutes and dried at 60° C. for 30 minutes (prebake). Then, the photosensitive adhesive solution (for the upper layer) 6046 with a viscosity adjusted to 7 Pa·s as prepared in (15) mentioned above was coated within 24 hours of preparation and the substrate board was allowed to sit in the horizontal position for 20 minutes and, then, dried (prebaked) at 60° C. for 30 minutes to provide a 35 μm-thick adhesive layer 6050α (FIG. 42(P)).

(17) A photomask film (not shown) printed with black dots having ϕ=85 μm (not shown) was superimposed on both sides of the substrate board 6030 formed with an adhesive layer in (16) above and exposed to light at 500 mJ/cm² using an ultrahigh-pressure mercury arc lamp. After spray-development with DMTG solution, the substrate 6030 was further exposed to light at 3000 mJ/cm² with the ultrahigh-pressure mercury arc lamp and heat-treated (postbaked) at 100° C. for 1 hour, at 120° C. for 1 hour and further at 150° C. for 3 hours, whereby a 35 μm-thick interlayer resin insulating layer (binary structure) 6050 having 85 μm ϕ openings (openings for via holes) 6048 with a good dimensional tolerance corresponding to that of the photomask film (FIG. 42(Q)) was obtained. In the openings 6048 for via holes, the plated tin layer (not shown) was caused to be partially exposed.

(18) The substrate board 6030 was immersed in chromic acid for 19 minutes to dissolve and removed the epoxy resin particles from the surface of the interlayer resin insulating layer 6050 to roughen the surface of said interlayer resin insulating layer 6050 (FIG. 42(R)), then immersed in a neutralizing solution (Shipley) and rinsed with water.

(19) A palladium catalyst (Atotech) was applied to the surface of the substrate board 6030 which had been subjected to surface roughening in the above step to deposit the catalyst nucleus on the surface of the interlayer resin insulating layer 6050. Then, the substrate board 6030 was immersed in an aqueous electroless copper plating solution of the following formulation to provide a 0.6 μm-thick electroless plated copper film 6052 all over the surface (FIG. 42(S)).

| [Aqueous electroless plating solution] | |
|---|---|
| EDTA | 150 g/L |
| Copper sulfate | 20 g/L |
| HCHO | 30 ml/L |
| NaOH | 40 g/L |
| α,α'-Bipyridyl | 80 mg/L |
| PEG | 0.1 g/L |

[Electroless Plating Conditions]
Bath temperature 70° C., for 30 min.

(20) A commercial photosensitive dry film (not shown) was pasted on the electroless plated copper film 6052 prepared in the above-mentioned (19) and a mask (not shown) was placed in position. Then, the exposure at 100 mJ/cm² and development with 0.8% sodium carbonate were carried out to provide a 15 μm-thick plating photoresist 6054 (FIG. 42(T)).

(21) Then, the resist-free area was copper-electroplated under the following conditions to construct a 15 μm-thick copper layer 6056 filling the openings 6048 (FIG. 43(U)).

| [Aqueous electroplating solution] | |
|---|---|
| Sulfuric acid | 180 g/L |
| Copper sulfate | 80 g/L |
| Additive (Atotech Japan; Kaparacid GL) | 1 ml/L |

| [Electroplating conditions] | |
|---|---|
| Current density | 1 A/dm² |
| Time | 30 min. |
| Temperature | Room temp. |

(22) After the plating resist 6054 was stripped off with 5% KOH, the electroless plated metal film 6052 underneath the plating resist was dissolved and removed by etching with an etching solution comprising a mixture of sulfuric acid and hydrogen peroxide to provide an 18 μm-thick conductor circuit 6058 and via holes 6060 comprising electroless plated copper film 6052 and electroplated copper film 6056 (FIG. 43(V)).

Figure 43:
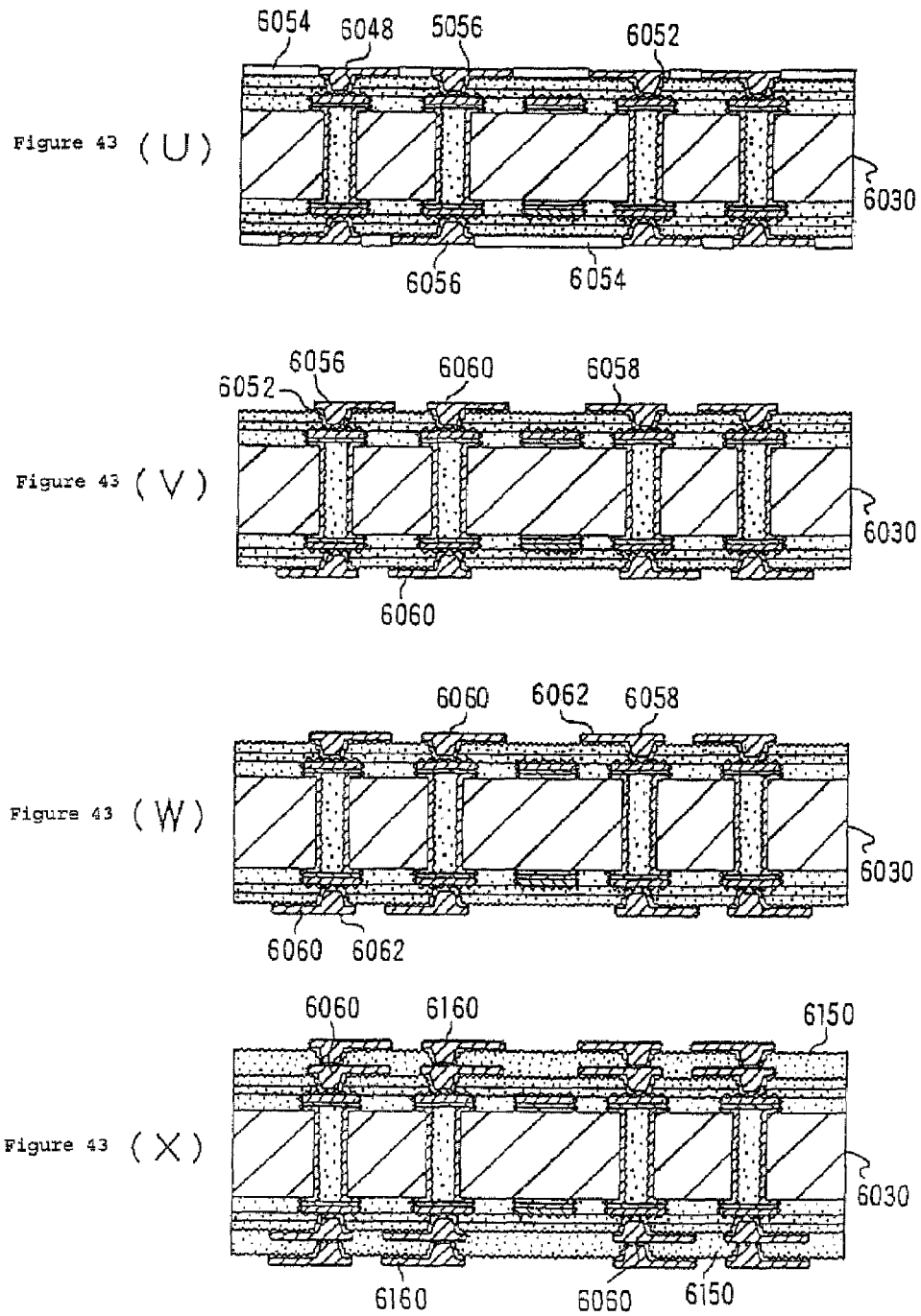
FIGS. 43(U) to (X) are cross-section views showing a part of the production process for the multi-layer printed circuit board according to the sixth group of the present invention.

(23) Following the same procedure as described in (13), a roughened surface 6062 comprised of Cu—Ni—P alloy was formed on the surfaces of conductor circuit 6058 and via holes 6060 and a Sn substitution on the surface was carried out (FIG. 43 (W)).

(24) The sequence of steps (14) to (22) was repeated to provide an additional upper-layer interlayer resin insulating layer 6150, via holes 6160 and conductor circuit 6158. Furthermore, the surface of the via holes 6160 and conductor circuit 6158 were provided with roughened layer 6162 to complete a multilayer buildup circuit board (FIG. 43(X)). In this process for formation of said additional upper-layer conductor circuit, no Sn substitution was carried out. In this example, a flat multilayer buildup circuit board could be obtained because the via holes 6060 and 6160 were formed in the filled-via structure.

(25) Then, this multilayer buildup circuit board was provided with solder bumps. The solder resist composition described under D. was coated in a thickness of 45 μm on both sides of the substrate board 6030 obtained in (24) above. After the substrate board was dried at 70° C. for 20 minutes and further at 70° C. for 30 minutes, a 5 mm-thick photomask film (not shown) carrying a pattern of dots (mask pattern) was placed in intimate contact and exposure with ultraviolet light at 1000 mJ/cm² and development with DMTG were carried out. Then, the substrate board was further heat-treated at 80° C. for 1 hour, at 100° C. for 1 hour, at 120° C. for 1 hour and at 150° C. for 3 hours to provide a solder resist layer 6070 (thickness: 20 μm) having openings 6071 (opening dia. 200 μm) in the solder pad areas (inclusive of via holes and their lands) (FIG. 44)).

(26) Then, this substrate 6030 was immersed in an electroless nickel plating solution (pH=4.5) containing $2.31 \times 10^{-1}$ mol/L of nickel chloride, $2.8 \times 10^{-1}$ mol/L of sodium hypophosphite and $1.85 \times 10^{-1}$ mol/L of sodium citrate for 20 minutes to provide a 5 ηm-thick plated nickel layer 6072 in the openings 6071. Furthermore, this board was immersed in an electroless gold plating solution containing $4.1 \times 10^{-2}$ mol/L of potassium cyanide-gold, $1.87 \times 10^{-1}$ mol/L of ammonium chloride, $1.16 \times 10^{-1}$ mol/L of sodium citrate and $1.7 \times 10^{-1}$ mol/L of sodium hypophosphite at 80% for 7 minutes and 20 seconds to provide a 0.03 μm plated gold layer 6074 on the plated nickel layer, whereby the via holes 6160 and conductor circuit 6158 were provided with solder pads 6075 (FIG. 44).

Figure 44:
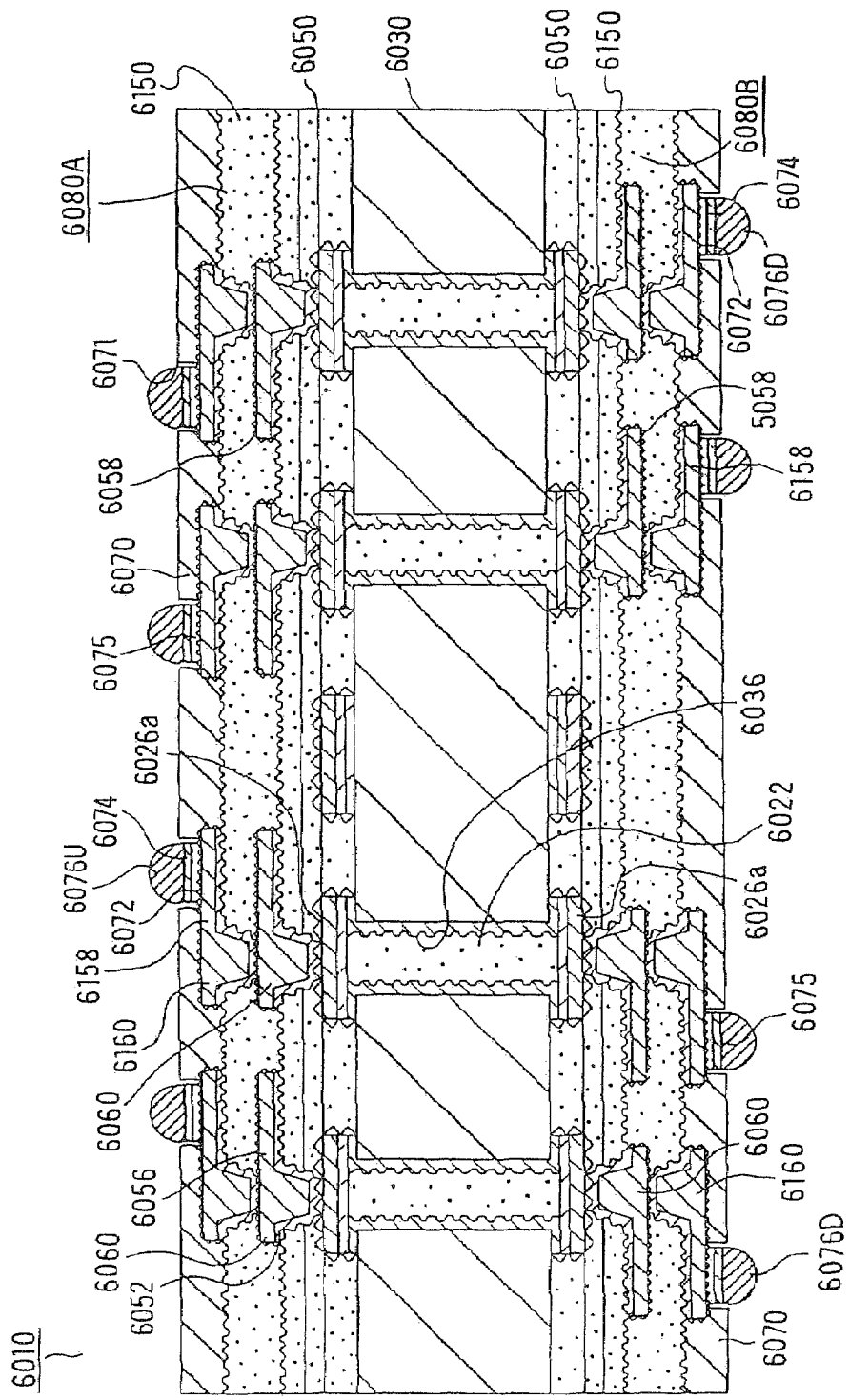
FIG. 44 is a cross-section view showing a multi-layer printed circuit board according to the sixth group of the present invention.

(27) Then, the openings 6071 of the solder resist layer 6070 were printed with a solder paste followed by reflowing at 200° C. to provide solder bumps (solder masses) 6076U, 6076D and thereby provide a multilayer printed circuit board 6010 (FIG. 44).

Figure 45:
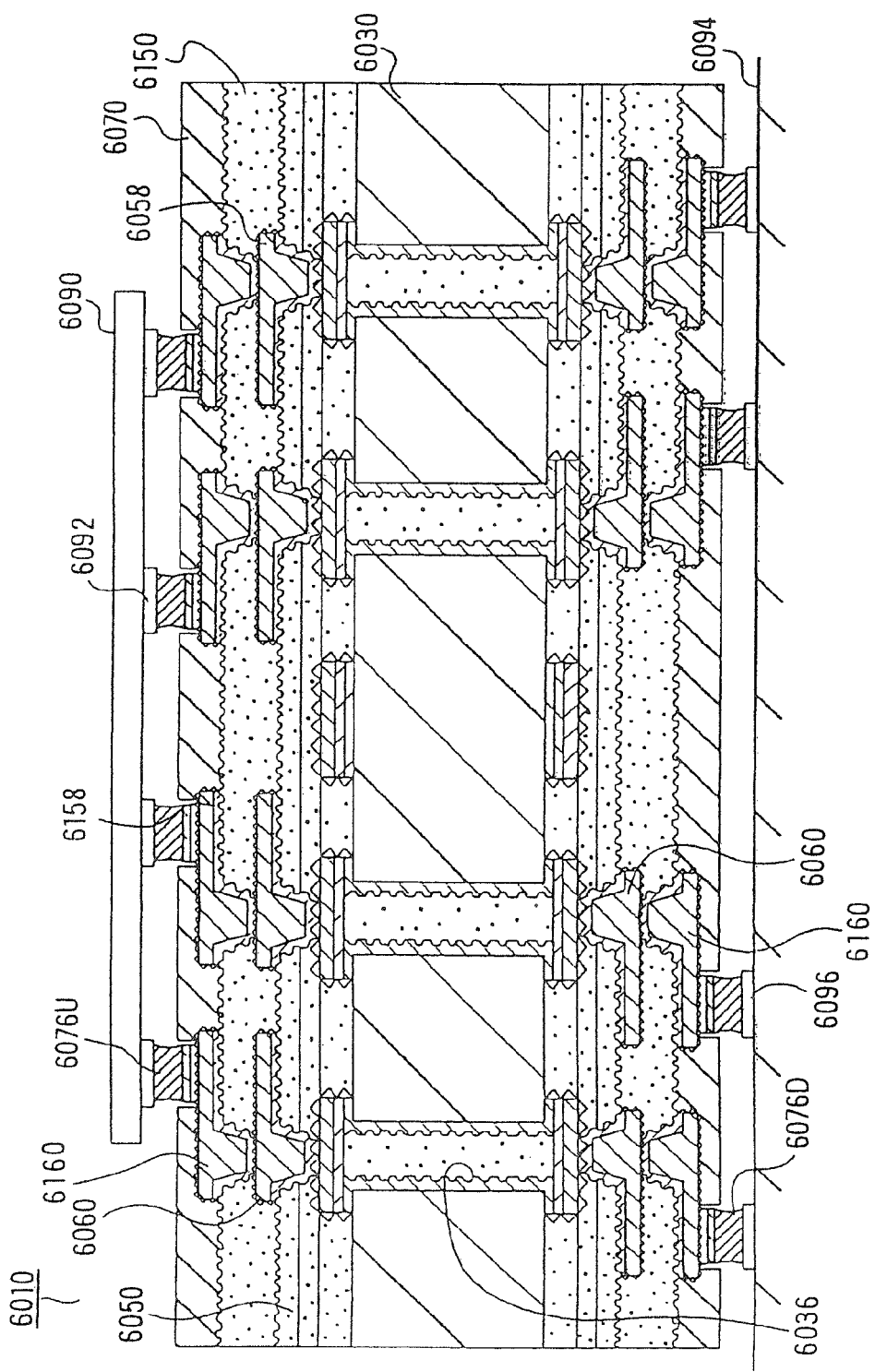
FIG. 45 is a cross-section view showing a multi-layer printed circuit board according to the sixth group of the present invention.

Finally, as shown in FIG. 45, the bumps 6076U of the multilayer printed circuit board 6010 were set in registration with the pads 6092 of an IC chip and caused to reflow to mount the IC chip 6092 on the multilayer printed circuit board 6010. Furthermore, the multilayer printed circuit board 6010 was mounted on a daughter board 6094 by setting it in registration with its pads 6096 and reflowing.

Although, in Example 16, via holes 6060 filled with metal were provided by depositing an electroplated conductor 6056 on the electroless plated metal layer 6052 in the openings 6048, an electroless plated metal layer may be substituted for said electroplated conductor layer 6056. In this case, an electroless plating resist is disposed without prior formation of an electroless plated metal layer 6052 and in the resist-free areas, via holes of the filled-via type are formed by electroless plating.

Furthermore, it is possible to fill up the openings 6048 by electroless plating without disposing said electroless plated metal film 6052. Thus, the interlayer resin insulating layer 6050 having openings 6048 communicating with the lower-layer conductor layer 6026a can be electroless-plated to fill up the openings 6048 without application of an electroless plating catalyst. Since the pretreatment with an electroless plating catalyst is not performed in this case, the electroless plating metal is selectively deposited on the conductor layer 6026a in the bottom of the openings 6048. Therefore, the surface of this electroless plated conductor can be flat and smooth. It is also possible to form via holes 6060 by depositing an electroplating conductor on this electroless plated conductor having a flat surface.

EXAMPLE 17

Figure 46:
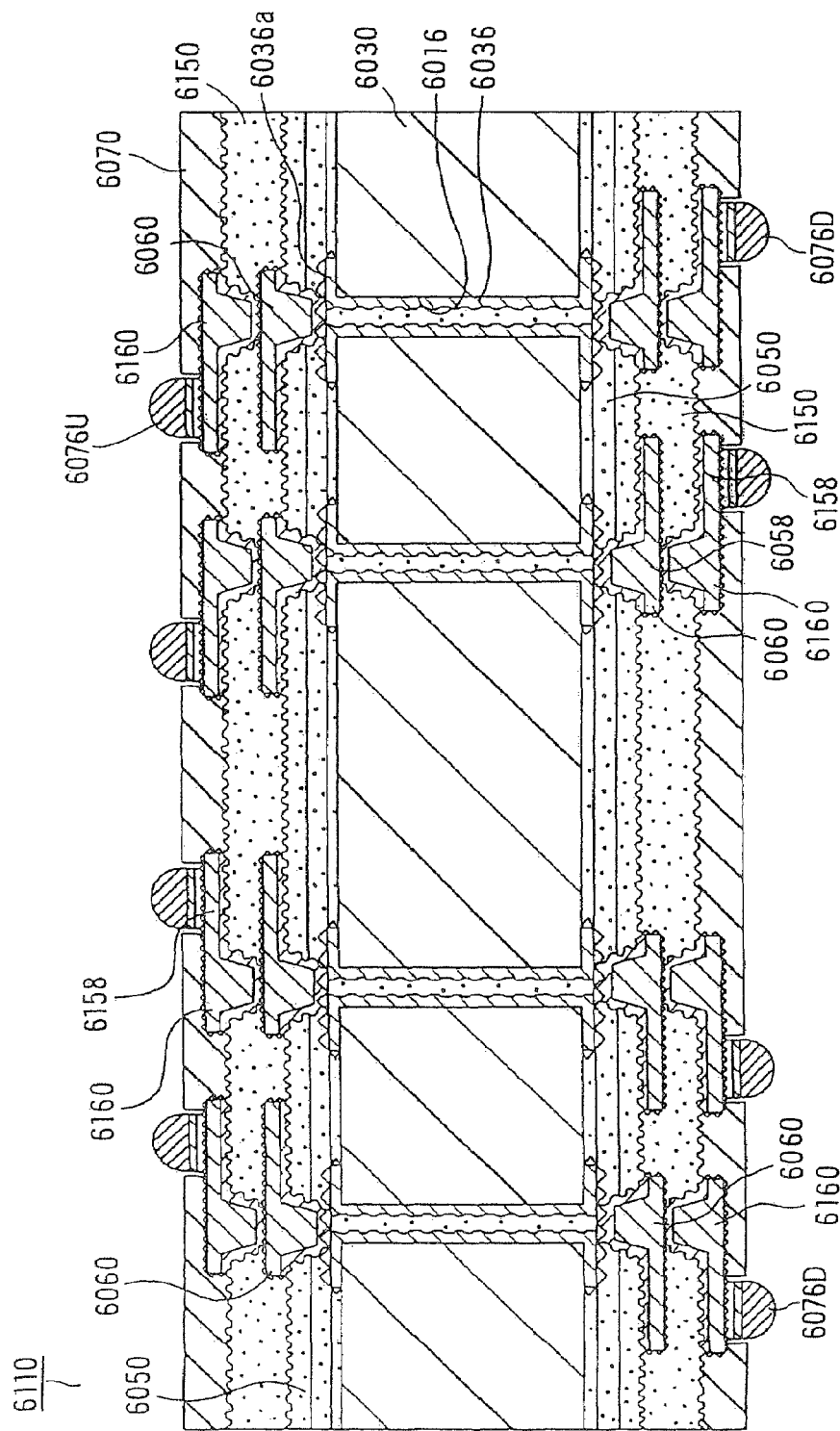
FIG. 46 is a cross-section view showing a multi-layer printed circuit board according to the sixth group of the present invention

The process for the multilayer printed circuit board according to Example 17 is now described with reference to FIG. 46.

As to the multilayer printed circuit board according to Example 16, the covering plated layer (the conductor layer) 6026a was formed on the plated-through holes 6036 and the plated-through holes 6036 and via holes 6060 were interconnected via said conductor layer 6026a. On the other hand, as to the multilayer printed circuit board according to Example 17, via holes 6060 formed the through holes 6016 constituting the plated-through holes 6036 with the small diameter (100 to 200 μm) by laser were deposited at the position covering the through holes 6016 constituting the plated-through holes 6036, and lands 6036a in the plated-through holes 6036 and via holes 6060 were electro-connected.

The laser processing equipment which can be used in this step includes a carbon dioxide gas laser equipment, a UV laser equipment and an eximer laser equipment. The preferred diameter is preferably 100 to 200 μm. Among said machines, the carbon dioxide gas laser equipment, which features a high processing speed and a low-cost operation and, hence, is most suited for industrial use, is the laser processor of choice for the practice of the invention of the sixth group.

In Example 17, when 20 to 50% of the bottom of via holes 6060 is connected lands 6036a in the plated-through holes 6036, the sufficient electrical connection thereof can be obtained.

As to the multilayer printed circuit board according to Example 17, the lower via holes 6060 were formed on the plated-through holes 6036 and the upper via holes 6160 were formed on the lower via holes 6060, so that the plated-through holes 6036 and the upper via holes 6160 were deposited straight as a result the translation rate of an IC chip 6090 was improved.

EXAMPLE 18

The process for the multilayer printed circuit board according to Example 18 is now described with reference to FIG. 47(A).

As to the multilayer printed circuit board according to Example 16 or 17, filled via structure was used for via holes 6060. On the other hand, as to the multilayer printed circuit board according to Example 18, the surface of via holes 6060 was flattened to form the upper via holes 6160 by leaving concaved areas 6056a in the lower via holes 6060 and filling said concaved areas 6056a with the conductive pastes 6021.

As the conductive pastes, there can be used silver, there can be used a conductive paste which comprises at least one metal particle selected from the group consisting of copper, gold, nickel, solder. As the metal particle, a metal particle the surface of which is coated with a different kind of metal. For example, the metal particle of copper whose surface is coated with a noble metal selected from gold and silver may be used.

As the conductive pastes, there can be preferably used organic conductive pastes which contain metal particles, and thermosetting resin such as epoxy resin and polyphenyl-ene-sulfide (PPS) resin are added.

EXAMPLE 19

As to the multilayer printed circuit board according to Example 19 is now described with reference to FIG. 47 (B).

As to the multilayer printed circuit board according to Example 18, concaved areas 6056a in the lower via holes 6060 were filled with the conductive pastes 6021. On the other hand, as to the multilayer printed circuit board according to Example 19, the surface of via holes 6060 was flattened to form the upper via holes 6160 by filling said concaved areas 6056a in the lower via holes 6060 with the resin 6121. Therefor, the multilayer printed circuit board according to Example 18 or 19 was produced more easily than that according to Example 16 or 17.

EXAMPLE 20

Figure 48:
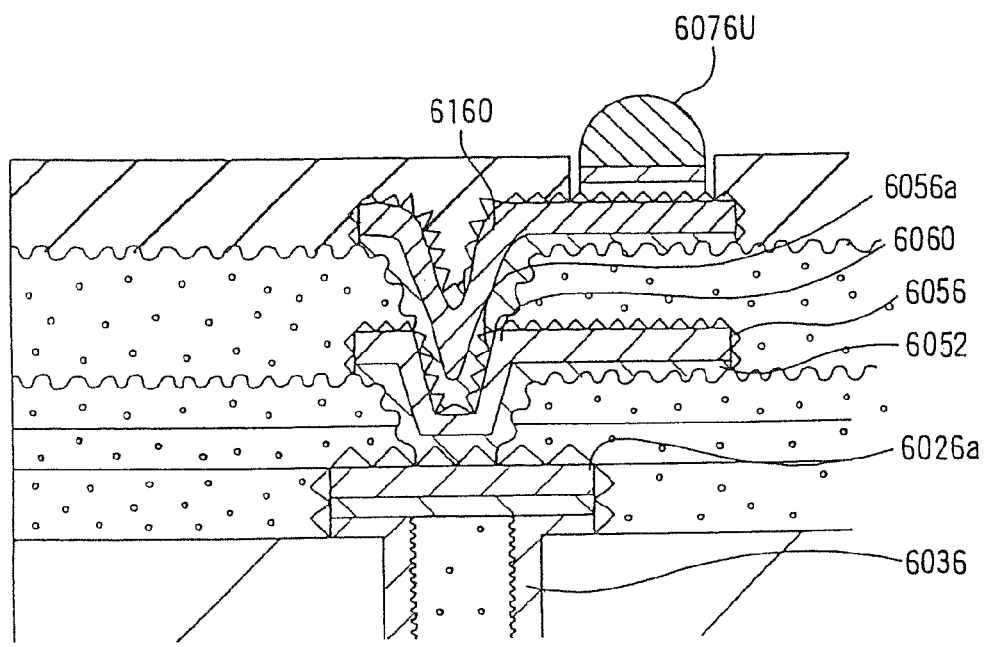
FIG. 48 illustrates an example of a structure of the multi-layer printed circuit board according to the sixth group of the present invention.

As to the multilayer printed circuit board according to Example 20 is now described with reference to FIG. 48.

As to the multilayer printed circuit board according to Example 18 or 19, concaved areas 6056a in the lower via holes 6060 were filled with the conductive pastes 6021 or resin 6121. On the other hand, as to the multilayer printed circuit board according to Example 20, the upper via holes 6160 were formed without filling said concaved areas 6056a in the lower via holes 6060. Therefor, the multilayer printed circuit board according to Example 20 were produced more easily.

EXAMPLE 21

Figure 49:
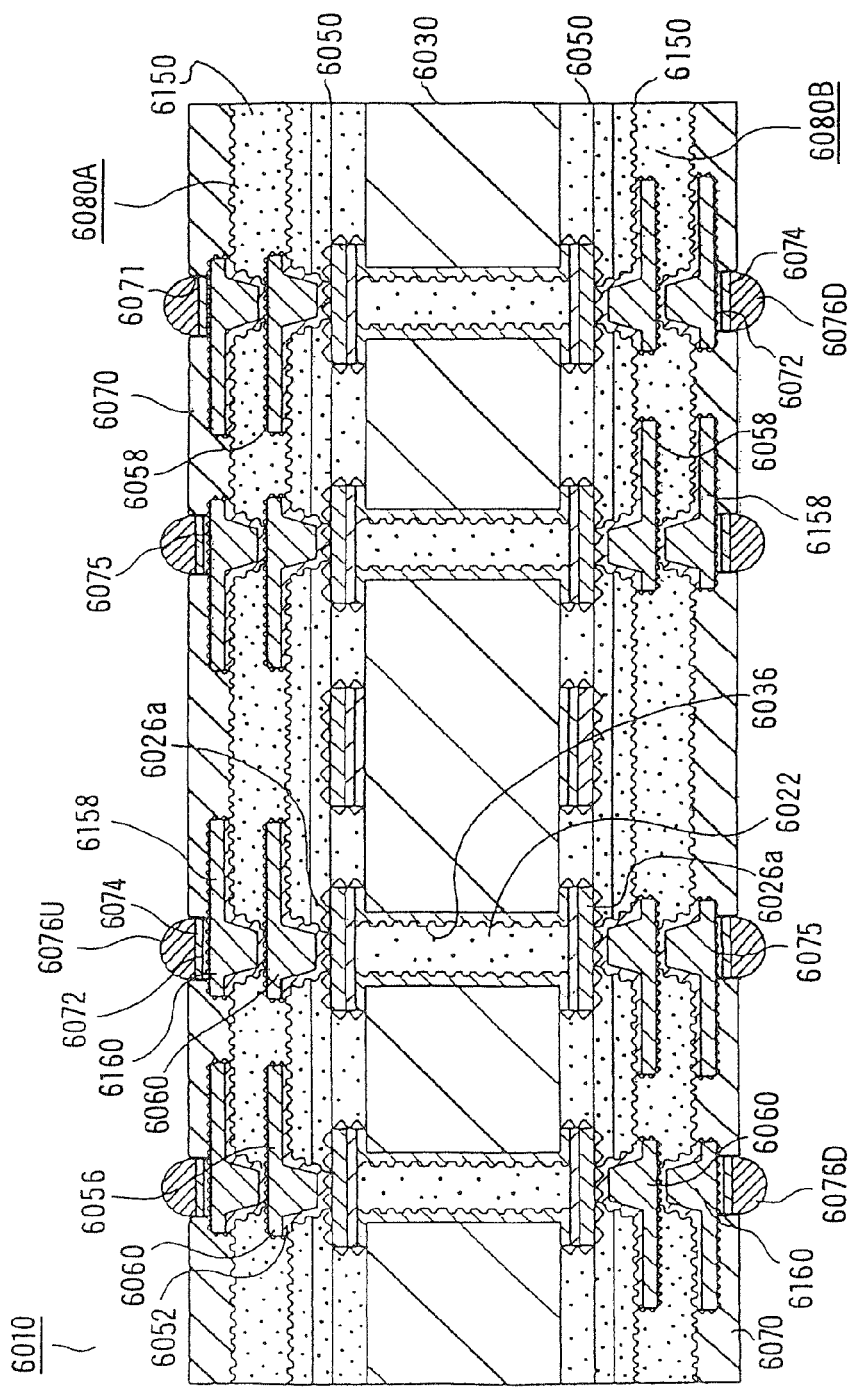
FIG. 49 is a cross-section view showing a multi-layer printed circuit board according to the sixth group of the present invention.
Figure 50:
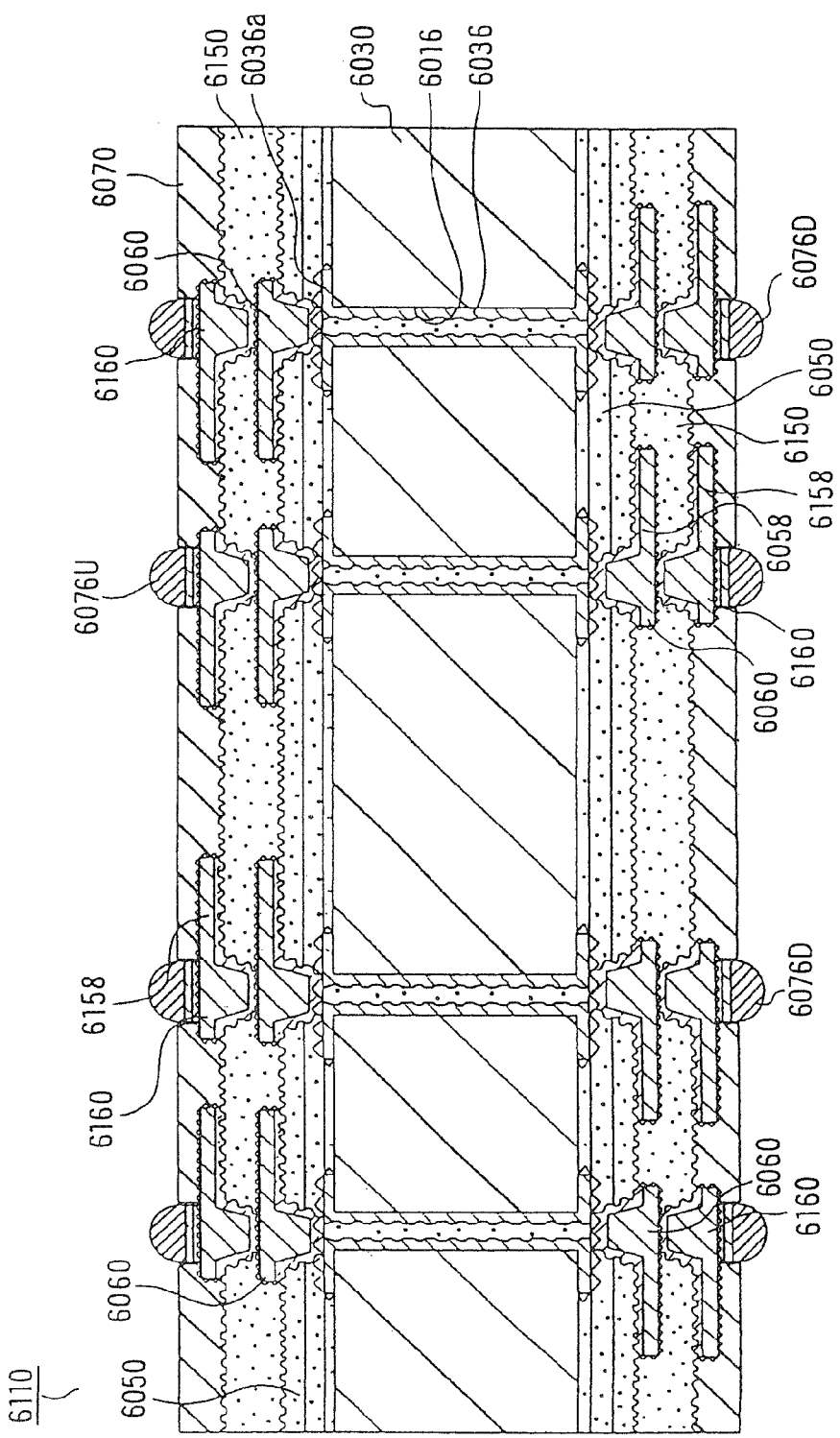
FIG. 50 is a cross-section view showing a multi-layer printed circuit board according to the sixth group of the present invention.

As to the multilayer printed circuit board according to Example 21 is now described with reference to FIG. 49.

As to the multilayer printed circuit board according to Example 16, solder bumps 6076U, 6076D were disposed at the position a little far from the plated-through holes 6036. On the other hand, as to the multilayer printed circuit board according to Example 21, solder bumps 6076U, 6076D were disposed immediately over the upper via holes 6160. Therefor, as to the multilayer printed circuit board according to Example 21, the lower-layer via holes 6060 were disposed immediately over plated-through holes 6036, upper-layer via holes 6160 were disposed immediately over said lower-layer via holes 6060, and solder bumps 6076U, 6076D were disposed immediately over the plated-through hole 6036, therefore the plated-through hole 6036, lower-layer via hole 6060, upper-layer via hole 6160 and solder bumps 6076U, 6076D can be lined up in good registration so that the wiring length can be reduced to increase the transmission speed of signals.

EXAMPLE 22

As to the multilayer printed circuit board according to Example 17, solder bumps 6076U, 6076D were disposed at the position a little far from the plated-through holes 6036. On the other hand, as to the multilayer printed circuit board according to Example 22, solder bumps 6076U, 6076D were disposed immediately over the upper via holes 6160. Therefor, the multilayer printed circuit board according to Example 22 had an advantage that the plated-though hole 6036, lower-layer via hole 6060, upper-layer via hole 6160 and solder bumps 6076U, 6076D can be lined up in good registration so that the wiring length can be reduced to increase the transmission speed of signals, and a large amount of power can be obtained instantaneously from the power layer.

In Example 22, the multilayer printed circuit board having two layers on one side is shown, but it is obvious without saying that the multilayer printed circuit board having not less than three layers on one side may be available.

INDUSTRIAL APPLICABILITY

Thus, in accordance with the constant-voltage pulse plating process used in the first group of inventions, conductor circuit and via holes of good crystallinity and uniform deposition can be constructed on a substrate, and high-density wiring and highly reliable conductor connections can be realized without annealing.

Moreover, the constant-voltage pulse plating process used in the first group of inventions can be easily carried out using an inexpensive power supply, e.g. a direct current source, by repeating application and interruption of a voltage alternately through manipulation of an ON-OFF switch. Thus, unlike the PR plating process requiring an expensive power source, this process makes it possible to construct an electroplated metal layer of excellent crystallinity and uniform deposition on the substrate surface as well as in the openings for via holes, thus being of great industrial advantage.

Furthermore, with the electroless plating solutions used in the first and second inventions belonging to the second group, which contain tartaric acid or its salt, the amount of hydrogen uptake in the plated metal layer is so small that the residual stress in the plated metal film is decreased, with the result that the risk for peeling of the film and of layers is low. Moreover, since the deposition rate can be reduced as compared with the prior art, a plated metal film of sufficient thickness can be formed even in fine via-hole openings In addition, the plated metal film can be thoroughly removed by etching.

The printed circuit boards according to the fifth through seventh inventions belonging to the second group are highly reliable because said electroless plating solution containing tartaric acid or a salt thereof yields an electroless plated metal film of good adhesion and high peel resistance on a roughened resin insulating layer as well as within via holes in a sufficient thickness.

The printed circuit board according to the eighth invention among inventions of the second group is highly reliable because the electroless plating solution containing tartaric acid, copper ion and nickel or other ion yields a plated metal film of high hardness and good adhesion on a roughened resin insulating layer.

In the invention of the third group, the copper foil is reduced in thickness in advance so that a fine circuit pattern can be implemented. Moreover, because the thickness of the conductor circuit on the core board is not much different from the thickness of the conductor layer on the interlayer resin insulating layer, an impedance alignment can be easily obtained between said conductor circuit on the core board and conductor layer on the interlayer resin insulating layer, thus contributing to an improved high-frequency characteristic of the printed circuit board.

In addition, the surface of the interlayer resin insulating layer can be flattened without filling the inter-conductor gaps with a resin.

In accordance with the invention belonging to the fourth group, complete filling of via-hole openings and formation of conductor circuit can be simultaneously implemented without using an expensive equipment.

Moreover, since the via holes in the multi-layer printed circuit board can be filled up by plating, the interlayer resin insulating layer can be flat and smooth and the stacked via can also be constructed.

In accordance with the invention belonging to the fifth group, the land configuration of the plated-through hole can be true-round so that the density of plated-through hole wirings in a multilayer core board is improved. Therefore, the buildup circuit stratum on the face side of a core board and the buildup to stratum on the reverse side can be consolidated in the same pace so that the number of layers constituting the top stratum and that of layers constituting the bottom stratum can be equalized and hence the necessary number of layers can be minimized. Moreover, since via holes can be disposed in registration, the wiring length within the printed circuit board can be decreased.

In the invention belonging to the sixth group, wherein lower-layer via holes are disposed immediately over plated-through holes and upper-layer via holes are disposed immediately over said lower-layer via holes, the plated-through hole, lower-layer via hole and upper-layer via hole can be lined up in good registration so that the wiring length can be reduced to increase the transmission speed of IC chip signals.

The invention claimed is:

1. An electroless plating solution which comprises an aqueous solution containing 0.025 to 0.25 mol/L of a basic compound, 0.03 to 0.15 mol/L of a reducing agent, 0.02 to 0.06 mol/L of copper ion, 0.05 to 0.3 mol/L of tartaric acid or a salt thereof and nickel ion formed from at least one of nickel chloride and nickel sulfate, wherein said reducing agent comprises at least one selected from the group consisting of formaldehyde and hydrazine.

2. An electroless plating solution which comprises an aqueous solution containing a basic compound, a reducing agent, copper ion, tartaric acid or a salt thereof and 0.01 to 0.05 weight % of at least one metal ion species selected from the group consisting of nickel ion, cobalt ion and iron ion, wherein said reducing agent comprises at least one selected from the group consisting of formaldehyde and hydrazine, and said nickel ion is formed from at least one of nickel chloride and nickel sulfate.

3. The electroless plating solution according to claim 1 or 2 wherein said electroless plating solution has a specific gravity of 1.02 to 1.10.

4. The electroless plating solution according to claim 1, the temperature of which is 25 to 40° C.

5. The electroless plating solution according to claim 1 wherein the copper deposition rate of said electroless plating solution is 1 to 2 μm/hour.

6. An electroless plating process which comprises immersing a substrate in the electroless plating solution according to claim 1 and performing electroless copper plating at a deposition rate set to 1 to 2 μm/hour.

7. The electroless plating process according to claim 6 wherein said substrate has a roughened surface.

8. The electroless plating solution according to claim 2, the temperature of which is 25 to 40° C.

9. The electroless plating solution according to claim 3, the temperature of which is 25 to 40° C.

10. The electroless plating solution according to claim 2 wherein the copper deposition rate of said electroless plating solution is 1 to 2 μm/hour.

11. The electroless plating solution according to claim 3 wherein the copper deposition rate of said electroless plating solution is 1 to 2 μm/hour.

12. The electroless plating solution according to claim 4 wherein the copper deposition rate of said electroless plating solution is 1 to 2 μm/hour.

13. An electroless plating process which comprises immersing a substrate in the electroless plating solution according to claim 2 and performing electroless copper plating at a deposition rate set to 1 to 2 μm/hour.

14. An electroless plating process which comprises immersing a substrate in the electroless plating solution according to claim 3 and performing electroless copper plating at a deposition rate set to 1 to 2 μm/hour.

15. An electroless plating process which comprises immersing a substrate in the electroless plating solution according to claim 4 and performing electroless copper plating at a deposition rate set to 1 to 2 μm/hour.

16. The electroless plating process according to claim 13 wherein said substrate has a roughened surface.

17. The electroless plating process according to claim 14 wherein said substrate has a roughened surface.

18. The electroless plating process according to claim 15 wherein said substrate has a roughened surface.

* * * * *